(12) United States Patent
Koh et al.

(10) Patent No.: US 8,633,726 B2
(45) Date of Patent: Jan. 21, 2014

(54) SEMICONDUCTOR DEVICE EVALUATION APPARATUS AND SEMICONDUCTOR DEVICE EVALUATION METHOD

(75) Inventors: Risho Koh, Kanagawa (JP); Takahiro Iizuka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 183 days.

(21) Appl. No.: 13/351,851

(22) Filed: Jan. 17, 2012

(65) Prior Publication Data
US 2012/0187975 A1    Jul. 26, 2012

(30) Foreign Application Priority Data
Jan. 24, 2011   (JP) ................................. 2011-012290

(51) Int. Cl.
*G01R 31/26* (2006.01)
(52) U.S. Cl.
USPC .................................................... 324/762.01
(58) Field of Classification Search
USPC ................. 324/762.01–762.1, 750.01–750.3; 257/48; 438/14–18
See application file for complete search history.

(56) References Cited

U.S. PATENT DOCUMENTS

| 6,876,219 | B2 * | 4/2005 | Vollrath | .................. | 324/762.02 |
| 7,218,132 | B2 * | 5/2007 | Krishnan et al. | ......... | 324/762.09 |

FOREIGN PATENT DOCUMENTS

| JP | 55-57160 A | 4/1980 |
| JP | 5-203698 A | 8/1993 |
| JP | 8-136612 A | 5/1996 |
| JP | 2006-278360 A | 10/2006 |
| JP | 2007-225505 A | 9/2007 |
| JP | 2009-71112 A | 4/2009 |

OTHER PUBLICATIONS

O. Le Neel et al., Electrical Transient Study of Negative Resistance in SOI MOS Transistors, Electronics Letters, Jan. 1990, pp. 73-74, vol. 26.
K. A. Jenkins et al., Measurement of I-V Curves of Silicon-on-Insulator (SOI) MOSFET's Without Self-Heating, IEEE Electron Device Letters, Apr. 1995, pp. 145-147, vol. 16, No. 4.
Wei Jin et al., SOI Thermal Impedance Extraction Methodology and Its Significance for Circuit Simulation, IEEE Transactions on Electron Devices, Apr. 2001, pp. 730-736, vol. 48, No. 4.
Krzysztof Górecki et al., Nonlinear Compact Thermal Model of Power Semiconductor Devices, IEEE Transactions On Components and Packaging Technologies, Sep. 2010, pp. 643-647, vol. 33, No. 3.

* cited by examiner

*Primary Examiner* — Tung X Nguyen
(74) *Attorney, Agent, or Firm* — Foley & Lardner LLP

(57) ABSTRACT

A semiconductor device evaluation apparatus includes a current measurement portion that measures a current value at multiple times included in a period from the beginning of application of a voltage to a semiconductor device to a steady state of the current value flowing through the semiconductor device; a period division portion that divides the period into a first period and a second period later than the first period and finds a curve approximately representing a temporal change in a current value measured at time included in the second period so that a difference between a current value measured at the time included in the first period and a current value found by extrapolating the curve at the same time becomes greater than a specified threshold value; and a current estimation portion that estimates a current value flowing through the semiconductor device at the start time.

25 Claims, 36 Drawing Sheets

TEMPERATURE INCREASE IN THE TRANSISTOR

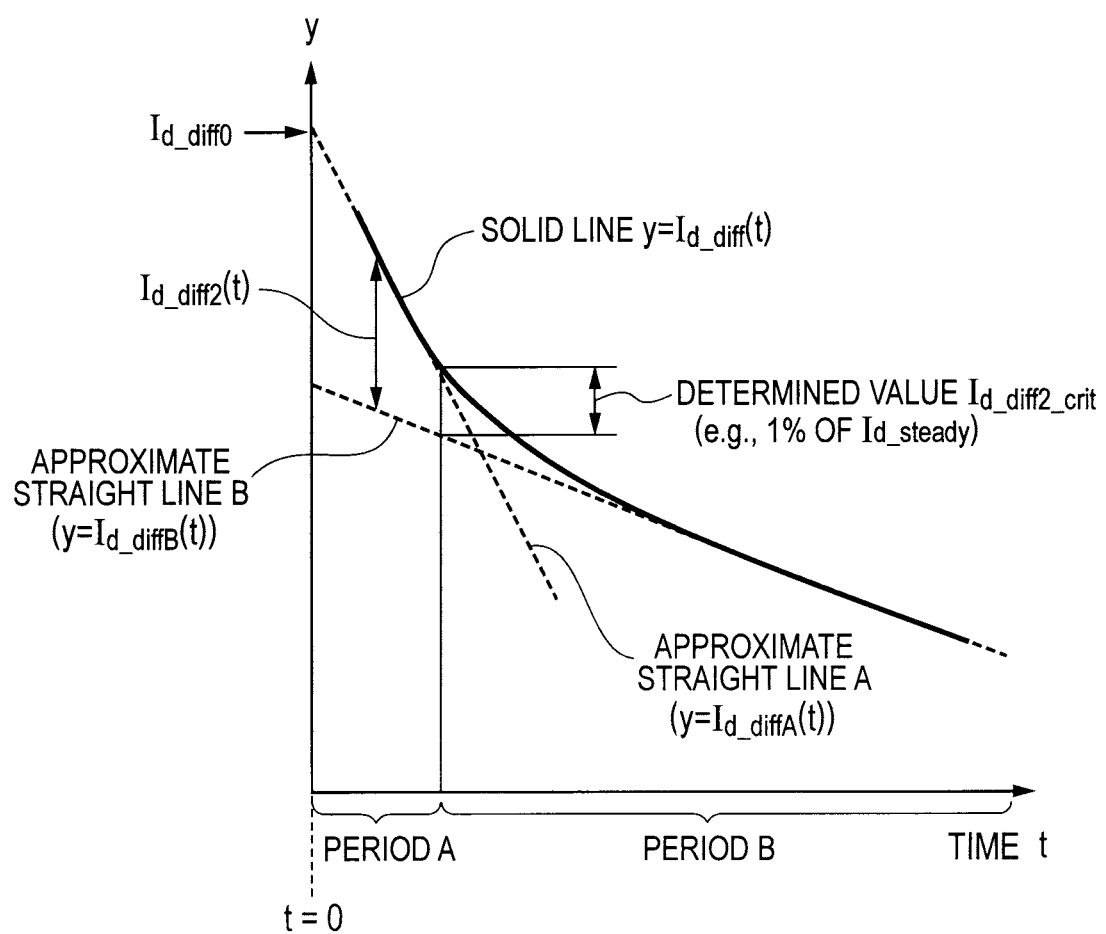

PERIOD A

PERIOD B

Cth1, Cth2 : THERMAL CAPACITANCE
Rth1, Rth2 : THERMAL RESISTANCE $V_3$ SIGNIFIES A VALUE OF $V_S$ AFTER THE STEADY STATE IS REACHED.
THE VERTICAL AXIS REPRESENTS THE LOGARITHMIC PLOT.
THE HORIZONTAL AXIS REPRESENTS THE LINEAR PLOT $C_{th1}, C_{th2}, C_{th3}$: THERMAL CAPACITANCE
$R_{th1}, R_{th2}, R_{th3}$: THERMAL RESISTANCE

SEMICONDUCTOR DEVICE EVALUATION APPARATUS AND SEMICONDUCTOR DEVICE EVALUATION METHOD

CROSS-REFERENCE TO RELATED APPLICATIONS

The disclosure of Japanese Patent Application No. 2011-12290 filed on Jan. 24, 2011 including the specification, drawings and abstract is incorporated herein by reference in its entirety.

BACKGROUND

The present invention relates to a semiconductor device evaluation apparatus and a semiconductor device evaluation method. More particularly, the invention relates to a semiconductor device evaluation apparatus and a semiconductor device evaluation method in order to evaluate characteristics of a semiconductor device whose characteristics vary due to self-heating.

A power semiconductor device such as a power MOSFET applies a high voltage and inevitably causes self-heating, a phenomenon in which an electric current flowing through the semiconductor device heats it and varies its characteristics.

It is widely known that the semiconductor circuit design employs analysis based on circuit simulation such as SPICE using device models. It is preferable to use device characteristics data under no influence of self-heating in order to create a device model used for the circuit simulation. There are proposed methods of eliminating effects of the self-heating from device characteristic to be measured. Measuring apparatuses for decreasing effects of the self-heating are offered commercially.

For example, non-patent document 1 describes results of experimentally analyzing negative resistance in the dependence between drain current and drain voltage, that is, a characteristics variation due to the device self-heating, with reference to SOIMOSFET.

FIG. 35 shows simplified representation of FIG. 1 in non-patent document 1. In FIG. 35, a downward-sloping curve illustrates the negative resistance due to self-heating. According to the negative resistance, increasing a drain voltage decreases a drain current as seen from plotted values measured for the dependence between drain current and drain voltage.

FIG. 36 shows the measurement circuit described in FIG. 2 of non-patent document 1. FIG. 37 shows the measurement result described in FIG. 3 of the non-patent document using the solid line. In FIG. 37, the broken line indicates an approximate straight line. Value V2' denotes an intercept for acquiring characteristics without the negative resistance by extrapolating the approximate straight line.

The technology described in non-patent document 1 sets an initial drain voltage to 5 V for a field effect transistor to be measured in the circuit of FIG. 36. The drain electrode is supplied with a step voltage rising from 5 V to 7 V. In FIG. 36, reference symbol G denotes a gate electrode; S denotes a source electrode; and D denotes a drain electrode. A source-drain current from the transistor flows through a shunt resistor 105 and varies a source voltage Vs in proportion to the source-drain current. The source-drain current can be found by measuring the source voltage Vs and dividing its value by a resistance value of the shunt resistor 105.

In FIG. 37 according to non-patent document 1, $V_s$ denotes the value of a source voltage and $V_3$ denotes the value of a source voltage that reaches a steady state after a lapse of enough time. FIG. 37 shows a plot example using the vertical axis representing the natural logarithm of a difference calculated by subtracting $V_3$ from $V_s$ and the horizontal axis representing the time. The broken line indicates an approximate straight line. Value $V_2'$ denotes an intercept for the approximate straight line. Non-patent document 1 performs a semi-log (single logarithm) plot shown in FIG. 37 to find intercept $V_2'$. The value of $V_2'$ is used to find a drain current free from the negative resistance.

Unlike the present invention, non-patent document 1 does not take into consideration improvement of SPICE accuracy. Non-patent document 1 experimentally evaluates the self-heating but does not take into consideration a model formula concerning the self-heating. In addition, non-patent document 1 does not set the voltage to 0 V before the step input starts. It would appear that non-patent document 1 aims to eliminate the negative resistance occurring if the self-heating becomes remarkable, not to eliminate all influences of the self-heating.

The following describes the other patent documents and non-patent documents that aim to create SPICE models, determine model parameters concerning the self-heating, and acquire characteristics without the self-heating. For example, the following methods are proposed in order to eliminate influences of the self-heating from measured device characteristics.

According to the method described in patent document 1, a device to be measured is supplied with a short-lasting pulse voltage instead of a steady voltage to shorten the time for the current to flow through the device. A drain current is measured while the self-heating is suppressed. FIGS. 38 and 39 show measurement circuits. In FIGS. 38 and 39, a field effect transistor 101 is measured for characteristics. A pulse voltage source 102 is equivalent to a first pulse voltage source. A pulse voltage source 103 is equivalent to a second pulse voltage source. A power supply 104 is equivalent to a direct current power supply.

As shown in FIG. 38, the measurement method described in patent document 1 allows the first pulse voltage source 102 to apply a pulse voltage to the gate electrode and allows the second pulse voltage source 103 to apply a pulse voltage to the drain electrode of the field effect transistor 101 to be measured. The method shortens the time for the current to flow through the device and suppresses the self-heating.

FIG. 39 shows the measurement method of the related art described in patent document 1. In FIG. 39, a direct current power supply 104 is coupled to the gate electrode of the field effect transistor 101 to be measured. The first pulse voltage source 102 is coupled to the drain electrode. The configuration shortens the time for the drain current to flow and suppresses the self-heating.

Non-patent document 2 describes the self-heating evaluation on SOI-MOSFET using the pulse measurement. FIG. 1 of non-patent document 2 describes the measurement method that couples the pulse voltage source to the gate electrode, couples the direct current voltage source to the drain electrode, and suppresses the self-heating.

The method described in patent document 2 estimates a drain current without self-heating using results of the steady state measurement and equations (1) and (2) described in patent document 2. These equations are expressed using heat resistance $R_{th}$ and power index n related to temperature increase. The following equations (1) and (2) equal those described in patent document 2.

$$I_{d0} = I_d \times \{(T_o + \Delta T)/T_o\}^n \qquad (1)$$

$$\Delta T = I_d \times V_d \times R_{th} \qquad (2)$$

In equations (1) and (2), $I_{d0}$ a drain current without self-heating; $I_d$ denotes a drain current in the steady state; $T_o$ denotes an external temperature; ΔT denotes a temperature increase in the device; $V_d$ denotes a drain voltage; $R_{th}$ denotes a heat resistance; and n denotes a power index.

The technologies described in patent documents 3 through 6 differ from the present invention in the objects, principles, and configurations. However, the technologies also concern the self-heating similarly to the invention and therefore will be described below.

The method described in patent document 3 aims to find characteristics in the state of stabilized drift after a lapse of enough time, that is, device characteristics in the steady state after a sufficient rise in the temperature, based on values measured in a short period of time if the self-heating drifts characteristics of electric apparatuses such as semiconductor devices and electronic products. This method finds device characteristics under the condition that the temperature sufficiently rises to stabilize temperature changes. After an initial value is measured, an electric characteristics measurement method is used to add a specified preliminarily applied voltage pulse or current pulse for re-measurement and estimate a final value based on a difference between measurement values. Specifically, the first embodiment in patent document 3 measures an initial characteristic value using an initial value measurement pulse P1, adds a specified preliminarily applied voltage or current pulse P2, and re-measures a value using a second measurement pulse P3. The embodiment finds value x as a difference between the initial measurement value and the second measurement value, finds a correction value using polynomial (y=ax+b), adds the correction value to the initial measurement value, and finds a final value approximate to the true value.

The technologies described in patent documents 4 through 6 find a sufficiently increased device temperature in a junction type transistor (MESFET) having its channel and gate in contact with each other through Schottky junction, not in an MOS type field effect transistor. The technologies assume the sufficiently increased device temperature to be an initial value and measure the process of decreasing temperature after the applied voltage is eliminated. The technologies then estimate the state before the applied voltage is eliminated. The technologies can measure the channel temperature by measuring a voltage between the gate and the source of a junction field effect transistor having no gate insulator film between the gate and the channel. Unlike MOSFET, an MESFET device is destroyed if a voltage is applied to the gate for a long time. The above-mentioned considerations are needed because no measurement is available in the steady state achieved when the temperature has increased sufficiently.

The technology described in patent document 4 uses [Equation 1] and [Equation 2] similar to the following.

$$\tau = 4at/L_{SD} \qquad (3)$$

where a denotes the semiconductor conductivity; and $L_{SD}$ denotes a channel length of the transistor to be measured. Function f(τ) is assumed to approach a finite value whose f(τ) is not zero. There is another function.

$$T_{ch} = \alpha - \beta t^{1/2} \cdot f(\tau) \qquad (4)$$

where α and β are parameters. The function extrapolates data of channel temperature $T_{ch}$ for t to t=0 and finds a channel temperature for the targeted operation temperature. Equation (3) corresponds to [Equation 1] in patent document 4. Equation (4) corresponds to [Equation 2] in patent document 4.

The technology described in patent document 5 finds the heat resistance by using a predetermined MESFET temperature coefficient as described in SUMMARY of patent document 5.

Non-patent document 3 describes the theory concerning the self-heating acquired by analyzing the SOI-MOSFET self-heating in a frequency domain. The theory uses heat resistance models and heat capacity models used for BSIM-SOI as a transistor model used for the SPICE simulation.

Patent document 1: Japanese Unexamined Patent Publication No. 2006-278360

Patent document 2: Japanese Unexamined Patent Publication No. 2009-071112

Patent document 3: Japanese Unexamined Patent Publication No. Hei 8 (1996)-136612

Patent document 4: Japanese Unexamined Patent Publication No. 2007-225505

Patent document 5: Japanese Unexamined Patent Publication No. Hei 5 (1993)-203698

Patent document 6: Japanese Unexamined Patent Publication No. Sho 55 (1980)-057160

Non-patent document 1: O. L E Neel and M. Haond, "Electrical transient study of negative resistance in SOI MOS transistors," Electronics letters, Vol. 26, pp. 73-74 (1990)

Non-patent document 2: K. A. Jenkins and J. Y.-C. Sum, "Measurement of I-V Curves of Silicon-on-Insulator (SOI) MOSFET's Without Self-Heating," IEEE Electron device letters Vol. 16, pp. 145-147 (1995)

Non-patent document 3: Wei. Jin, Weidong Liu, Samuel K. H. Fung, Philip C H. Chan and Chenming Hu, "SOI Thermal Impedance Extraction Methodology and Its Significance for Circuit Simulation," IEEE Electron device vol. 48, pp. 730-736 (2001)

Non-patent document 4: K. Gorecki and J. Zarebski, "Non-linear Compact Thermal Model of Power Semiconductor Devices," IEEE Transactions on Component and Packaging Technologies, Vol. 33, pp. 643-647 (2010)

SUMMARY

The inventors analyzed the following.

The following describes the problem of the technology described in non-patent document 1. According to FIG. 4 of non-patent document 1, the plotted graph shows that data approximate to time zero contains two time domains. Non-patent document 1 describes the method that generates an approximation indicated by the broken straight line using data for period B capable of being approximated through a straight line and finds intercept $V_2'$ using the generated approximate straight line.

As will be described in detail in a fourth embodiment later, period A also needs to be taken into consideration in finding data completely free from effects of self-heating in order to generate a SPICE model. In other words, the technology described in non-patent document 1 does not consider period A and causes an error if the technology is used for SPICE model generation. Non-patent document 1 does not describe a method of considering data for period A.

FIG. 40 is a graph plotted based on the logarithm as the vertical axis. As shown in FIG. 40, period B is equivalent to a time domain in which data indicated by a solid line becomes straight in relation to the time after a specified lapse of time from the rise of input voltage. The data represents a value as a difference between the actual measurement value and the steady-state value. Period A is equivalent to a time domain shorter than period B in terms of an elapsed time. Data indicated by the solid line more steeply varies with the time in period A than period B.

The following describes problems of the technologies described in patent documents and non-patent documents other than non-patent document 1.

The following problem is revealed in the method of using pulse voltages described in patent document 1 after the inventors examined the self-heating in the time domain in place of the analysis in the frequency domain described in non-patent document 3. A time response of heating follows an exponential function or similar functions. That is, the self-heating greatly changes device characteristics in a very short period of time from the initial state. Accordingly, it is difficult to completely eliminate the self-heating despite using a narrow pulse width such as 100 nsec capable of measurement on an ordinary measuring instrument or applying a pulse to both the gate and the drain as described in patent document 1. The same applies to the method described in non-patent document 2.

The following problem is revealed in the method described in patent document 2. The method estimates a drain current without self-heating using heat resistance $R_{th}$ and power index n related to temperature increase. First of all, it is difficult to accurately find heat resistance $R_{th}$ and power index n. Normally, an estimate value or an empirical value is used. Accordingly, an error occurs when a drain current is estimated without self-heating.

The method described in non-patent document 3 evaluates self-heating of MOSFET in the frequency domain and does not directly measure a drain current without self-heating. The method finds a heat resistance by analyzing the frequency domain for drain conductance. As described in FIGS. 11 and 12 of non-patent document 3, the method can find a drain current without temperature increase from a heat resistance value that is found from characteristics based on a temperature increase and frequency analysis. However, the method uses the procedure that first extracts a heat resistance, combines the heat resistance with a drain current in the steady state with temperature increase, and finds a drain current without temperature increase. An error in the process of extracting the heat resistance causes a drain current error without temperature increase. Basically, the device structure determines the heat resistance. Actually, however, values differ depending on bias conditions due to an error in measurement values of the drain conductance as a source. It is difficult to obtain a highly accurate value. The transistor is not always supplied with current in actual circuit operations. It is preferable for a transistor model used for the circuit simulation to attach importance to the characteristics accuracy in the state of a small temperature increase. However, non-patent document 3 uses the indirect procedure that first extracts a heat resistance, combines the heat resistance with a drain current in the steady state of increased temperature, and finds a drain current without temperature increase. The procedure gives preference to the accuracy in the steady state of increased temperature and is likely to cause an error in characteristics that are secondarily found without temperature increase.

Unlike the present invention, patent document 3 finds device characteristics in the steady state in which the device temperature has sufficiently increased. Patent document 3 does not aim to find current values of a field effect transistor without self-heating. Viewed as a general self-heating evaluation means, patent document 3 needs to determine incidental values other than major measurement values to be evaluated based on measurement or experience. With reference to the first embodiment and FIG. 2 of patent document 3, correction values are given in a graph representing the polynomial (y=ax+b), where y is the vertical axis and x is the horizontal axis representing a difference between the initial measurement value and the second measurement value. The correction value is added to the initial measurement value to find a final value approximate to the true value. It is necessary to predetermine coefficients a and b in the polynomial using some sort of method. However, this method is unclear. A coefficient error might cause a correction value error. It is unclear whether the technology described in patent document 3 is applicable to measurement of a drain current in the field effect transistor without temperature increase or extrapolation toward the initial state instead of the steady state. If the technology is applicable, it is unclear which procedure should be added or which correction value should be used. If the technology is applied to the self-heating evaluation, it is unclear under which conditions the initial measurement value and the second measurement value should be defined. In addition, a method of selecting an optimal condition is unclear in combination with selection of the polynomial coefficients.

Patent documents 4, 5, and 6 measure the device temperature of a junction type transistor (MESFET) having the Schottky gate based on a voltage between the gate and the source. This method cannot be applied to an insulated gate transistor (MOSFET) that includes a gate insulator between the gate and the channel.

According to the extrapolation method described in patent documents 4, 5, and 6, an initial state is defined such that conduction to a transistor is completed and the temperature increases to become stable. The method finds the temperature increase amount in the initial state based on the time dependence of the device temperature after a voltage is eliminated. On the other hand, the present invention concerns a state of no increase in the device temperature. This state is equivalent to the state in patent documents 4, 5 and 6 in which the elapsed time reaches an infinite value and the device is sufficiently cooled. However, patent documents 4, 5 and 6 do not describe an example of extrapolation to such a state in which the elapsed time reaches an infinite value and the device is sufficiently cooled, that is, channel temperature increase amount $\Delta T_{ch}$ becomes zero.

Patent documents 4, 5, and 6 evaluate temperature increase amount $\Delta T_{ch}$ in devices. It is obvious that temperature increase amount $\Delta T_{ch}$ becomes zero in the state in which the elapsed time reaches an infinite value and the device is sufficiently cooled. Useful information is unavailable from measurement values extrapolated in a direction of the long elapsed time.

Patent documents 4, 5, and 6 aim to measure and evaluate the temperature increase amount and cannot provide information about transistor characteristics such as a drain current when temperature increase amount $\Delta T_{ch}$ is zero.

Further, [Equation 1] of patent document 4 needs to use predetermined semiconductor conductivity a and channel length $L_{SD}$ of a transistor to be measured. Errors contained in these values might cause an error in the result that will be finally available.

There is an issue of providing a semiconductor device evaluation apparatus and a semiconductor device evaluation method for accurately determining electric characteristics of a semiconductor device without self-heating while the electric characteristics might vary with self-heating.

A semiconductor device evaluation apparatus according to an aspect of the present invention includes: a current measurement portion that measures a current value flowing through a semiconductor device at multiple times included in a period from the beginning of application of a voltage for a current flowing through the semiconductor device to a steady state of the current value flowing through the semiconductor device; a period division portion that divides the period into a first period and a second period later than the first period and finds a curve approximately representing a temporal change in a current value measured at the time included in the second period so that a difference between a current value measured at time included in the first period and a current value found by extrapolating the curve at that time becomes greater than a specified threshold value; and a current estimation portion that finds a curve approximately representing a current value measured at time included in the first period and extrapolates the curve to estimate a current value flowing through the semiconductor device at the start time.

A semiconductor device evaluation method according to another aspect of the present invention allows a computer to perform the steps of: measuring a current value flowing through a semiconductor device at a plurality of times included in a period from beginning of application of a voltage for a current flowing through the semiconductor device to a steady state of the current value flowing through the semiconductor device; dividing the period into a first period and a second period later than the first period and finding a curve approximately representing a temporal change in a current value measured at the time included in the second period so that a difference between a current value measured at time included in the first period and a current value found by extrapolating the curve at the time becomes greater than a specified threshold value; and finding a curve approximately representing a current value measured at time included in the first period and extrapolating the curve to estimate a current value flowing through the semiconductor device at the start time.

A semiconductor device evaluation apparatus and a semiconductor device evaluation method according to the present invention can accurately determine electric characteristics of semiconductor devices in a state without self-heating that might vary the electric characteristics thereof.

BRIEF DESCRIPTION OF THE DRAWINGS

FIG. 23 illustrates operations of the semiconductor device evaluation apparatus according to the fourth embodiment;

FIG. 36 illustrates the technology described in FIG. 3 of non-patent document 1;

DETAILED DESCRIPTION

Figure 1:
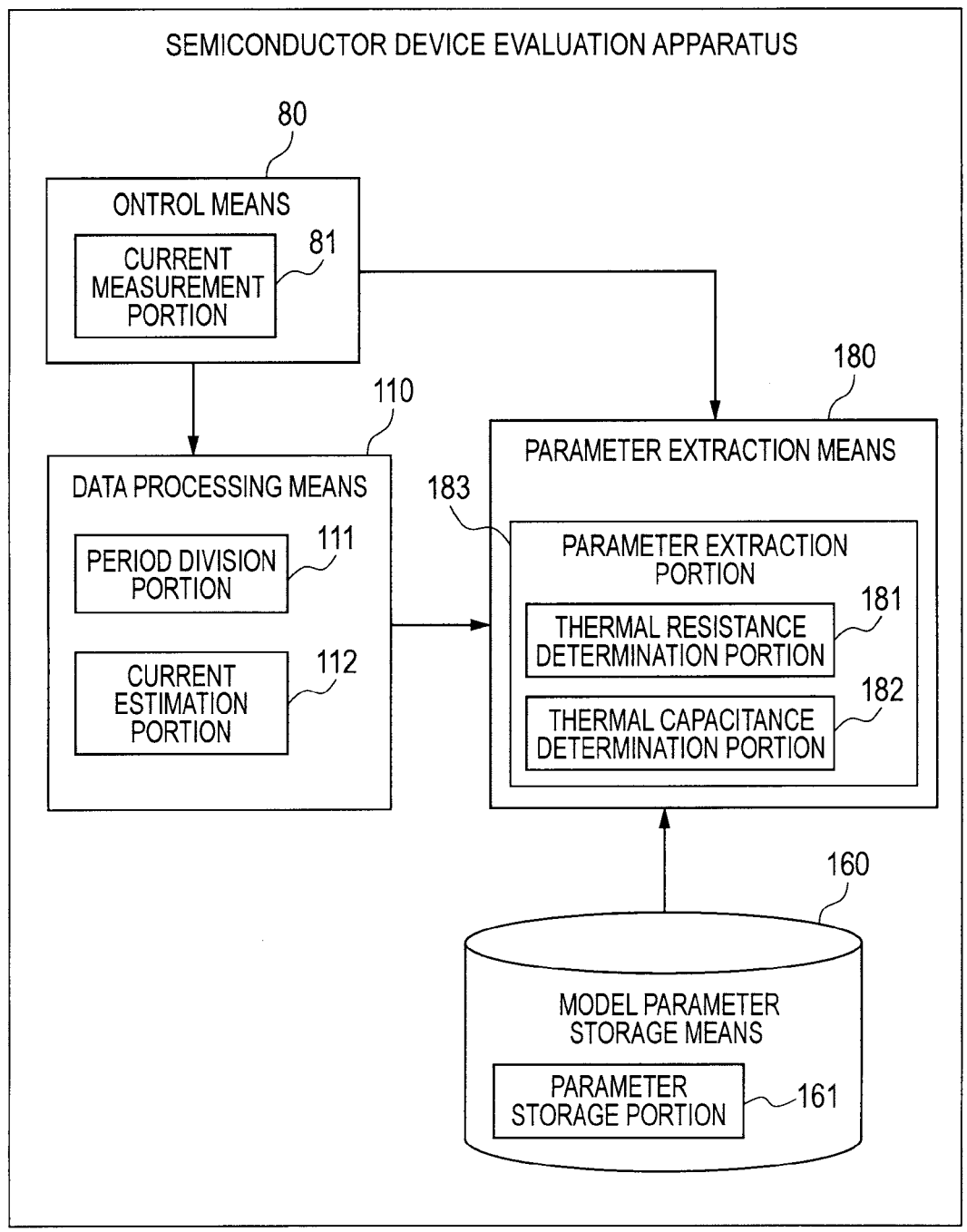
FIG. 1 is a block diagram schematically showing the configuration of a semiconductor device evaluation apparatus according to an embodiment of the invention.

The following provides a brief overview of the present invention. The overview contains reference numerals and symbols in the appended drawings only for the purpose of examples to help understand the description, not intended to limit the invention to the embodiments shown in the drawings.

FIG. 1 is a block diagram schematically showing the configuration of a semiconductor device evaluation apparatus according to the invention. As shown in FIG. 1, the semiconductor device evaluation apparatus includes at least a control means (80) and a data processing means (110). The control means (80) includes a current measurement portion (81). The data processing means (110) includes a period division portion (111) and a current estimation portion (112).

The current measurement portion (81) measures current values flowing through a semiconductor device at different times in a period from the time to start applying a voltage for a current to flow through the semiconductor device to the time at which a current value flowing through the semiconductor device reaches the steady state. As shown in FIG. 23, the period is divided into a first period (e.g., period A) and a second period (e.g., period B) subsequent to the first period. FIG. 23 shows a curve that is found to approximately represent a temporal change of current values measured at different times included in the second period. The period division portion (111) divides the period so that a difference between the current value measured at the time included in the first period and the current value found by extrapolating the curve at that time becomes larger than or equal to a specified threshold value.

The current estimation portion (112) finds a curve that approximately represents current values measured at different times included in the first period. The current estimation portion (112) extrapolates the curve to estimate a current value flowing through the semiconductor device at the start time (e.g., t=0).

With reference to FIG. 23, the current estimation portion (112) may find a first curve (e.g., approximate straight line A) approximately representing a temporal change of the value as a difference found by subtracting the current value ($I_{d\_steady}$) in the steady state from a current value measured at the time included in the first period. The current estimation portion (112) may add a value found by extrapolating the first curve at the start time and the current value in the steady state together to estimate the current value (e.g., $I_{d\_diff0}$) at the start time.

Further, with reference to FIG. 23, the period division portion (111) may find a second curve (e.g., approximate straight line B) representing a temporal change of the value as a difference found by subtracting the current value in the steady state from a current value measured at the time included in the second period. The period division portion (111) may then divide the period so that a difference between a value as a difference found by subtracting the current value in the steady state from the current value measured at the time included in the first period and a value found by extrapolating the second curve at that time becomes larger than or equal to a specified threshold value.

Figure 24A:
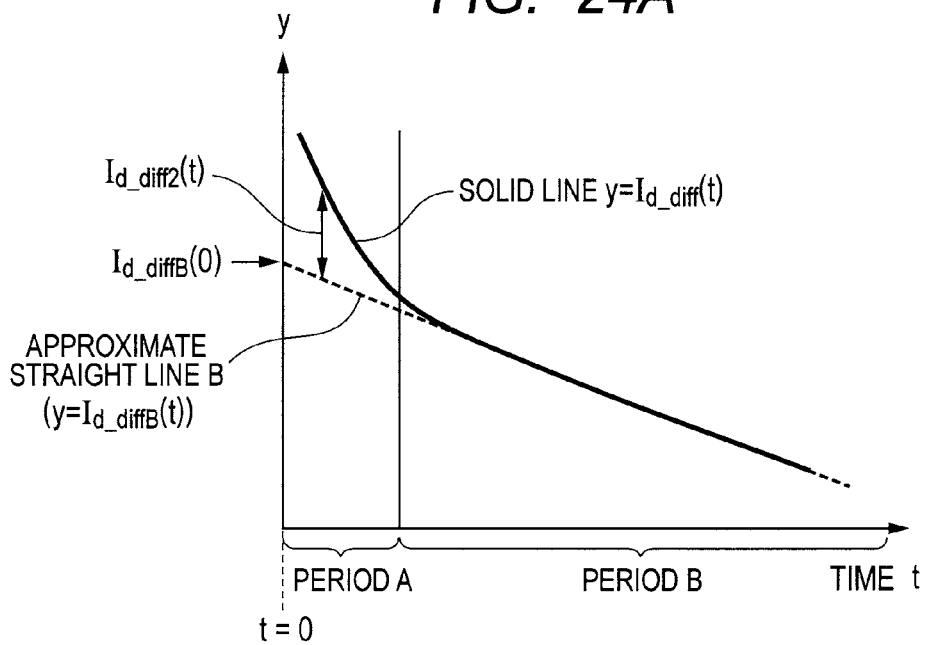
FIGS. 24A and 24B illustrate operations of the semiconductor device evaluation apparatus according to the fourth embodiment.
Figure 24B:
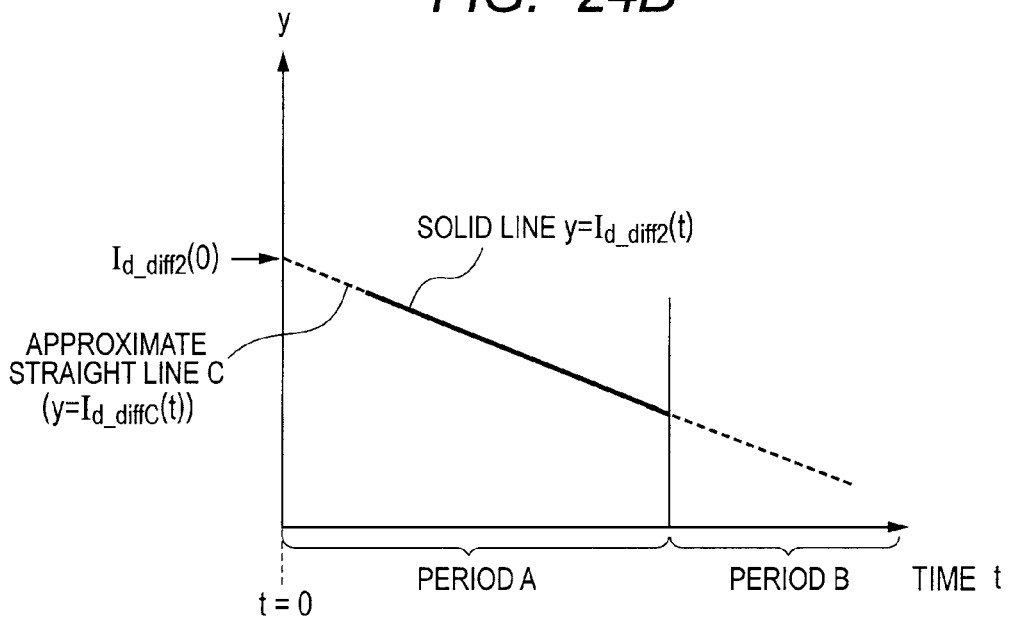

With reference to FIGS. 24A and 24B, the current estimation portion (112) finds a third curve (e.g., approximate straight line C) approximately representing a value as a difference found by subtracting the current value in the steady state and a value found by extrapolating the second curve (e.g., approximate straight line B) to the time included in the first period (e.g., period A) from the current value measured at that time. The current estimation portion (112) may add a value found by extrapolating the second curve to the start time, a value found by extrapolating the third curve to the start time, and the current value in the steady state together to estimate the current value at the start time.

With reference to FIG. 1, the semiconductor device evaluation apparatus preferably further includes a parameter extraction means (180). The parameter extraction means (180) includes a parameter extraction portion (183) or a heat resistance determination portion (181) and a heat capacity determination portion (182).

Figure 13:
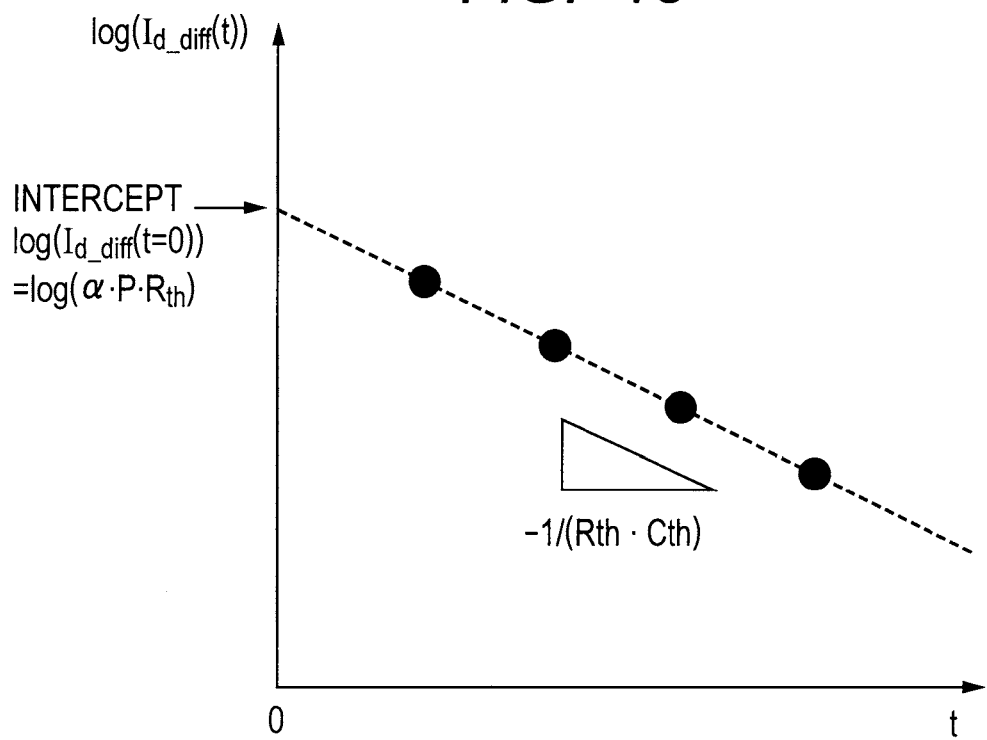
FIG. 13 illustrates operations of the semiconductor device evaluation apparatus according to the first embodiment.

With reference to FIG. 13, the heat resistance determination portion (181) extrapolates the first curve to find a value at the start time and determines a heat resistance value of the semiconductor device based on the found value at the start time. With reference to FIG. 13, the heat capacity determination portion (182) may determine a heat capacity value of the semiconductor device based on the heat resistance value determined by the heat resistance determination portion (181) and the slope of the first curve.

Figure 28:
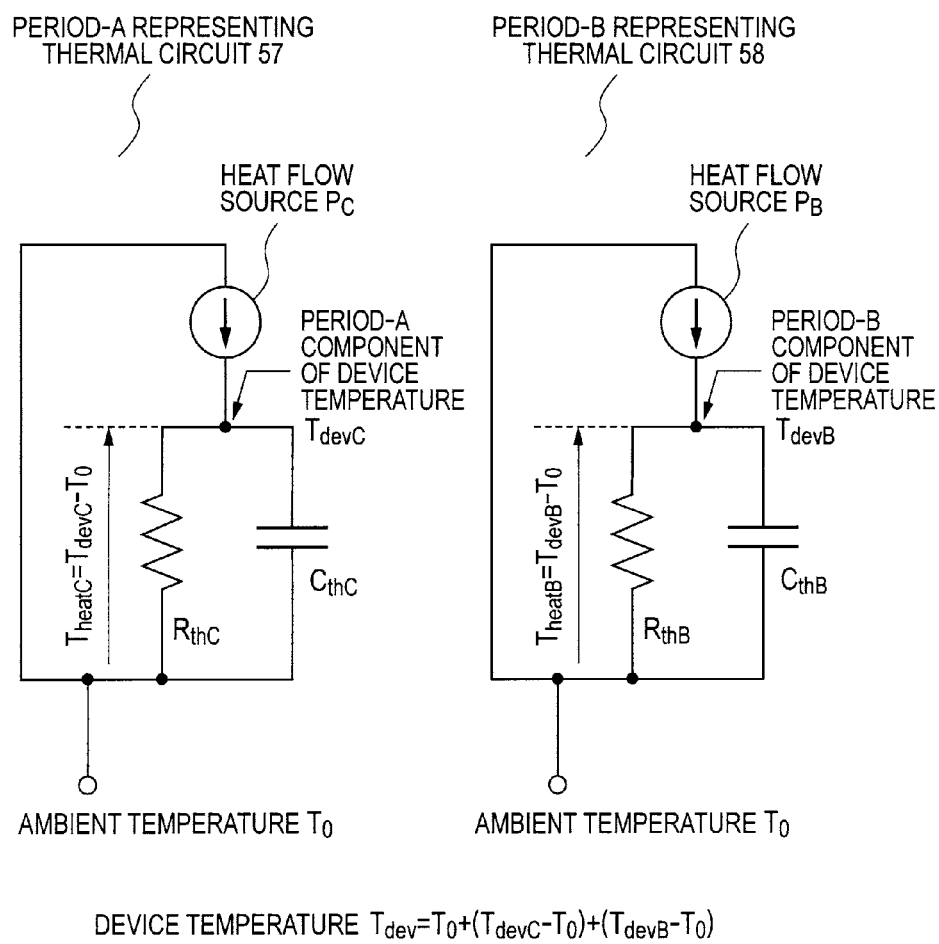
FIG. 28 illustrates operations of the semiconductor device evaluation apparatus according to a fifth embodiment.

With reference to FIG. 28, the parameter extraction portion (183) may include a first thermal circuit (57) and a second thermal circuit (58) to perform circuit simulation including self-heating on the semiconductor device. The first thermal circuit (57) records temperature changes in the semiconductor device during the first period (period A) using a first heat resistance parameter ($R_{thC}$) and a first heat capacity parameter ($C_{thC}$). The second thermal circuit (58) records temperature changes in the semiconductor device during the second period (period B) using a second heat resistance parameter ($R_{thB}$) and a second heat capacity parameter ($C_{thB}$). The parameter extraction portion (183) may determine a first heat resistance parameter, a first heat capacity parameter, a second heat resistance parameter, and a second heat capacity parameter so as to reproduce the current values measured at the multiple times and the current value in the steady state.

Figure 29:
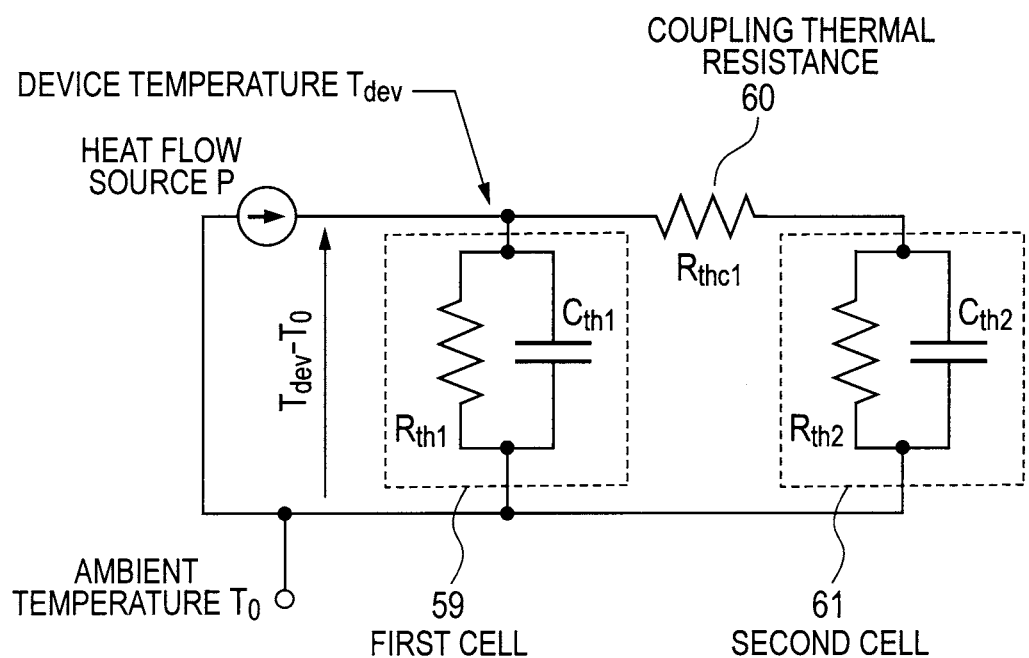
FIG. 29 illustrates a semiconductor device evaluation apparatus according to a sixth embodiment.

With reference to FIG. 29, the parameter extraction portion (183) may include a first thermal circuit (first cell 59), a second thermal circuit (second cell 61), and a heat resistance device 60 (coupling heat resistance $R_{thc1}$) to perform circuit simulation including self-heating on the semiconductor device. The first cell 59 records temperature changes in the semiconductor device during the first period (period A) using a first heat resistance parameter ($R_{th1}$) and a first heat capacity parameter ($C_{th1}$). The second cell 61 records temperature changes in the semiconductor device during the second period (period B) using a second heat resistance parameter ($R_{th2}$) and a second heat capacity parameter ($C_{th2}$). The heat resistance device 60 couples the cell 59 and the cell 61 together. The parameter extraction portion (183) may determine a first heat resistance parameter, a first heat capacity parameter, a second heat resistance parameter, and a second heat capacity parameter so as to reproduce the current values measured at the multiple times and the current value in the steady state.

The heat resistance determination portion (181) may specify a first heat resistance value equivalent to the heat resistance value for the semiconductor device during the first period based on a value found by extrapolating the third curve at the start time. The heat resistance determination portion (181) may specify a second heat resistance value equivalent to the heat resistance value for the semiconductor device during the second period based on a value found by extrapolating the second curve at the start time. At the same time, the heat capacity determination portion (182) may determine a heat capacity value of the semiconductor device during the first period based on the first heat resistance value and the slope of the third curve. In addition, the heat capacity determination portion (182) may determine a heat capacity value of the semiconductor device during the second period based on the second heat resistance value and the slope of the second curve.

As shown in FIG. 1, the semiconductor device evaluation apparatus preferably further includes a model parameter storage means (160). The model parameter storage means (160) includes a parameter storage portion (161). The parameter storage portion (161) stores a first current value equivalent to the current value flowing through the semiconductor device at the moment of applying a specified voltage. The parameter storage portion (161) stores a second current value equivalent to the current value flowing through the semiconductor device after that value reaches the steady state. The parameter storage portion (161) stores a parameter for circuit simulation. The parameter is adjusted so as to generate the first current value if the specified voltage is applied during the circuit simulation of the semiconductor device.

The heat resistance determination portion (181) may perform the circuit simulation including self-heating by adding a heat resistance parameter representing the heat resistance to that parameter. In such a case, the heat resistance determination portion (181) determines the heat resistance parameter so as to reproduce the second current value if applying the specified voltage enables the steady state. The heat capacity determination portion (182) may perform the circuit simulation including self-heating by adding the determined heat resistance value and a heat capacity parameter representing the heat capacity to that parameter. In such a case, the heat capacity determination portion (182) determines the heat capacity parameter so as to reproduce the current value measured at the multiple times.

As shown in FIG. 13, the heat resistance determination portion (181) extrapolates the first curve to find a value at the start time and determines the heat resistance value for the semiconductor device based on the found value. The heat capacity determination portion (182) determines the heat capacity value for the semiconductor device based on the heat resistance value determined by the heat resistance determination portion (181) and the slope of the first curve.

The semiconductor device evaluation apparatus according to the invention can accurately determine electric characteristics of semiconductor devices in a state without self-heating while the characteristics might vary with self-heating. The semiconductor device evaluation apparatus according to the invention can highly accurately find parameters (e.g., heat resistance parameter and heat capacity parameter) for the circuit simulation including the self-heating.

First Embodiment

The semiconductor device evaluation apparatus according to the first embodiment will be described with reference to the accompanying drawings. The following describes an outline of means included in the semiconductor device evaluation apparatus according to the embodiment and consequent effects provided.

Figure 2:
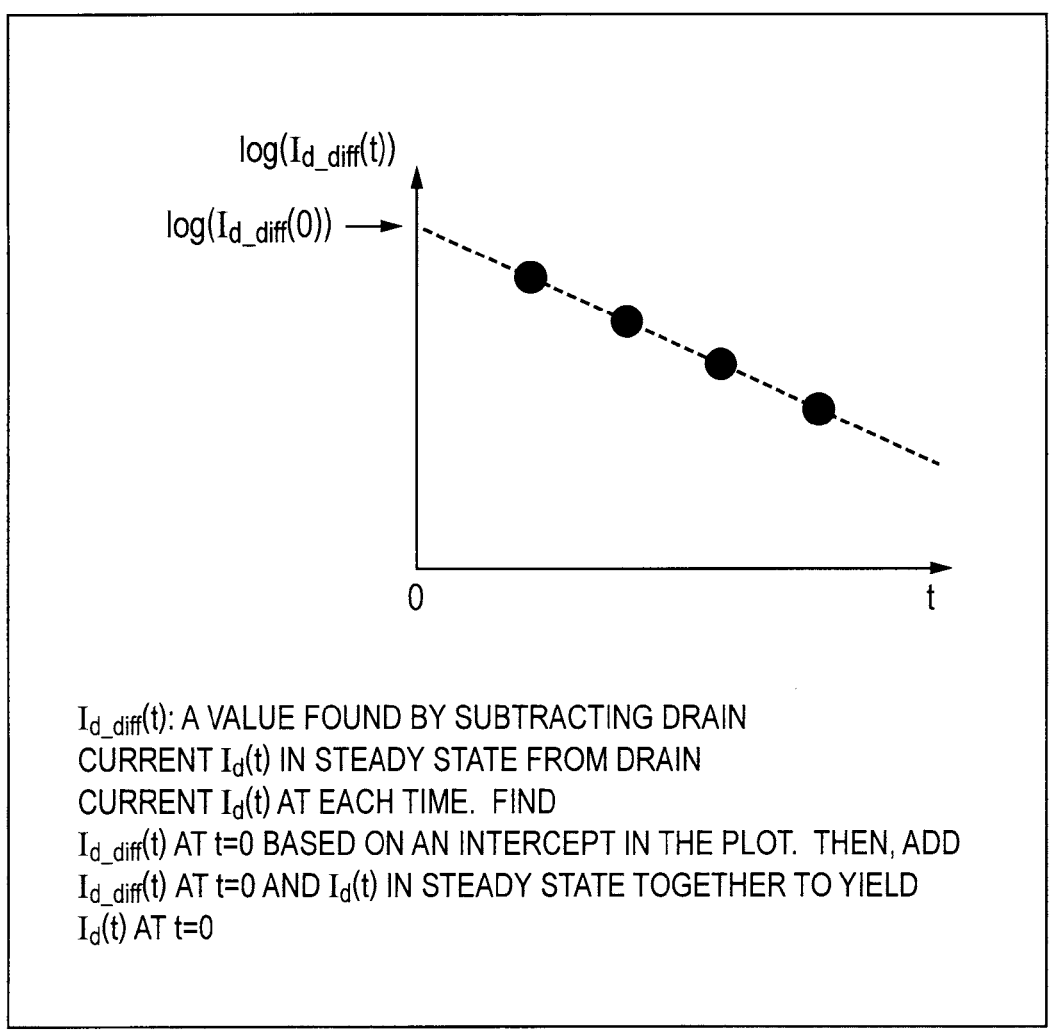
FIG. 2 illustrates operations of a semiconductor device evaluation apparatus according to a first embodiment.

FIG. 2 illustrates operations of the semiconductor device evaluation apparatus according to the embodiment. With reference to FIG. 2, the apparatus applies a pulse voltage or a step voltage to a field effect transistor that is initially turned off. The apparatus measures device characteristics at specified times after the voltage is applied. The apparatus performs extrapolation using measurement values (black dots in FIG. 2) found at the times and finds device characteristics in the initial state (t=0).

Specifically, the apparatus uses a compensation value as a difference found by subtracting the measurement value in the steady state from the device characteristics measured at the times. The apparatus extrapolates the compensation value using an exponential function or a linear function to find device characteristics in the initial state.

Figure 3:
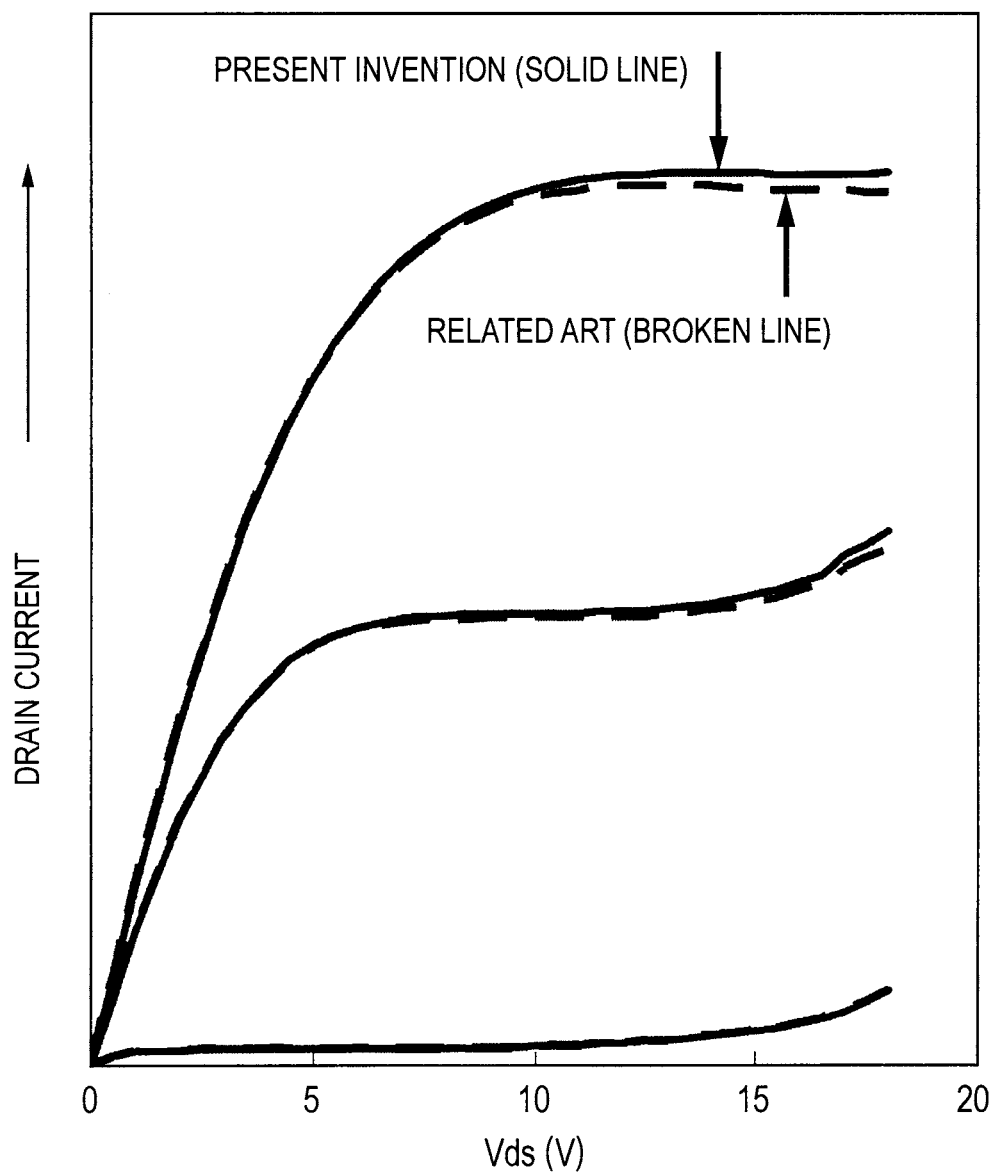
FIG. 3 illustrates an effect of the semiconductor device evaluation apparatus according to the first embodiment.

The initial state disables self-heating from starting. That is, the device characteristic in the initial state is equivalent to that without self-heating. FIG. 3 shows a graph created by plotting drain current $I_d$ and drain voltage $V_{ds}$ in relation to three different gate voltages.

Unlike patent document 1, the embodiment can find device characteristics in the initial state, that is, in a state in which the self-heating does not start yet. The embodiment can completely eliminate effects from the self-heating.

Unlike patent document 2, the embodiment need not predetermine heat resistance $R_{th0}$ or power index n concerning a temperature increase. The embodiment does not cause an error resulting from estimation of heat resistance $R_{th0}$ or power index n and can easily and accurately provide device characteristics while eliminating effects of self-heating.

Unlike the technology described in non-patent document 3, the embodiment does not use the indirect procedure that once extracts the heat resistance, combines the heat resistance with a drain current in the steady state of increased temperature, and finds a drain current in the state of no temperature increase. That is, the embodiment directly determines device characteristics such as a drain current without temperature increase from measurement values. The embodiment can avoid an error in extraction of a heat resistance or an error in data processing using heat resistance values.

The embodiment can find device characteristics without temperature increase as an initial state if device characteristics have been measured at times during a stage of finding a drain current without temperature increase. That the embodiment does not need empirical parameters, actual measurement values, or estimate values except device characteristics measured at multiple times. Accordingly, the embodiment can eliminate an error due to empirical parameters, actual measurement values, or estimate values and can provide highly accurate measurement results.

The embodiment uses a measurement value in the steady state and at least two measurement values before the steady state during a stage of finding a drain current without temperature increase. The embodiment identifies a compensation value equivalent to a difference found by subtracting the measurement value in the steady state from device characteristics measured at least two times. The embodiment can prevent inappropriate measurement points from being used for extrapolation by extrapolating the compensation value.

Figure 4:
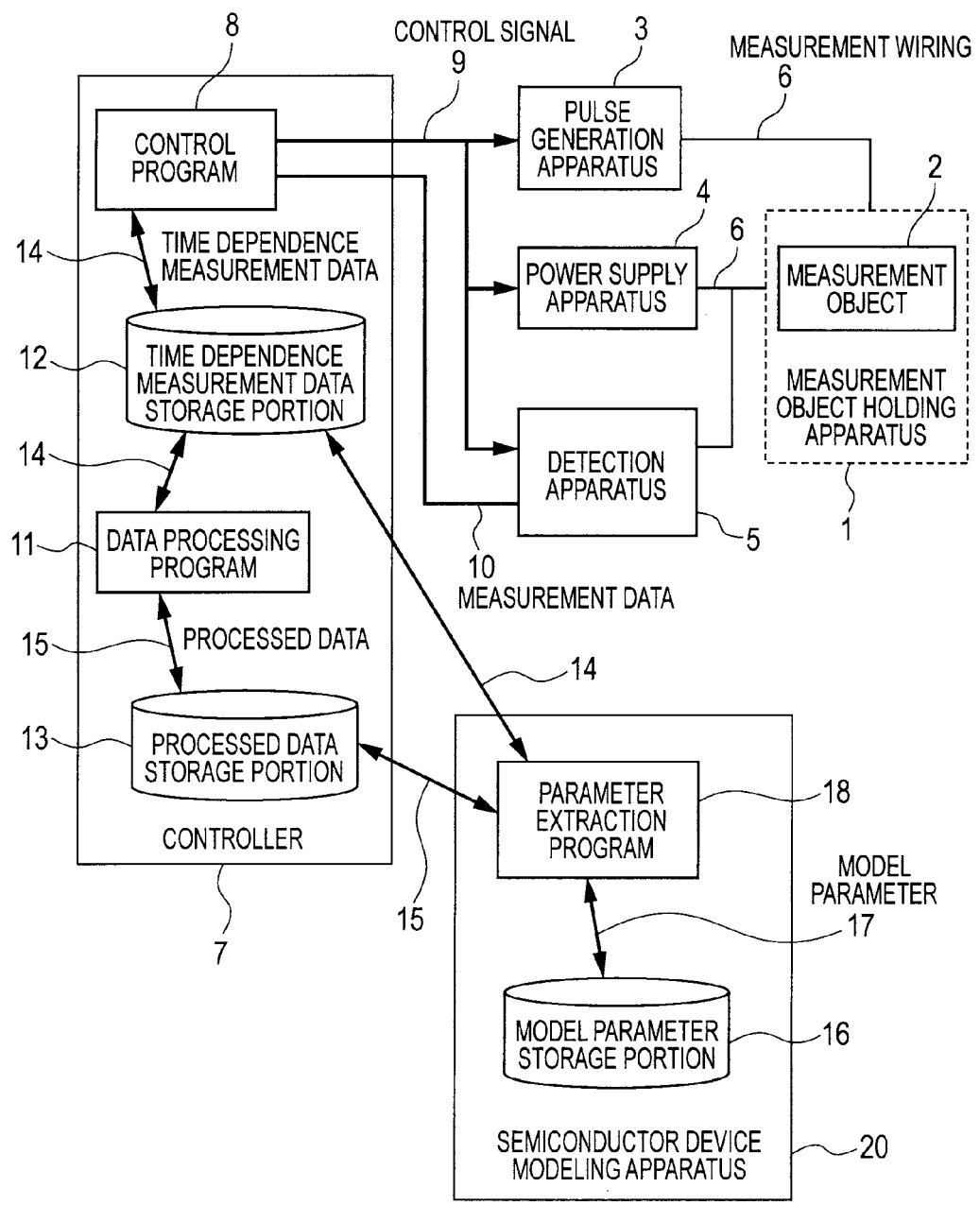
FIG. 4 is a block diagram showing the configuration of the semiconductor device evaluation apparatus according to the first embodiment.
Figure 5A:
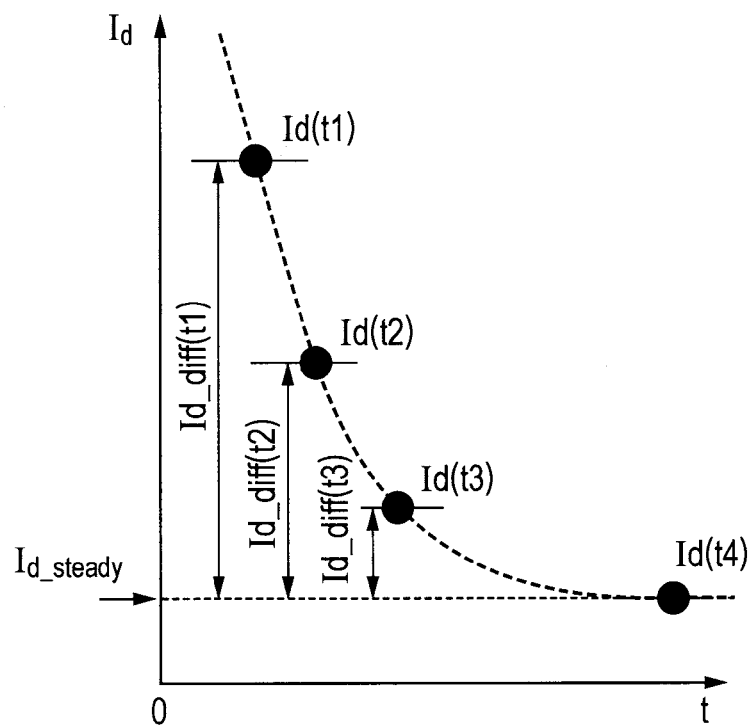
FIGS. 5A and 5B illustrate data processing procedures of the semiconductor device evaluation apparatus according to the first embodiment.
Figure 5B:
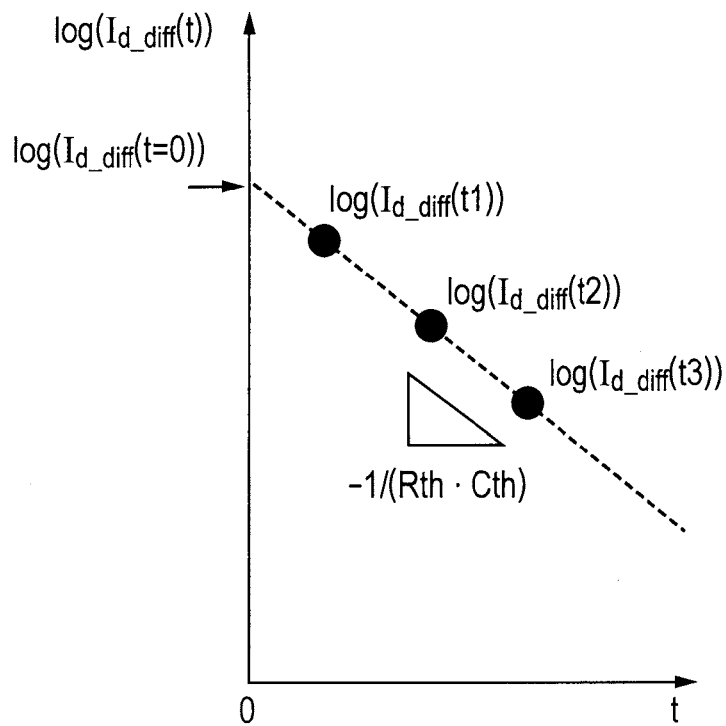

FIG. 4 is a block diagram showing the configuration of the semiconductor device evaluation apparatus according to the first embodiment. FIGS. 5A and 5B illustrate data processing procedures.

With reference to FIG. 4, the semiconductor device evaluation apparatus includes at least a controller 7. The semiconductor device evaluation apparatus may further include a semiconductor device modeling apparatus 20. The controller 7 includes a control program 8, a time dependence measurement data storage portion 12, a data processing program 11, and a processed data storage portion 13. The semiconductor device modeling apparatus 20 includes a parameter extraction program 18 and a model parameter storage portion 16.

The control program 8, the data processing program 11, the parameter extraction program 18, and the model parameter storage portion 16 in FIG. 4 are equivalent to a control means 80, a data processing means 110, a parameter extraction means 180, and a model parameter storage means 160 in FIG. 1, respectively.

With reference to FIG. 4, the semiconductor device evaluation apparatus is externally provided with a pulse generation apparatus 3, a power supply apparatus 4, a detection apparatus 5, a measurement object 2, and a measurement object holding apparatus 1.

The semiconductor device evaluation apparatus shown in FIG. 4 is configured similarly to the pulse measurement apparatus shown in FIG. 1 of non-patent document 3 except the function of the control program 8, the function of the data processing program 11, the controller 7 including both, and the semiconductor device modeling apparatus 20. According to the embodiment, the control program 8 and the data processing program 11 highly accurately evaluate self-heating.

In the semiconductor device evaluation apparatus according to the embodiment, the measurement object holding apparatus 1 such as a semiconductor prober or a tester holds the measurement object 2 such as a packaged semiconductor device or a silicon wafer where the semiconductor device such as a field effect transistor is formed.

The pulse generation apparatus 3 such as a pulse generator generates a pulse. The power supply apparatus 4 applies a direct current voltage. The control program 8 is installed in the controller 7 for controlling a measuring apparatus and issues a control signal 9 that controls the pulse generation apparatus 3 and the power supply apparatus 4. The pulse generation apparatus 3 and the power supply apparatus 4 apply a bias voltage to the measurement object 2 via a measurement wiring 6.

The detection apparatus 5 measures device characteristics such as a drain current in accordance with control of the control program 8. The detection apparatus 5 transmits a measurement result to the controller 7.

The control program 8 transmits the control signal 9 to the power supply apparatus 4, the pulse generation apparatus 3, and the detection apparatus 5. The control signal 9 is transmitted to the power supply apparatus 4 in order to specify applied voltage conditions and application of a voltage. The control signal 9 is transmitted to the pulse generation apparatus 3 in order to specify applied pulse voltage conditions and application of a voltage. The control signal 9 is transmitted to the detection apparatus 5 in order to specify measurement conditions.

The control program 8 receives measurement data 10 from the detection apparatus 5. The measurement data 10 may contain device characteristics measured at multiple times after the rise of a pulse voltage applied by the pulse generation apparatus 3. Further, the measurement data 10 may contain device characteristics measured at multiple times after the rise of a pulse in each of bias voltages. Furthermore, the measurement data 10 may contain device characteristics measured at multiple times after the rise of a pulse under such bias conditions that the field effect transistor is supplied with a constant gate voltage and varied drain voltages.

The control program 8 stores the acquired measurement data 10 as time dependence measurement data 14 concerning device characteristics measured at multiple times after the rise of a pulse in the time dependence measurement data storage portion 12 including a storage unit such as a hard disk or main memory.

From the viewpoint of program processing, the time dependence measurement data storage portion 12 may be provided as an external file for the storage unit such as a hard disk. The time dependence measurement data storage portion 12 may be provided as a program-controlled data area such as an array in the storage unit such as a hard disk or main memory. The time dependence measurement data 14 may contain measurement values of device characteristics that are equivalent to characteristics of a state indicating the full lapse of time and are acquired by an ordinary direct current measurement means using a semiconductor parameter analyzer.

The data processing program 11 retrieves the time dependence measurement data 14 from the time dependence measurement data storage portion 12. The data processing program 11 performs extrapolation in relation to the time axis to find device characteristics at the time to start applying the pulse. The data processing program 11 outputs the acquired result as processed data 15 to the processed data storage portion 13. The processed data 15 stored in the processed data storage portion 13 is output outside the controller 7 through a communication network such as Ethernet (registered trademark), an auxiliary storage unit including nonvolatile memory such as USB memory, and a storage medium such as CD-ROM. The processed data 15 is used to generate model parameters for the semiconductor device, analyze self-heating of the semiconductor device, or analyze the other device characteristics.

The controller 7 controls a measuring instrument to acquire the time dependence measurement data 14 concerning semiconductor device characteristics. In addition, the controller 7 processes self-heating data to generate the processed data 15 as device characteristics free from effects of the self-heating. The controller 7 includes not only the control program 8, the data processing program 11, the time dependence measurement data storage portion 12, the processed data storage portion 13, but also hardware needed to ensure functions of programs and data storage areas, and hardware needed for communication of the control signal 9 and the measurement data 10. The controller 7 may be embodied as a personal computer provided with these programs and the communication function or as dedicated hardware.

The data processing program 11 subtracts a device characteristics value in the steady state from a device characteristics value at each time to find a difference value. The data processing program 11 extrapolates the difference value in relation to the time axis. The data processing program 11 finds a difference value at the pulse application start time. The data processing program 11 adds a difference value at the pulse application start time and the device characteristics value in the steady state together to find a device characteristics value at the pulse application start time. When extrapolating the difference value in relation to the time axis, the data processing program 11 preferably uses an exponential function in relation to the time or a function containing an index that uses the time as a variable.

The control program 8 controls the apparatuses to receive the measurement data 10 corresponding to device characteristics measured at times after the pulse rise. At this time, for example, it may be preferable to acquire measurement values at multiple times after the pulse rise under a first evaluation bias condition containing specified values for voltages applied as the gate voltage and the drain voltage and then repeat the measurement under a second evaluation bias condition and later. The evaluation bias condition signifies a voltage application condition as a condition of evaluating the device characteristics. For example, the evaluation bias condition is equivalent to a voltage specified as an output value in terms of the direct current power supply. The evaluation bias condition is equivalent to a voltage after rise of a pulse in terms of the pulse generation apparatus. It may be preferable to repeat a process that acquires a measurement value at a point after a given time lapse from the pulse rise and then acquires a measurement value at another point after a different time lapse from the subsequent pulse rise under multiple evaluation bias conditions.

Measurement values may be acquired at multiple voltage application times under one evaluation bias condition. In such a case, it may be preferable to repeat a process that acquires a measurement value in response to application of one type of pulse and then acquires a measurement value at the different voltage application time in response to application of a pulse having a different pulse width. The voltage application time signifies a time lapse from the time point at which the pulse voltage started to rise. It may be preferable to acquire measurement values measured at multiple times from the rise of a pulse voltage while one type of pulse or a stepped voltage is applied. If a digital storage oscilloscope is used as the detection apparatus 5, a sampled waveform may be transmitted as the measurement data 10 to the controller 7. The control program may acquire a measurement value at the necessary voltage application time. Instead of a pulse voltage, a step voltage may be input in order to acquire measurement values at multiple voltage application times while one type of pulse or a stepped voltage is applied.

The parameter extraction program 18 is installed in the semiconductor device modeling apparatus 20 and reads the time dependence measurement data 14 from the time dependence measurement data storage portion 12 and the processed data 15 from the processed data storage portion 13. The parameter extraction program 18 creates a parameter for the device model used for the circuit simulation and stores the created model parameter 17 in the model parameter storage portion 16. For example, device models include BSIM and HiSIM_HV that describe device characteristics. Model parameters are used in a device model.

The time dependence measurement data 14 and the processed data 15 may be once output from the time dependence measurement data storage portion 12 and the processed data storage portion 13, respectively, to a network such as Ethernet, USB memory and other auxiliary storage units, CD-ROM and other storage media, or the other apparatuses or media. The parameter extraction program 18 may then read the time dependence measurement data 14 and the processed data 15 from the network, auxiliary storage units, storage media, or the other apparatuses or media.

The semiconductor device modeling apparatus 20 may be used for measurement and parameter extraction in an integrated fashion. A second embodiment will describe this configuration in detail. The semiconductor device modeling apparatus 20 and the controller 7 used for measurement of device characteristics may be provided adjacently to each other, integrally, or separately from each other.

Figure 18:
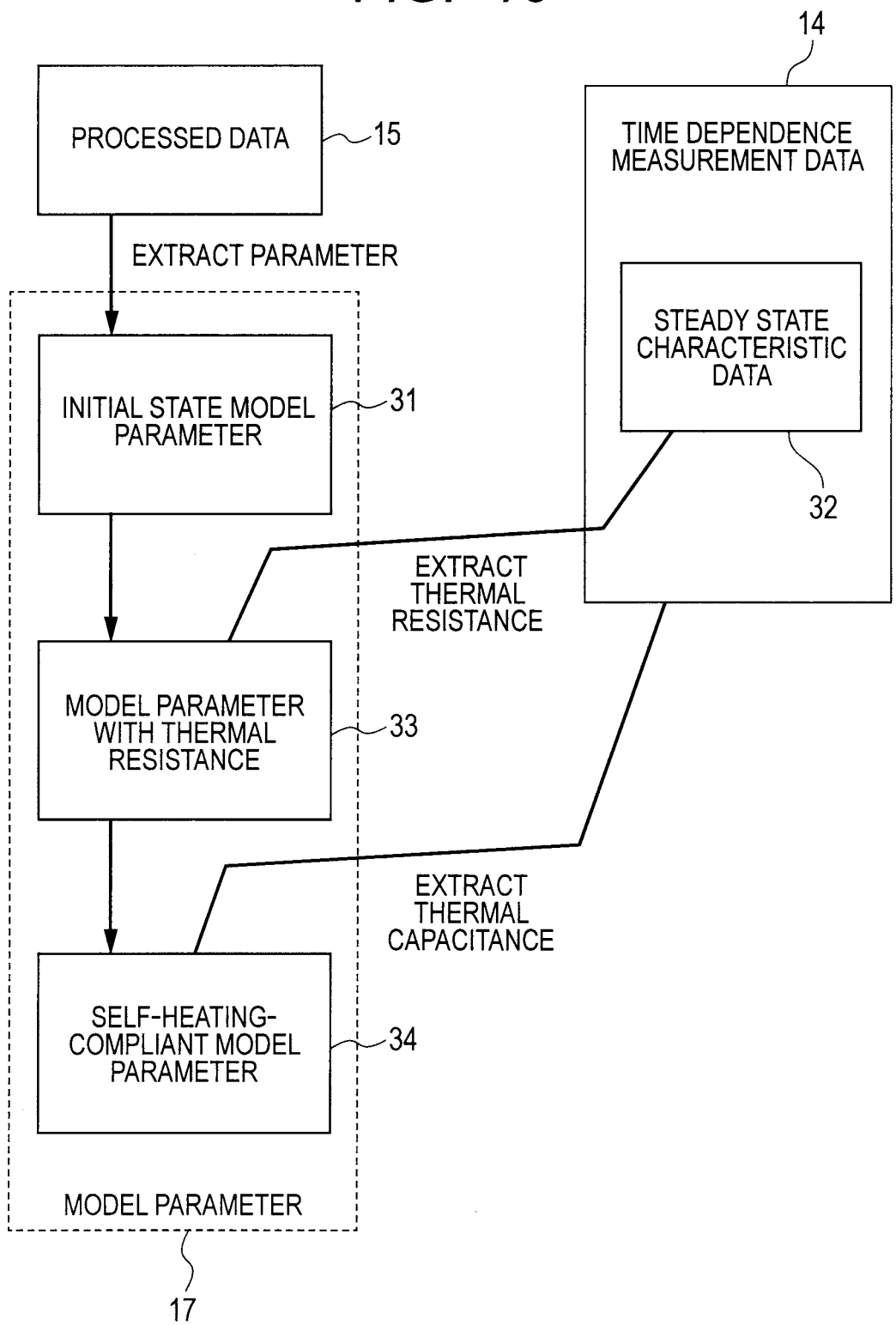
FIG. 18 illustrates dependence relation between models and data in the semiconductor device evaluation apparatuses according to the first and second embodiments.

The following describes a method of generating the model parameter 17 using the parameter extraction program 18. FIG. 18 illustrates dependence relation between models and data according to the invention.

With reference to FIG. 4, the parameter extraction program 18 extracts the model parameter 17 and stores it in the model parameter storage portion 16. The model parameter 17 reproduces the processed data 15 as the device characteristics without self-heating. With reference to FIG. 18, the generated model parameter 17 is assumed to be an initial state model parameter 31. Extraction of the model parameter 17 may use an automatic extraction procedure similar to an ordinary parameter extraction program for the processed data 15. The extraction may also use a procedure of generating parameters based on operator-specified operations such that an operator sets a parameter value or specifies a method of extracting parameter values as needed.

The parameter extraction program 18 uses the time dependence measurement data 14 corresponding to device characteristics found at the time the self-heating reaches a steady state. The parameter extraction program 18 reads the initial state model parameter 31 from the model parameter storage portion 16. The initial state model parameter 31 is equivalent to a model parameter 17 configured to reproduce the processed data 15 representing the characteristics without self-heating. In this case, the time dependence measurement data 14 is assumed to be steady state characteristic data 32. The parameter extraction program 18 determines a heat resistance parameter value so as to reproduce the steady state characteristic data 32 from the device characteristics acquired from the device simulation including self-heating using the initial state model parameter 31 supplied with the heat resistance parameter. The parameter extraction program 18 generates the model parameter 17 by appending the heat resistance parameter value to the initial state model parameter and stores the model parameter 17 in the model parameter storage portion 16. In this case, the model parameter 17 is assumed to be a model parameter with heat resistance 33.

As described above, a heat resistance parameter value is determined so as to reproduce the steady state characteristic data 32. This signifies that the steady state characteristic data 32 causes a fitting error to be within an allowable range. For example, the initial state model parameter 31 is attached with the heat resistance parameter to provide characteristics in the steady state reproduced by a device model. An error between the characteristics and the steady state characteristic data 32 is within a range of targeted values under a targeted fitting condition (including the bias condition and the temperature condition).

The parameter extraction program 18 generates a heat capacity parameter using the time dependence measurement data 14 and the model parameter with heat resistance 33 generated as described above. The parameter extraction program 18 determines a value of the heat capacity parameter so as to decrease an error between two types of time dependence as follows. One concerns device characteristics such as a drain current that is acquired by appending the heat capacity parameter to the model parameter with heat resistance 33. The other concerns device characteristics contained in the time dependence measurement data 14. The determined heat capacity parameter is added to the model parameter with heat resistance 33. The model parameter 17 including the model parameter with heat resistance 33 is assumed to be a self-heating-compliant model parameter 34. The self-heating-compliant model parameter 34 is recorded in the model parameter storage portion 16. The self-heating-compliant model parameter 34 stored in the model parameter storage portion 16 is output outside the controller 7 through a communication network such as Ethernet, an auxiliary storage unit including nonvolatile memory such as USB memory, and a storage medium such as CD-ROM. The processed data 15 is used to generate model parameters for the semiconductor device, analyze self-heating of the semiconductor device, or analyze the other device characteristics. The heat capacity analysis or the heat capacity parameter extraction preferably acquires measurement data about more types of elapsed time than acquisition of the processed data as characteristics without self-heating. On the other hand, it is only necessary to analyze the heat capacity or extract the heat capacity parameter at one or a few representative bias points. A wide bias range of data need not be acquired.

The following describes an example of the apparatus shown in FIG. 4. The measurement object holding apparatus 1 holds a semiconductor device and makes an electrode used for measurement in contact with the semiconductor device. For example, a semiautomatic prober may be used as the measurement object holding apparatus 1. The control signal 9 from the control program 8 may be coupled to the measurement object holding apparatus 1.

The measurement object 2 represents a power MOSFET formed on the wafer, for example. The measurement object 2 may represent various semiconductor devices such as SOI-MOSFET, bipolar transistor, and IGBT (Insulated Gate Bipolar Transistor).

The pulse generation apparatus 3 may represent a pulse generator. The power supply apparatus 4 may represent a direct current power supply apparatus or a semiconductor parameter analyzer.

The detection apparatus 5 measures device characteristics as a measurement object at high time resolution. For example, the detection apparatus 5 may represent a digital oscilloscope that measures a drain current waveform by measuring a voltage applied to the shunt resistor inserted between the drain electrode and the ground potential.

The measurement wiring 6 uses a coaxial cable, for example. The measurement wiring 6 applies a voltage to the measurement object 6 or couples the device to a characteristics measuring instrument.

The control program 8 installed on the controller 7 uses the control signal 9 to control the pulse generation apparatus 3, the power supply apparatus 4, and the detection apparatus S. The control signal 9 is transmitted through a GPIB cable, for example.

The measurement data 10 provides a measurement value that is transmitted from the detection apparatus 5 to the control program 8 installed on the controller 7. The measurement data 10 is transmitted through a GPIB cable used in common with the control signal 9, for example.

FIG. 4 assumes that a pulse voltage is applied to the gate and a steady voltage is applied to the drain. The measurement wiring 6 coupled to the pulse generation apparatus 3 is separated from the measurement wiring 6 coupled to the power supply apparatus 4 and the detection apparatus 5. Another coupling configuration may be used if a bias voltage is applied according to different methods such as applying a pulse voltage to the drain, for example.

FIG. 4 shows the control program 8 and the data processing program 11 independently of each other. Further, there may be provided a single program having the function of the control program 8 and the function of the data processing program 11. In this case, the time dependence measurement data 14 is treated as array data managed by a program and is passed from a subroutine having the function of the control program 8 to a subroutine having the function of the data processing program 11 instead of being recorded as a file in the storage unit.

With reference to FIGS. 5A and 5B, the following describes measurement of the dependence between drain current and drain voltage for MOSFET as an example of the voltage application condition. It is supposed that drain voltage $V_{ds1}$ is applied, drain currents $I_d(t1)$, $I_d(t3)$, and $I_d(t4)$ are measured at times t1, t2, t3, and t4 (the above-mentioned voltage application times) after the gate pulse is applied. At time t4, it is assumed that enough time has passed and the temperature increase has reached the steady state. Drain current $I_d(t4)$ is assumed to be the steady state characteristic data 32 and is expressed as $I_{d\_steady}$. A difference between drain current $I_d(t)$ and $I_{d\_steady}$ at time t is assumed to be $I_{d\_diff}(t)$. A difference between $I_{d\_steady}$ and each of $I_d(t1)$, $I_d(t2)$, and $I_d(t3)$ is assumed to be $I_{d\_diff}(t1)$, $I_d(t2)$, and $I_{d\_diff}(t3)$, respectively. Extrapolation using $I_{d\_diff}(t1)$, $I_{d\_diff}(t2)$, and $I_{d\_diff}(t3)$, e.g., extrapolation containing the exponential function, is performed to find difference $I_{d\_diff}(0)$ between drain current $I_d(0)$ and $I_{d\_steady}$ at initial state t=0 as shown in FIG. 5B. The sum of $I_{d\_diff}(0)$ and $I_{d\_steady}$ is assumed to be the processed data 15, that is, drain current $I_d(0)$ without temperature increase due to self-heating. Subsequently, the measurement is repeated under second drain voltage $V_{ds2}$, third drain voltage $V_{ds3}$, and later.

According to a procedure as shown in FIG. 5B, the vertical axis is assumed to be the logarithm of $I_{d\_diff}(t)$. Linear extrapolation is performed to find value log $(I_{d\_diff}(0))$ at t=0 as an ordinate intercept. Value log $(I_{d\_diff}(0))$ is exponentiated to find extrapolation value $I_{d\_diff}(0)$ using the exponential function. FIG. 5B assumes the vertical axis to be the logarithm of $I_{d\_diff}(t)$ and linearly plots it. However, logarithmically plotting values of $I_{d\_diff}(t)$ provides the same result. The description here may be also applicable on the assumption that the vertical axis in FIG. 5B represents logarithmically plotted values of $I_{d\_diff}(t)$. In FIGS. 5A and 5B, the horizontal axis represents the linear plot.

The drain current at initial state t=0 may be estimated individually after the measurement of each bias point or may be estimated at a time after completion of the measurement of all drain voltages.

The procedure according to FIGS. 5A and 5B acquires characteristics values (drain currents) at elapsed times under the first bias voltage ($V_{ds1}$ in the above-mentioned example) and repeats the measurement under the second bias voltage and later. Further, the measurement may be performed at the first elapsed time t1 under multiple or all bias voltages and then the measurement may be similarly performed at the second elapsed time t2. The drain current at initial state t=0 may be estimated at a time after all the measurements are completed.

It may be preferable to use a method of supplying the constant gate voltage and applying a pulse voltage to the drain instead of the method of supplying the constant drain voltage and applying a pulse voltage to the gate.

Figure 6:
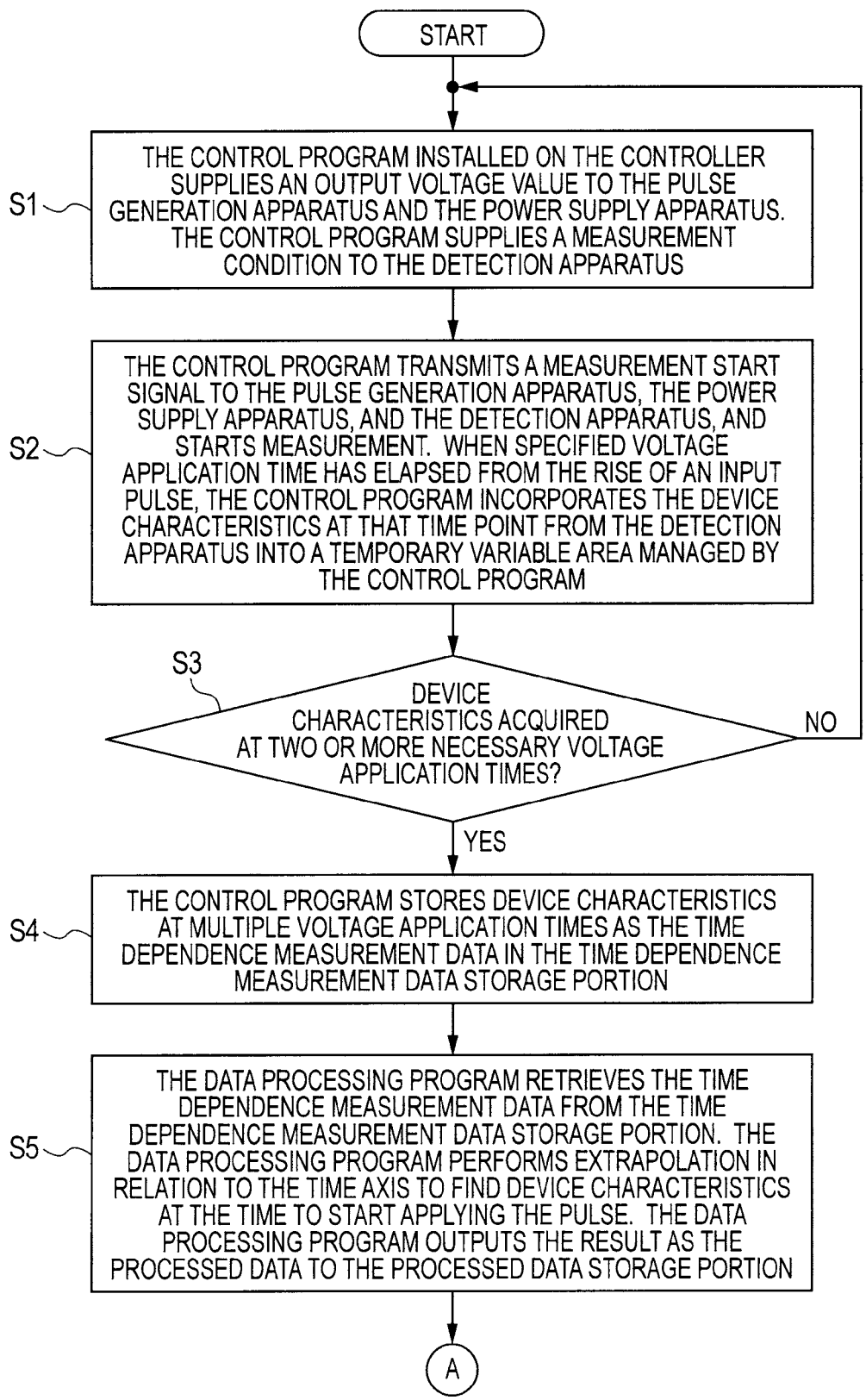
FIG. 6 is a flowchart showing operations of the semiconductor device evaluation apparatus according to the first embodiment.
Figure 7:
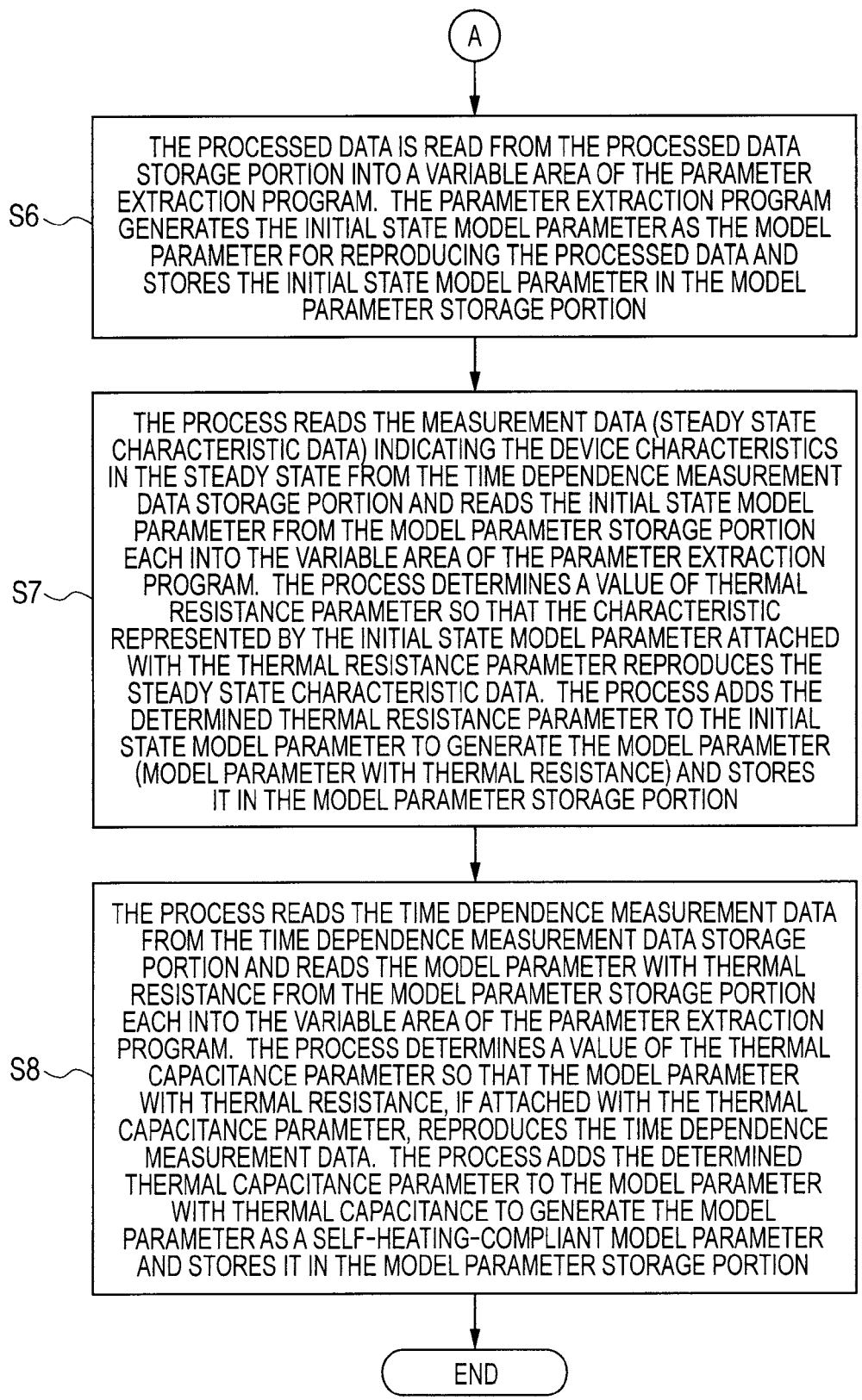
FIG. 7 is a flowchart showing operations of the semiconductor device evaluation apparatus according to the first embodiment.

The following describes a process flow in the software with reference to FIGS. 6 and 7. FIGS. 6 and 7 show one process flow divided into two drawings. That is, symbol A in FIG. 6 continues to symbol A in FIG. 7. Accordingly, step S5 in FIG. 6 is followed by step S6 in FIG. 7.

The control program 8 installed on the controller 7 supplies an output voltage value to the pulse generation apparatus 3 and the power supply apparatus 4. The control program 8 supplies a measurement condition to the detection apparatus 5 (step S1).

The control program 8 transmits a measurement start signal to the pulse generation apparatus 3, the power supply apparatus 4, and the detection apparatus 5, and starts measurement. When specified voltage application time has elapsed from the rise of an input pulse, the control program 8 incorporates the device characteristics at that time point from the detection apparatus 5 into a temporary variable area managed by the control program 8 (step S2).

The process determines whether the device characteristics have been acquired at two or more necessary characteristics measurement points (step S3). The process proceeds to step S4 if the characteristics have been acquired (Yes at step S3). The process returns to step S1 if the device characteristics have not been acquired at two or more necessary characteristics measurement points (No at step S3). The process configures necessary settings of the pulse generation apparatus 3, the power supply apparatus 4, and the detection apparatus 5 in order to acquire unfound device characteristics and repeats the measurement. The characteristics measurement point is assumed on the time axis that expresses the time to perform the measurement in the time elapsed after the start of pulse voltage application.

The process returns to step S1 because of unfound device characteristics at unreached voltage application time. In this case, the process changes settings such as the pulse width generated from the pulse generation apparatus 3 and the timing to acquire device characteristics in the detection apparatus 5 so as to be able to acquire device characteristics at the unreached voltage application time.

The embodiment acquires device characteristics under conditions provided by modifying the bias condition in several ways. The criterion at step S3 postulates that device characteristics are acquired at two or more necessary characteristics measurement points described above under evaluation bias conditions (voltages corresponding to the device characteristics such as a voltage of the direct current power supply and a voltage after the rise of a pulse) as measurement objects. If the criterion is not satisfied, the process returns to step S1 to change measurement conditions needed to acquire the remaining data and proceeds to the subsequent steps.

The control program 8 stores device characteristics at multiple voltage application times as the time dependence measurement data 14 in the time dependence measurement data storage portion 12 (step S4).

Step S2 or S3 may sequentially store part of the time dependence measurement data 14 in the time dependence measurement data storage portion 12.

The data processing program 11 retrieves the time dependence measurement data 14 from the time dependence measurement data storage portion 12. The data processing program 11 performs extrapolation in relation to the time axis to find device characteristics at the time to start applying the pulse. The data processing program 11 outputs the result as the processed data 15 to the processed data storage portion 13 (step S5).

The processed data 15 is read from the processed data storage portion 13 into a variable area of the parameter extraction program 18. The parameter extraction program 18 generates the initial state model parameter 31 as the model parameter 17 for reproducing the processed data 15 and stores the initial state model parameter 31 in the model parameter storage portion 16 (step S6).

The process reads the measurement data (steady state characteristic data 32) indicating the device characteristics in the steady state from the time dependence measurement data storage portion 12 and reads the initial state model parameter 31 from the model parameter storage portion 16 each into the variable area of the parameter extraction program 18. The process determines a value of heat resistance parameter $R_{th}$ so that the characteristic represented by the initial state model parameter 31 attached with the heat resistance parameter reproduces the steady state characteristic data 32. The process adds the determined heat resistance parameter to the initial state model parameter 31 to generate the model parameter 17 (model parameter with heat resistance 33) and stores it in the model parameter storage portion 16 (step S7).

The process reads the time dependence measurement data 14 from the time dependence measurement data storage portion 12 and reads the model parameter with heat resistance 33 from the model parameter storage portion 16 each into the variable area of the parameter extraction program 18. The process determines a value of the heat capacity parameter so that the model parameter with heat resistance 33, if attached with the heat capacity parameter, reproduces the time dependence measurement data 14. The process adds the determined heat capacity parameter to the model parameter with heat resistance 33 to generate the model parameter 17 as a self-heating-compliant model parameter 24 and stores it in the model parameter storage portion 16 (step S8).

Step S7 may be changed to step S7A described below. Step S7A generates a heat resistance parameter. This parameter may be used as an initial value to adjust the heat resistance parameter at step S7.

The process retrieves the time dependence measurement data 14 from the time dependence measurement data storage portion 12 and reads the data into the variable area of the parameter extraction program 18. The parameter extraction program 18 performs fitting based on equations or an equivalent process on the time dependence measurement data 14 to determine the heat resistance parameter value. The parameter extraction program 18 adds the determined heat resistance parameter to the initial state model parameter 31 to generate the model parameter 17 (model parameter 33 with heat resistance) and stores it in the model parameter storage portion 16 (step S7A).

Step S8 may be changed to step S8A described below. Step S8A generates a heat capacity parameter. This parameter may be used as an initial value to adjust the heat capacity parameter at step S8. Further, steps S17A and S18A may be performed simultaneously.

The process reads the time dependence measurement data 14 from the time dependence measurement data storage portion 12 and reads the model parameter with heat resistance 33 from the model parameter storage portion 16 each into the variable area of the parameter extraction program 18. The parameter extraction program 18 performs fitting based on equations or an equivalent process on the time dependence measurement data 14 to determine the heat capacity parameter value. The parameter extraction program 18 adds the determined heat capacity parameter to the model parameter with heat resistance 33 to generate the model parameter 17 and stores it as the self-heating-compliant model parameter 24 in the model parameter storage portion 16 (step S8A).

The two or more necessary characteristics measurement points are provided as a constituent element of the criterion at step S3 and correspond to voltage application times needed to perform extrapolation at step S5 in relation to the time axis on device characteristics at the time the pulse application started. A score for the voltage application time may be equivalent to a constant predetermined for the program before the measurement starts, for example. The measurement score may be dynamically increased if the program evaluates the measurement result and determines that voltage application times are not enough as needed.

At steps S6 through S8, the time dependence measurement data 14 might be preferably added in terms of the accuracy because intended model accuracy is unavailable or the fitting process causes a larger error than specified, for example. In such a case, the process may return to step S1 and add measurement of the time dependence measurement data 14 at unmeasured time t.

Step S3 checks if the evaluation bias conditions as measurement objects satisfy a criterion that device characteristics are available at two or more necessary characteristics points. The process returns to step S1 if the criterion is not satisfied. The following describes examples that do not satisfy the criterion.

A first example assumes a first evaluation bias condition to be gate voltage 10 V and drain voltage 1 V and a second evaluation bias condition to be gate voltage 10 V and drain voltage 2 V. At steps S1 and S2, the process might acquire device characteristics at two or more necessary characteristics measurement points under the first evaluation bias condition but not acquire device characteristics under the second evaluation bias condition. Then, the measurement is assumed to be unfinished (No at step S3). In this case, the process returns to step S1 and configures the evaluation bias condition as gate voltage 10 V and drain voltage 2 V. The process then acquires device characteristics at two or more necessary characteristics measurement points.

A second example assumes an evaluation bias condition to be gate voltage 10 V and drain voltage 1 V through 10 V in increments of 1 V. Under the evaluation bias condition, steps S1 and S2 may acquire device characteristics only at one type of voltage application time, e.g., only device characteristics 100 nanoseconds after the pulse rises. Then, the measurement is assumed to be unfinished (No at step S3). In this case, the process returns to step S1 and changes the pulse voltage application method in the pulse generation apparatus 3 or the measurement condition in the detection apparatus 5. At step S2, the process acquires device characteristics at the second type of voltage application time, e.g., device characteristics 150 nanoseconds after the pulse rises. The process is repeated until the necessary amount of data is acquired. The repetition may mix the bias voltage change according to the first example and the change of the voltage application time according to the second example.

The following describes examples of necessary characteristics measurement points as the criterion at step S3. At least two characteristics measurement points are required for extrapolation. The extrapolation may use a difference between the current at each voltage application time and the current in the steady state (including a current in a state assumed to be the steady state after a lapse of enough time from the pulse rise). Then, at least three characteristics measurement points are required if the steady state is assumed to be one characteristics measurement point. It is preferable to measure a difference between the current at each voltage application time and the current in the steady state at least three characteristics measurement points in order to eliminate an error from the extrapolation. Accordingly, measurement values are required for at least four characteristics measurement points if the steady state is assumed to be one characteristics measurement point.

Figure 12:
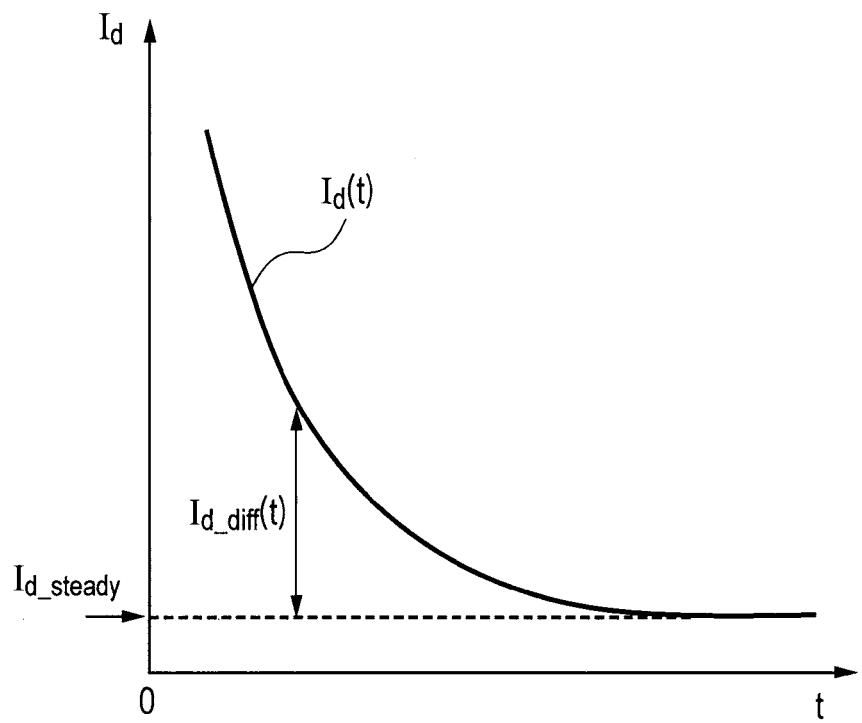
FIG. 12 illustrates operations of the semiconductor device evaluation apparatus according to the first embodiment.

Characteristics measurement points are dynamically added for the following reasons. As an example, too long voltage application time might be specified at a predetermined characteristics measurement point. The measurement value approximates to the steady state and causes an error in the extrapolation. To solve this problem, a measurement value in the steady state is measured at the beginning. The process subtracts the measurement value in the steady state from the measurement value at a given characteristics measurement point. The process uses a criterion whether the difference is greater or smaller than a threshold value. The characteristics measurement point is assumed not to satisfy the criterion if the difference is smaller than the threshold value. The process sets a new characteristics measurement point corresponding to the short voltage application time and repeats the measurement. As another example, too short voltage application time is specified at a predetermined characteristics measurement point. A waveform might be distorted due to reflection in a measurement system for applied signals. A graph as shown in FIG. 12 might not be plotted. To solve this problem, a measurement program may be used for determination so as to add a new characteristics measurement point corresponding to longer voltage application time.

The time dependence measurement data 14 may be stored in the time dependence measurement data storage portion 12 at a time at step S4 or may be sequentially stored at step S2 or S3 until step S4. At step S2, for example, the measurement data 10 read by the control program 8 from the detection apparatus 5 may be stored in a temporary variable area or may be sequentially written to the time dependence measurement data storage portion 12.

Figure 9:
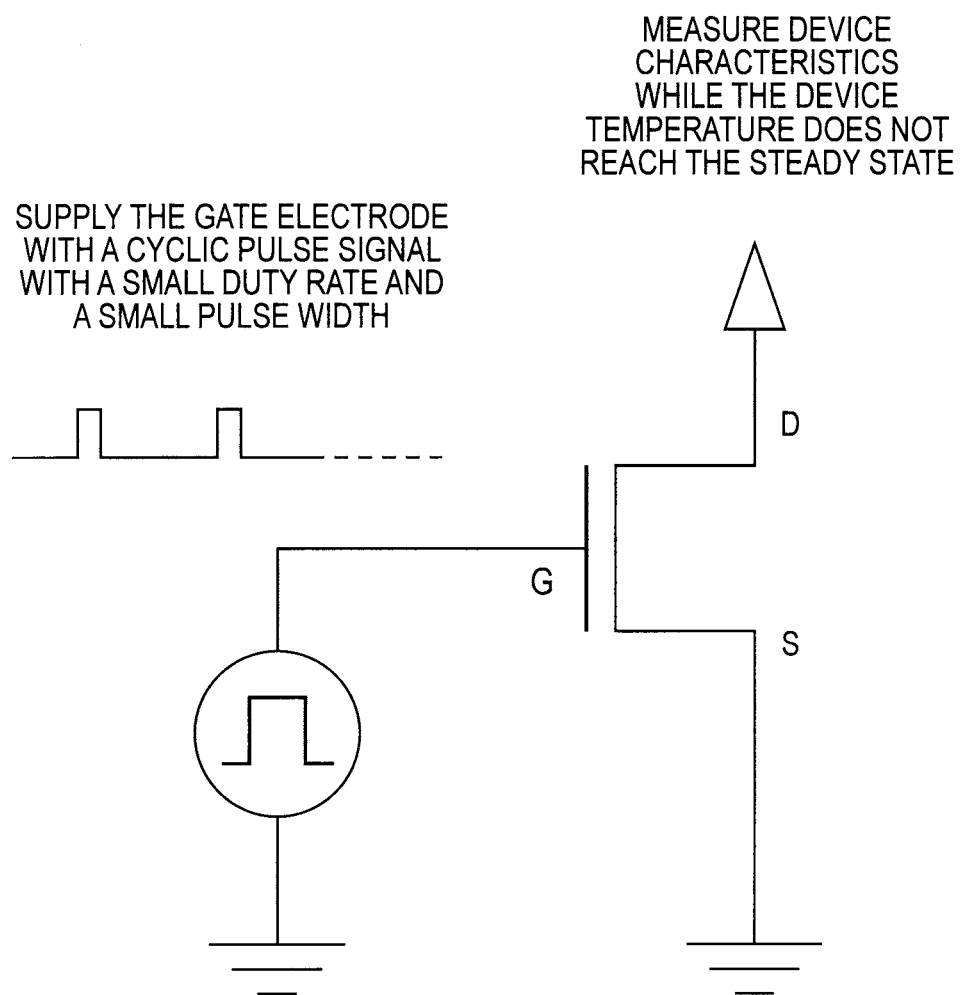
FIG. 9 illustrates operations of the semiconductor device evaluation apparatus according to the first embodiment.

The following describes more specific examples. According to the flowcharts in FIGS. 6 and 7, for example, the drain current for MOSFET is equivalent to device characteristics to be evaluated. A measurement value for drain current $I_d$ is acquired at multiple times after the input voltage changes from the off-state. That measurement value corresponds to device characteristics at the time point after a lapse of given voltage application time from the input pulse rise as described in step S2. An input signal to MOSFET is equivalent to a pulse signal that is applied to the gate and rises from 0 V. There are several methods for acquiring the drain current at multiple times. One is to measure the drain current by varying the pulse width. Another is to vary timings to read a measurement value in response to input of the pulse having a specified width. Still another is to sample and read a drain current time response to pulse input using a digital oscilloscope. FIG. 9 shows an example measurement circuit.

At step S5, for example, the data processing program 11 performs extrapolation to find drain current $I_d(0)$ in the initial state t=0 from the time dependence of MOSFET drain current $I_d(t)$ measured at voltage application times t. This drain current is found at each bias point of the drain voltage and the gate voltage. Drain current $I_d(0)$ at each bias point is assumed to be free from the self-heating. An available extrapolation method uses several measurement values for $I_d(t)$ with small t. The method subtracts drain current $I_{d\_steady}$ in the steady state from $I_d(t)$ to find $I_{d\_diff}(t)$. The method applies a curve that causes the value $I_{d\_diff}(t)$ to be an exponential function in relation to the time. The method then finds $I_d(t)$ at t=0 from the value on the curve at t=0.

Specifically, several measurement values corresponding to small values for t are plotted based on the vertical axis as log $(I_d(t)-I_{d\_steady})$ and the horizontal axis as t. For example, the least-squares method sets a straight line to find intercept $I_{d\_diff}(0)$ corresponding to t=0 on the straight line. Then, drain current $I_{d\_steady}$ in the steady state is added to $I_{d\_diff}(0)$ to find $I_d(t)$ at t=0. The operation is performed under bias conditions contained in the bias range for creating the device model. At this time, the direct current voltage as a measurement object is applied to the drain voltage. A pulse voltage applied to the gate is assumed to be a gate voltage for the measurement object.

The following describes a mechanism for solving the problems and effects of the embodiment.

The following first describes the self-heating of a field-effect transistor such as MOSFET.

Figure 8:
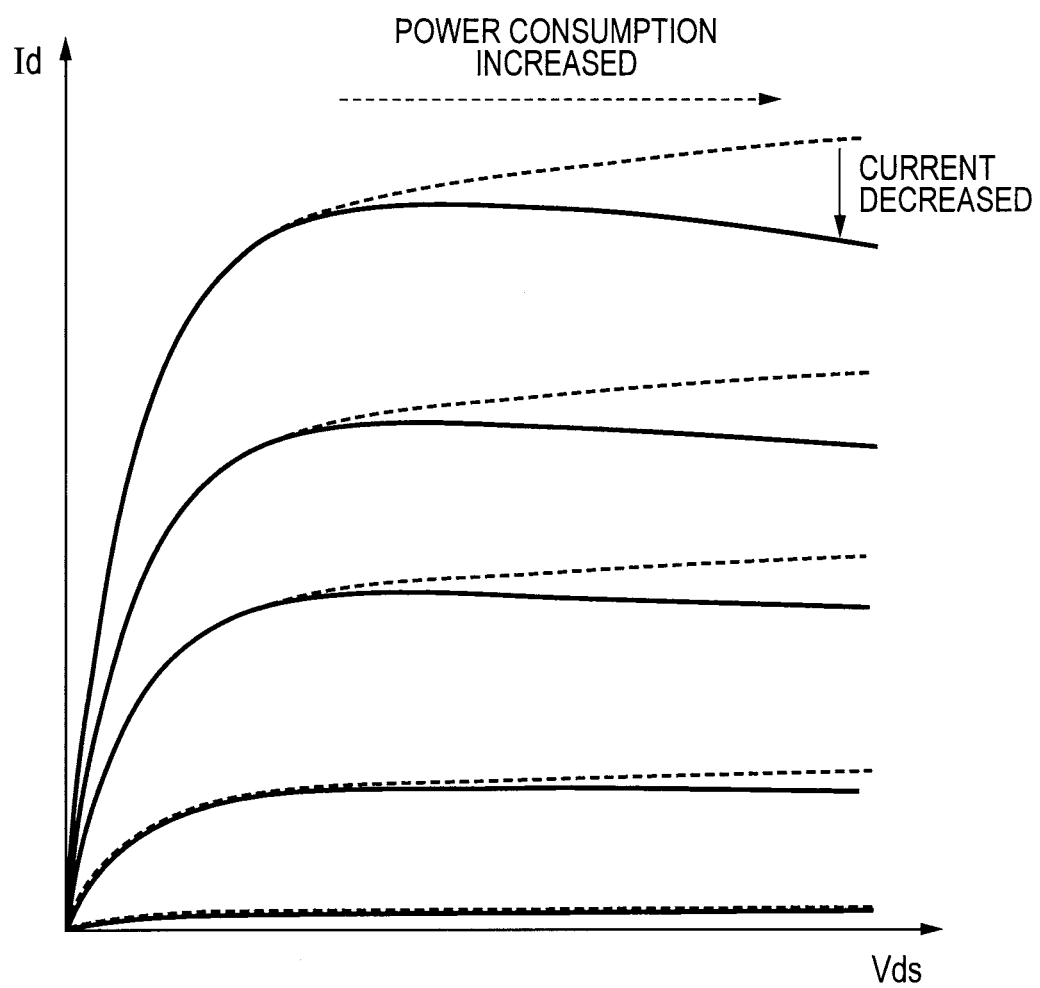
FIG. 8 illustrates the principle of the semiconductor device evaluation apparatus according to the first embodiment.

FIG. 8 illustrates $I_d$-$V_{ds}$ characteristics typical of transistors prone to large variations in characteristics due to self-heating. The broken line shows original MOSFET characteristics without self-heating. The solid line shows a current when a characteristics variation due to self-heating reaches the steady state.

The device power consumption increases if the drain voltage is high or a high gate voltage increases the drain current. The device temperature remarkably increases and the drain current greatly decreases.

A known method of using the pulse voltage measures transistor characteristics by decreasing or eliminating effects of the self-heating. FIG. 9 illustrates this method. With reference to FIG. 9, a very short pulse is applied as input voltage in order to measure device characteristics while the device temperature does not reach the steady state. This method can acquire a value approximate to the current value without self-heating.

As will be described later, however, applying the input voltage starts self-heating and the temperature drastically increases exponentially with time. It is difficult to completely eliminate the self-heating due to pulse characteristics even though the pulse width is shortened. This is true of not only a case of applying the pulse voltage to the gate voltage as described in patent document 1, but also a case of applying the pulse voltage to the drain voltage.

Figure 10:
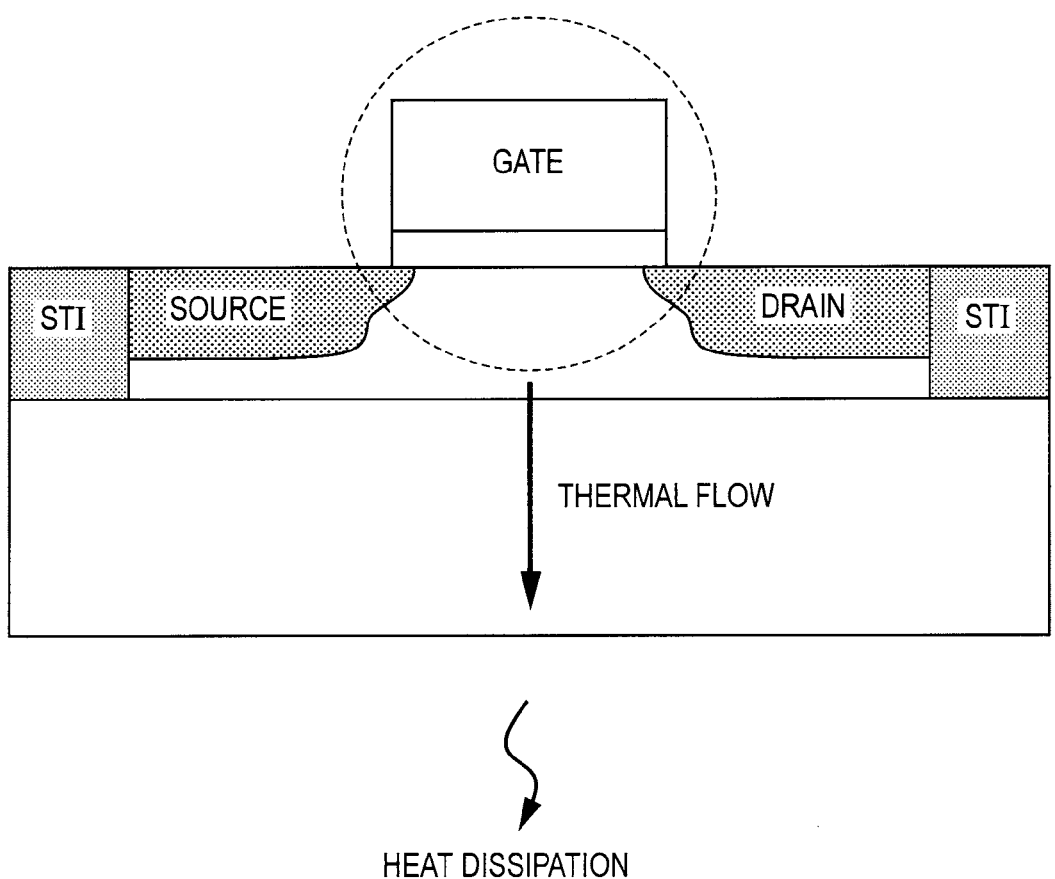
FIG. 10 illustrates operations of the semiconductor device evaluation apparatus according to the first embodiment.
Figure 11:
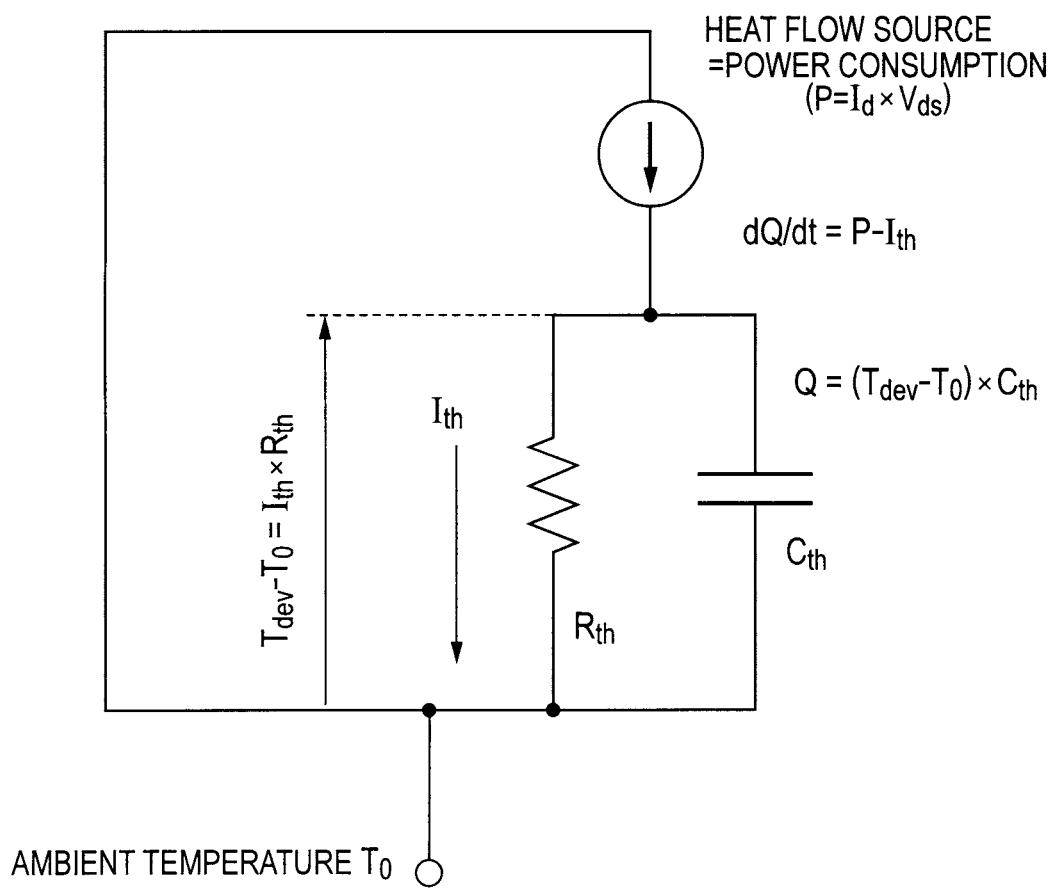
FIG. 11 illustrates operations of the semiconductor device evaluation apparatus according to the first embodiment.

The following describes a model for mathematically processing the self-heating. Power consumption in a transistor provides a heat source that causes a temperature increase in the transistor (see FIG. 10). BSIMSOI and HiSIM_HV process self-heating as shown in FIG. 11. BSIMSOI and HiSIM_HV are names of device models used for circuit simulation. In FIG. 11, $T_{dev}$ denotes the device temperature; $T_0$ denotes the ambient temperature; $I_{th}$ denotes the thermal flow; $R_{th}$ denotes the heat resistance; $C_{th}$ denotes the heat capacity; and Q denotes the heat quantity. $I_d$ denotes the drain current; $V_{ds}$ denotes the source-drain voltage; and P denotes the transistor power consumption.

The thermal circuit shown in FIG. 11 is analogous to an electric circuit according to the correspondence shown in Table 1.

TABLE 1

| Electric circuit | Thermal circuit |
| --- | --- |
| Voltage V | Temperature increase $T_{heat}$ (equivalent to $T_{dev} - T_0$ in FIG. 11) |
| Current I | Thermal flow $I_{th}$ |
| Resistance R | Heat resistance $R_{th}$ |
| Capacity C | Thermal capacity $C_{th}$ |
| Charge Q | Heat quantity Q |

With reference to the thermal circuit in FIG. 11, the following describes a method of finding initial device characteristics at the pulse application start point using extrapolation. Instead of the analysis in the frequency domain described in non-patent document 3, analysis formulae in the time domain are derived from the model in FIG. 11 as follows.

Similarly to the electric circuit, equations concerning the step response may be formulated as follows. It is supposed that a steady voltage is applied to the drain, a step input rising from the 0 V level is applied to the gate, and heating starts simultaneously with the rise of gate input. That power consumption P is assumed to rise stepwise along with step input of the gate voltage. $T_{heat}$ denotes a temperature increase in the device and is equivalent to a difference between device temperature $T_{dev}$ and ambient temperature $T_0$. Time t corresponds to the starting point for the pulse rise.

$$P = dQ/dt + T_{heat}/R_{th} = C_{th} dT_{heat}/dt + T_{heat}/R_{th} \quad (1)$$

Modifying equation (1) yields equation (1').

$$C_{th} dT_{heat}/dt + (1/R_{th}) T_{heat} = P \quad (1')$$

Solving equation (1') yields equation (2).

$$T_{heat} = C_1 \exp(-t/R_{th} C_{th}) + C_2 \quad (2)$$

Assigning t=0 and $T_{heat}=0$ to equation (2) yields equation (2a).

$$C1 = -C2 \quad (2a)$$

Assigning t=∞ and $T_{heat}=PR_{th}$ to equation (2) yields equation (2b).

$$C2 = PR_{th} \quad (2b)$$

Therefore, equation (3) is yielded.

$$T_{heat} = PR_{th}\{1 - \exp(-t/R_{th} C_{th})\} \quad (3)$$

Equation (4) defines α as the slope between drain current $I_d$ and temperature $T_{heat}$.

$$\Delta I_d / \Delta T_{heat} = \alpha \quad (4)$$

Assigning $I_{d0}$ to $I_d$ at t=0 yields equation (5).

$$I_d(t) = I_{d0} - \alpha PR_{th}\{1 - \exp(-t/R_{th} C_{th})\} \quad (5)$$

The following describes a method of estimating $I_{ds}$ at t=0 from the time dependence of actual measurement values for the drain voltage based on equation (5).

Assigning t→∞ to equation (5) finds drain current $I_{d\_steady}$ in the steady state and then yields equation (6).

$$I_{d\_steady} = I_{d0} - \alpha PR_{th} \quad (6)$$

A difference (FIG. 12) between $I_d(t)$ and steady current $I_{d\_steady}$ is assumed to be $I_{d\_diff}(t)$ and is formulated as equation (7).

$$I_{d\_diff}(t) = I_d(t) - I_{d\_steady} \quad (7)$$

Assigning equations (5) and (6) to equation (7) yields equation (8).

$$I_{d\_diff} = \alpha PR_{th} \exp(-t/R_{th} C_{th}) \quad (8)$$

Algorithms of both sides of equation (8) yield equation (9).

$$\log(I_{d\_diff}(t)) = \log(\alpha PR_{th}) - t/R_{th} C_{th} \quad (9)$$

FIG. 13 is a graph created by plotting equation (9) using the horizontal axis as t. The graph yields $I_{ds\_diff}$ at t=0 as an intercept indicated by the arrow in FIG. 13. The sum of $I_{ds\_diff}$ at t=0 and as $I_{d\_steady}$ in as $I_d$ the steady state is $I_d$ at t=0, that is, drain current $I_d$ in the state where no self-heating occurs.

In the above-mentioned considerations, power consumption P is assumed to be independent of the time. A constant is assumed for temperature coefficient α representing $\Delta I_d / \Delta T_{heat}$.

Actually, power consumption P is combined with the time dependence because the drain current varies with the time. Therefore, the model formula may contain the time dependence of power consumption P in some way. The model formula may also contain $\Delta I_d / \Delta T_{heat}$, that is, α representing the temperature dependence of the drain current. However, equations used for most basic considerations or analysis may contain power consumption P as a time-independent constant and α as a temperature-independent constant. To improve the accuracy, temperature coefficient α preferably uses a value determined at each bias point, that is, a value determined for each combination of the gate voltage and the drain voltage. However, there may be a case where the self-heating becomes remarkable at limited bias points or an extraction operation needs to be simplified. In such a case, a representative value or values determined at multiple bias points may be used for α.

Figure 14:
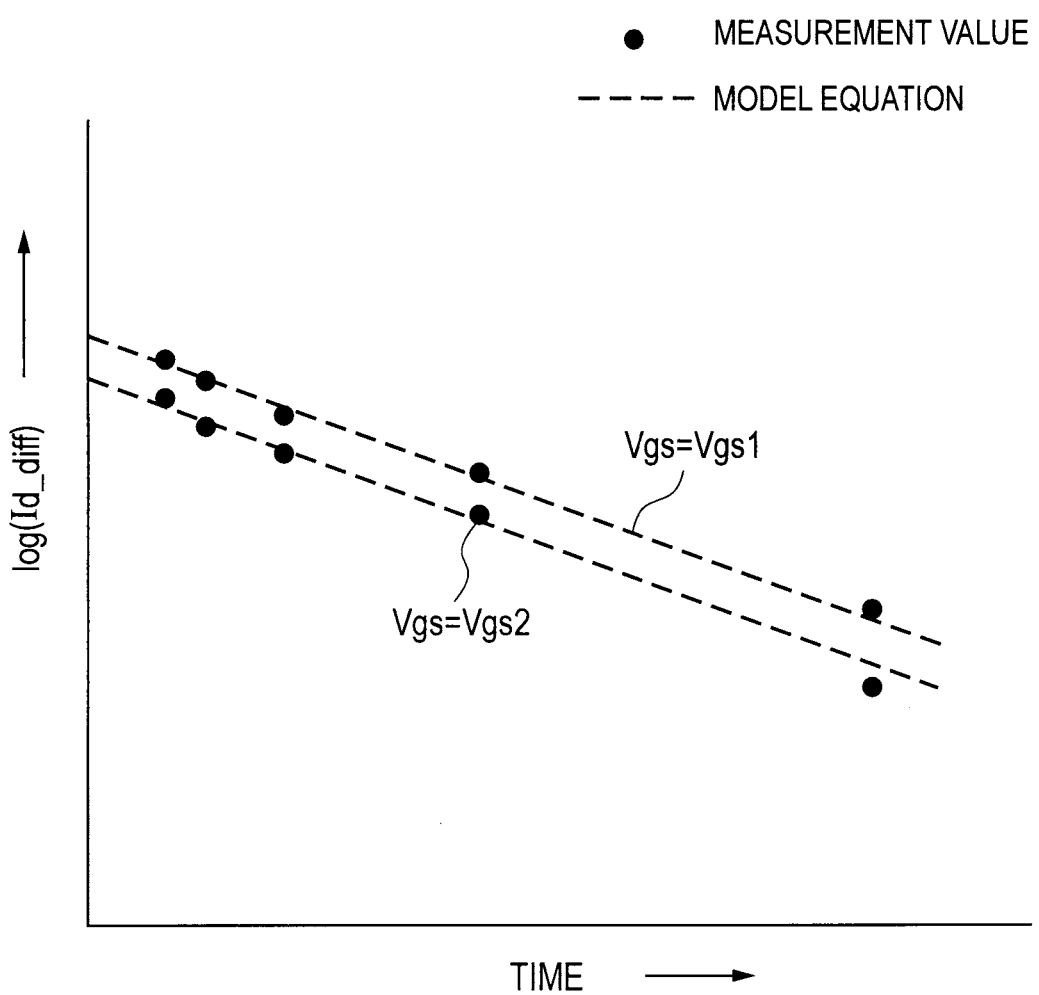
FIG. 14 illustrates validity of a model formula for the semiconductor device evaluation apparatus according to the first embodiment.

The above-mentioned simple model formulae can express time-dependent temperature changes based on approximations using power consumption P as a time-independent constant and α as a temperature-independent constant. It has been confirmed, as shown in FIG. 14, that the model formula expresses actual measurement values as a result of comparison between actual measurement values and equation (9) as a model formula found by the approximations. Therefore, it may be preferable to use the above-mentioned approximations in order to evaluate the self-heating for MOSFET. FIG. 14 shows comparison between a model formula and an actual measurement value at two gate voltages $V_{gs}1$ and $V_{gs}2$.

Similarly to FIG. 5B, the vertical axis in FIG. 13 shows linear plotting of the logarithm of $I_{d\_diff}(t)$. However, logarithmic plotting of value $I_{d\_diff}(t)$ gives the same result. Accordingly, the discussion here may suppose the vertical axis in FIG. 13 to represent logarithmic plotting of value $I_{d\_diff}(t)$. Similarly to FIGS. 5A and 5B, the horizontal axes in FIGS. 12 and 13 represent the linear plot.

FIG. 13 shows linear extrapolation using the vertical axis for logarithms. This is equivalent to extrapolation using exponential functions. According to the above-mentioned discussion, the extrapolation using exponential functions is based on physical origins and is considered accurate. However, the extrapolation may use linear functions or other functions if the extrapolation using exponential functions causes a small error such as 3%, 1%, or less.

If the extrapolation uses linear functions or other functions, all measurement points may be used to determine the extrapolation line as shown in FIG. 13. However, for example, it may be preferable to select three to five measurement points approximate to t=0 and determine an extrapolation line using the selected measurement points. Selecting a few measurement points approximate to t=0 can eliminate a slight error caused by a fact that power consumption P and a representing the temperature dependence of a drain current are not strictly constants. This will be described in detail in a fourth embodiment.

Value $I_{d\_diff}$ in FIG. 12 and equation (7) is found by subtracting $I_{d\_steady}$ from the actual measurement value for $I_d$ at each time. Value $I_{d\_steady}$ may be a result of ordinary measurement instead of the pulse measurement, e.g., a value measured through normal procedures on a measuring instrument such as a semiconductor parameter analyzer. As described in the embodiment, $I_{d\_steady}$ may represent a drain current value found when the measurement method of applying pulse voltages applies a sufficiently wide pulse and measures the drain current detected to be stable with reference to the time.

The embodiment uses the method that subtracts $I_{d\_steady}$ from the actual measurement value for $I_d$ to find $I_{d\_diff}$, uses it as a data processing object, adds it to $I_{d\_steady}$, and finds drain current $I_{d\_diff}$ at the time zero. The use of can represent the time dependence in such a simple exponential function as equation (8). The constant term is eliminated from the end of equation (5). This can facilitate estimation of extrapolation values.

The use of $I_{d\_diff}$ also facilitates elimination of inappropriate measurement points. Measurement values inappreciably vary with the time at measurement points after the steady state is almost reached. An error easily occurs if the extrapolation uses measurement points after attainment of the steady state. A difference between the measurement value and the steady state may be previously eliminated from $I_{d\_diff}$. The use of such $I_{d\_diff}$ yields small values at measurement points after attainment of the steady state. It is possible to easily identify that the steady state is reached. If $I_{d\_diff}$ reaches a specified value or more at a given measurement point, the use of such a measurement point can eliminate inappropriate measurement points.

Generally, with respect to the time dependence of a variation in the drain current, the drain current at time t is subtracted from the drain current at initial time t0 to find a value as the amount of decrease from the drain current at initial time t0. According to the embodiment, however, the drain current is unknown at initial time t0. It is impossible to directly find the amount of decrease from the drain current at initial time t0.

To address this problem, the embodiment performs analysis with reference to the steady state using value $I_{d\_diff}$ found by subtracting drain current $I_{d\_steady}$ in the steady state from the drain current at time t. As a result, excellent fitting is available as shown in FIG. 14. The principle as shown in FIG. 13 can be used to find the drain current at initial time t0.

The use of $I_{d\_diff}$ requires not only data points used for the extrapolation but also values in the steady state. A value in the steady state may be found according to ordinary DC characteristics measurement conditions. It is just necessary to use a value measured at the time point after a lapse of long enough time from application of a pulse voltage or a step voltage or at the time point where the time-dependent change becomes smaller than a specified value. Accordingly, the extrapolation using $I_{d\_diff}$ requires three measurement points, that is, at least two measurement points at two time points before attainment of the steady state after voltage application and one measurement point in the steady state.

A current other than the drain current such as a source current may be assumed to be a measurement object. In such a case, it should be noted that the current as a measurement object replaces the drain current described in the embodiment.

The embodiment describes the high-voltage MOSFET as an example. Further, the embodiment is applicable to the other MOSFETs or circuit devices that remarkably indicate self-heating.

Unlike patent document 1, the embodiment can find device characteristics in the initial state, that is, in a state in which the self-heating does not start yet. The embodiment can completely eliminate effects from the self-heating.

Unlike patent document 2, the embodiment need not predetermine heat resistance $R_{th0}$ or power index n concerning a temperature increase. The embodiment can easily and accurately provide device characteristics while eliminating effects of self-heating.

The following describes methods of extracting heat resistance $R_{th}$ and heat capacity $C_{th}$ as parameters.

Any one of or a combination of methods described below may be used to determine heat resistance $R_{th}$ as a parameter in the device model used for the circuit simulation.

A first method is based on equation (8), equation (9), or plotting in FIG. 13. The first method finds heat resistance $R_{th}$ by using the fitting process using equation (8) or (9), the derivation from the plotting intercept in FIG. 13, or an equivalent method.

Heat resistance $R_{th}$ found by the first method may depend on bias conditions used for the analysis. Originally, heat resistance $R_{th}$ depends on the device structure, not bias conditions. To solve the problem, it is just necessary to use heat resistance $R_{th}$ under typical bias conditions. It is just necessary to use an average of heat resistance $R_{th}$ or a composite value such as a weighted average found under bias conditions within a typical bias range. The typical bias conditions are assumed to be important to circuit operations, for example.

A second method uses the extrapolation method described in the embodiment to acquire current characteristics without self-heating, and then creates a device model reproducing current characteristics without self-heating. The second method compares a calculated value for the device model with current characteristics responsive to a temperature increase such as current characteristics in the steady state or the time dependence of a current value. The second method determines a value for heat resistance $R_{th}$ by adjusting the heat resistance $R_{th}$ so that the calculated value for the device model matches the current characteristics responsive to a temperature increase.

Heat resistance $R_{th}$ found by the first method may be used as an initial value. The second method may adjust the value to determine the final heat resistance $R_{th}$. That is, the first method and the second method may be combined.

Any one of or a combination of methods described below may be used to determine heat capacity $C_{th}$ as a parameter in the device model used for the circuit simulation.

A first method is based on equation (8), equation (9), or plotting in FIG. 13. The first method finds heat capacity $C_{th}$ by using the fitting process using equation (8) or (9), the derivation from the plotting slope in FIG. 13, or an equivalent method. The method finds the heat capacity using a value for the heat resistance after or simultaneously with derivation of the heat resistance.

Heat capacity $C_{th}$ found by the first method may depend on bias conditions used for the analysis. Originally, heat capacity $C_{th}$ depends on the device structure, not bias conditions. To solve the problem, it is just necessary to use heat capacity $C_{th}$ under typical bias conditions. It is just necessary to use an average of heat capacity $C_{th}$ or a composite value such as a weighted average found under bias conditions within a typical bias range. The typical bias conditions are assumed to be important to circuit operations, for example.

A second method uses the extrapolation method described in the embodiment to acquire current characteristics without self-heating, and then creates a device model reproducing current characteristics without self-heating. The second method compares the device model with the time dependence of a current value. The method determines a value for heat capacity $C_{th}$ by adjusting the heat capacity $C_{th}$ so that the calculated value for the device model matches the current characteristics responsive to a temperature increase. The method finds the heat capacity using a model provided with the heat resistance after or simultaneously with derivation of the heat resistance.

Heat capacity $C_{th}$ found by the first method may be used as an initial value. The second method may adjust the value to determine the final heat capacity $C_{th}$. That is, the first method and the second method may be combined.

There have been described two methods of finding characteristics, the heat capacity, or the heat resistance at t=0 without self-heating. One is based on the fitting process using equation (8) or (9). The other is based on plotting in FIG. 13. These methods are equivalent to each other in principle.

Second Embodiment

The semiconductor device evaluation apparatus according to the second embodiment will be described with reference to the accompanying drawings. The embodiment concerns a semiconductor device modeling apparatus that models semiconductor devices.

Semiconductor device parameters are contained in device models such as BSIM and BSIMSOI used for circuit simulators such as SPICE. A model formula for semiconductor devices uses predetermined semiconductor device parameters so as to reproduce device characteristics. Determining a semiconductor device parameter is referred to as semiconductor device modeling.

The semiconductor device modeling apparatus generates semiconductor device parameters. For example, the semiconductor device modeling apparatus uses a device characteristics measurement result and configures semiconductor device parameters so that semiconductor device model formulae can reproduce the device characteristics measurement result. The semiconductor device modeling apparatus may configure parameters using targeted values or estimated values instead of measurement results. However, the embodiment uses measurement results.

According to the embodiment, the semiconductor device evaluation apparatus signifies the entirety including the semiconductor device modeling apparatus and measuring instruments closely related to the semiconductor device modeling apparatus.

According to the embodiment, the semiconductor device modeling apparatus particularly signifies a constituent element that determines numeric values of semiconductor device parameters. A semiconductor device modeling program includes programs that are installed in the semiconductor device modeling apparatus and are used for semiconductor device modeling. In particular, a semiconductor device parameter extraction program belongs to the programs included in the semiconductor device modeling program and is closely related to determination of numeric values for semiconductor device parameters.

Figure 15:
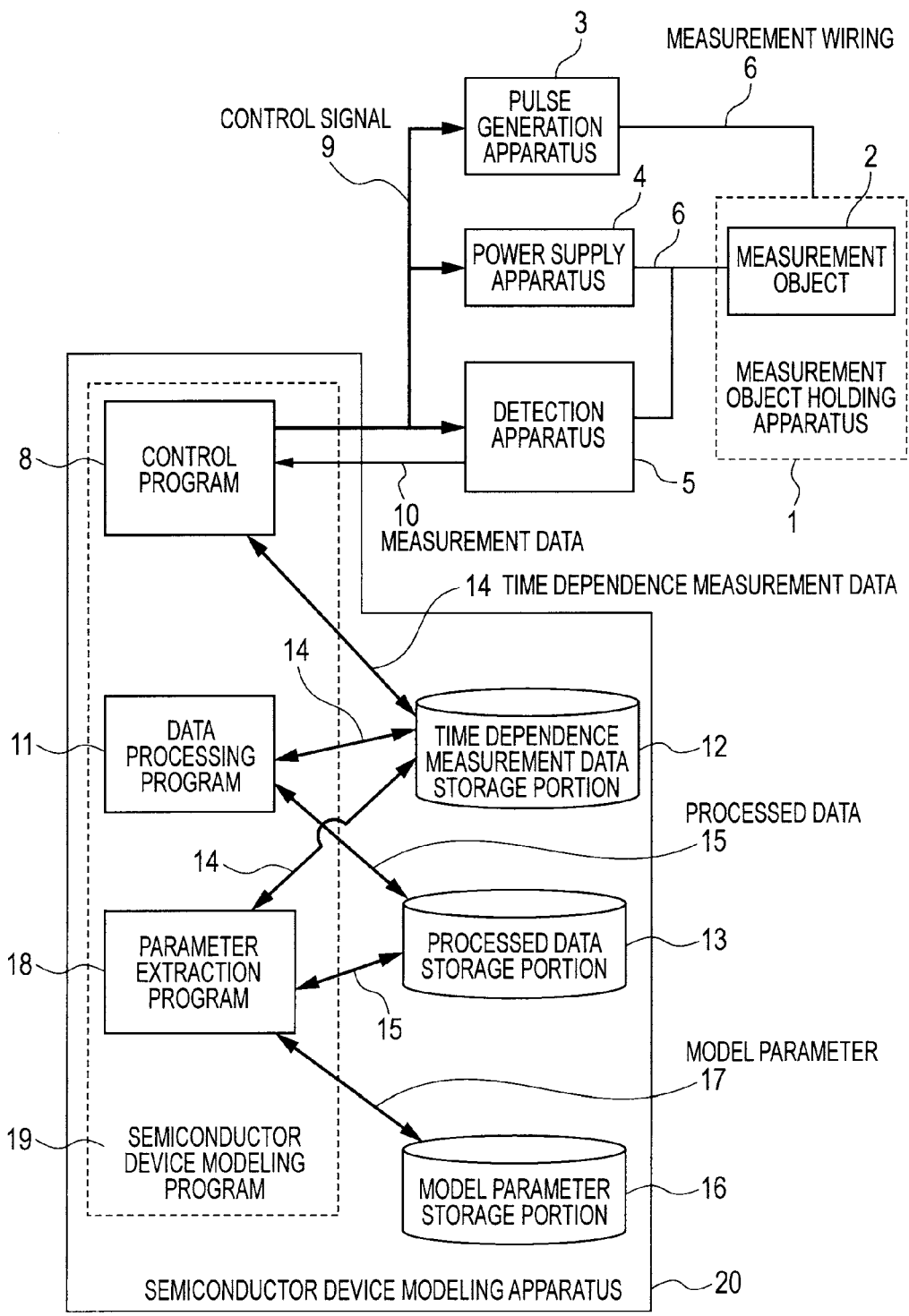
FIG. 15 is a block diagram illustrating the configuration of a semiconductor device evaluation apparatus according to a second embodiment.

FIG. 15 is a block diagram illustrating the configuration of the semiconductor device evaluation apparatus according to the embodiment. The semiconductor device evaluation apparatus is integrated with the controller 7 of the semiconductor device evaluation apparatus according to the first embodiment and additionally provides the function of extracting model parameter 17 using the processed data 15 described in the first embodiment. The second embodiment measures device characteristics and extracts model parameters seamlessly.

Duplicate constituent elements are included in the semiconductor device evaluation apparatuses shown in FIGS. 15 and 4 and are provided with the same functions and configurations. Modifications of the constituent elements or the functions according to the first embodiment are also applicable to the second embodiment. Duplicate constituent elements included in the semiconductor device evaluation apparatuses shown in FIGS. 15 and 4 are: the measurement object holding apparatus 1, the measurement object 2, the pulse generation apparatus 3, the power supply apparatus 4, the detection apparatus 5, the measurement wiring 6, the control program 8, the control signal 9, the measurement data 10, the data processing program 11, the time dependence measurement data storage portion 12, the processed data storage portion 13, the time dependence measurement data 14, and the processed data 15.

The semiconductor device modeling apparatus 20 includes the configuration, the function, and their modifications of the controller according to the first embodiment. A semiconductor device modeling program 19 includes the configurations, the functions, and their modifications of the control program 8 and the data processing program 11 according to the first embodiment. The parameter extraction program 18 and the model parameter storage portion 16 described in FIG. 4 have the same functions as those of the parameter extraction program 18 and the model parameter storage portion 16 included in the semiconductor device evaluation apparatus shown in FIG. 15 except whether the measurement function and the modeling function are integrated. The model parameters 17 in FIGS. 4 and 15 have the same function and configuration.

The following describes the semiconductor device evaluation apparatus shown in FIG. 15. With reference to FIG. 15, the semiconductor device evaluation apparatus includes the semiconductor device modeling apparatus 20, measuring instruments such as the pulse generation apparatus 3, the power supply apparatus 4, and the detection apparatus 5 controlled by the semiconductor device modeling apparatus 20, and the measurement object holding apparatus 1.

The semiconductor device modeling apparatus 20 controls the measuring instruments to acquire the time dependence measurement data 14 about semiconductor device characteristics, processes data related to self-heating, and generates the processed data 15 as device characteristics free from effects of the self-heating. The semiconductor device modeling apparatus 20 uses the measurement data 12 and the processed data 15 to generate the model parameter 17.

The semiconductor device modeling apparatus 20 includes the control program 8, the data processing program 11, the parameter extraction program 18, the time dependence measurement data storage portion 12, the processed data storage portion 13, the model parameter storage portion 16, hardware needed for programs and data storage areas to function, and hardware needed to communicate the control signal 9 and the measurement data 10. The semiconductor device modeling apparatus 20 may be embodied as a personal computer equipped with the programs and the communication function or as dedicated hardware, for example.

The semiconductor device modeling program 19 includes the control program 8, the data processing program 11, and the parameter extraction program 18 as constituent elements. The semiconductor device modeling program 19 controls the measurement instruments to acquire the time dependence measurement data 14 about semiconductor device characteristics, processes data related to self-heating, and generates the processed data 15 as device characteristics free from effects of the self-heating. The semiconductor device modeling program 19 uses the time dependence measurement data 14 and the processed data 15 to generate the model parameter 17. The semiconductor device modeling program 19 reads or writes the time dependence measurement data 14, the processed data 15, and the model parameter 17 to the time dependence measurement data storage portion 12, the processed data storage portion 13, and the model parameter storage portion 16, respectively.

The semiconductor device modeling program 19 may manage the time dependence measurement data storage portion 12, the processed data storage portion 13, and the model parameter storage portion 16 as external files for the semiconductor device modeling program 19 or as variables such as array variables under control or the semiconductor device modeling program 19.

The time dependence measurement data storage portion 12, the processed data storage portion 13, and the model parameter storage portion 16 provide areas for storing time dependence measurement data 14, the processed data 15, and the model parameter 17, respectively. These portions are provided in a storage unit such as a hard disk or main memory. From the viewpoint of program processing, the time dependence measurement data storage portion 12, the processed data storage portion 13, and the model parameter storage portion 16 may be provided as external files in a storage unit such as a hard disk or main memory. Alternatively, the portions may be assumed to be program-controlled data areas such as arrays and may be provided in a storage unit such as a hard disk or main memory.

The following describes a method of generating the model parameter 17 using the parameter extraction program 18. FIG. 18 illustrates dependence relation between models and data according to the invention.

The parameter extraction program 18 reads the processed data 15 as device characteristics without self-heating from the processed data storage portion 13. The parameter extraction program 18 then extracts the model parameter 17 for reproducing the processed data 15 and stores the model parameter 17 in the model parameter storage portion 16. The model parameter 17 for reproducing the processed data 15 is assumed to be the initial state model parameter 31. Extraction of the model parameter 17 may use an automatic extraction procedure similar to an ordinary parameter extraction program for the processed data 15. The extraction may also use a procedure of generating parameters based on operator-specified operations such that an operator sets a parameter value or specifies a method of extracting parameter values as needed.

The parameter extraction program 18 reads the time dependence measurement data 14 from the time dependence measurement data storage portion 12 while the time dependence measurement data 14 corresponds to device characteristics found at the time the self-heating reaches a steady state. The parameter extraction program 18 reads the initial state model parameter 31 from the model parameter storage portion 16 while the initial state model parameter 31 is equivalent to the model parameter 17 configured to reproduce the processed data 15. The parameter extraction program 18 assumes the time dependence measurement data 14 to be the steady state characteristic data 32 while the time dependence measurement data 14 represents device characteristics found at the time the self-heating reaches the steady state. The parameter extraction program 18 determines a heat resistance parameter value so as to reproduce the steady state characteristic data 32 from the device characteristics acquired from the device simulation including self-heating using the initial state model parameter 31 supplied with the heat resistance parameter. The parameter extraction program 18 generates the model parameter 17 by appending the heat resistance parameter value to the initial state model parameter and stores the model parameter 17 in the model parameter storage portion 16. In this case, the model parameter 17 is assumed to be the model parameter with heat resistance 33.

The above-mentioned description refers to determining a heat resistance parameter value so as to reproduce the steady state characteristic data 32. This signifies that a fitting error against the steady state characteristic data 32 belongs to an allowable range. In other words, this signifies that an error between characteristics in the steady state and the steady state characteristic data 32 belongs to a range of targeted values under a targeted fitting condition (bias condition or temperature condition). Typically, adding a heat resistance parameter to the initial state model parameter 31 generates a device mode that reproduces the characteristics in the steady state.

The parameter extraction program 18 generates a heat capacity parameter using the time dependence measurement data 14 and the model parameter with heat resistance 33 generated as described above. The parameter extraction program 18 determines a value of the heat capacity parameter so as to decrease an error between two types of time dependence as follows. One concerns device characteristics such as a drain current that is acquired by appending the heat capacity parameter to the model parameter with heat resistance 33. The other concerns device characteristics contained in the time dependence measurement data 14. The determined heat capacity parameter is added to the model parameter with heat resistance 33. The model parameter 17 including the model parameter with heat resistance 33 is assumed to be the self-heating-compliant model parameter 34. The self-heating-compliant model parameter 34 is recorded in the model parameter storage portion 16. The self-heating-compliant model parameter 34 stored in the model parameter storage portion 16 is output outside the controller 7 through a communication network such as Ethernet, an auxiliary storage unit including nonvolatile memory such as USB memory, and a storage medium such as CD-ROM. The processed data 15 is used to generate model parameters for the semiconductor device, analyze self-heating of the semiconductor device, or analyze the other device characteristics. The heat capacity analysis or the heat capacity parameter extraction preferably acquires measurement data about more types of elapsed time than acquisition of the processed data as characteristics without self-heating. On the other hand, it is only necessary to analyze the heat capacity or extract the heat capacity parameter at one or a few representative bias points. A wide bias range of data need not be acquired.

Figure 16:
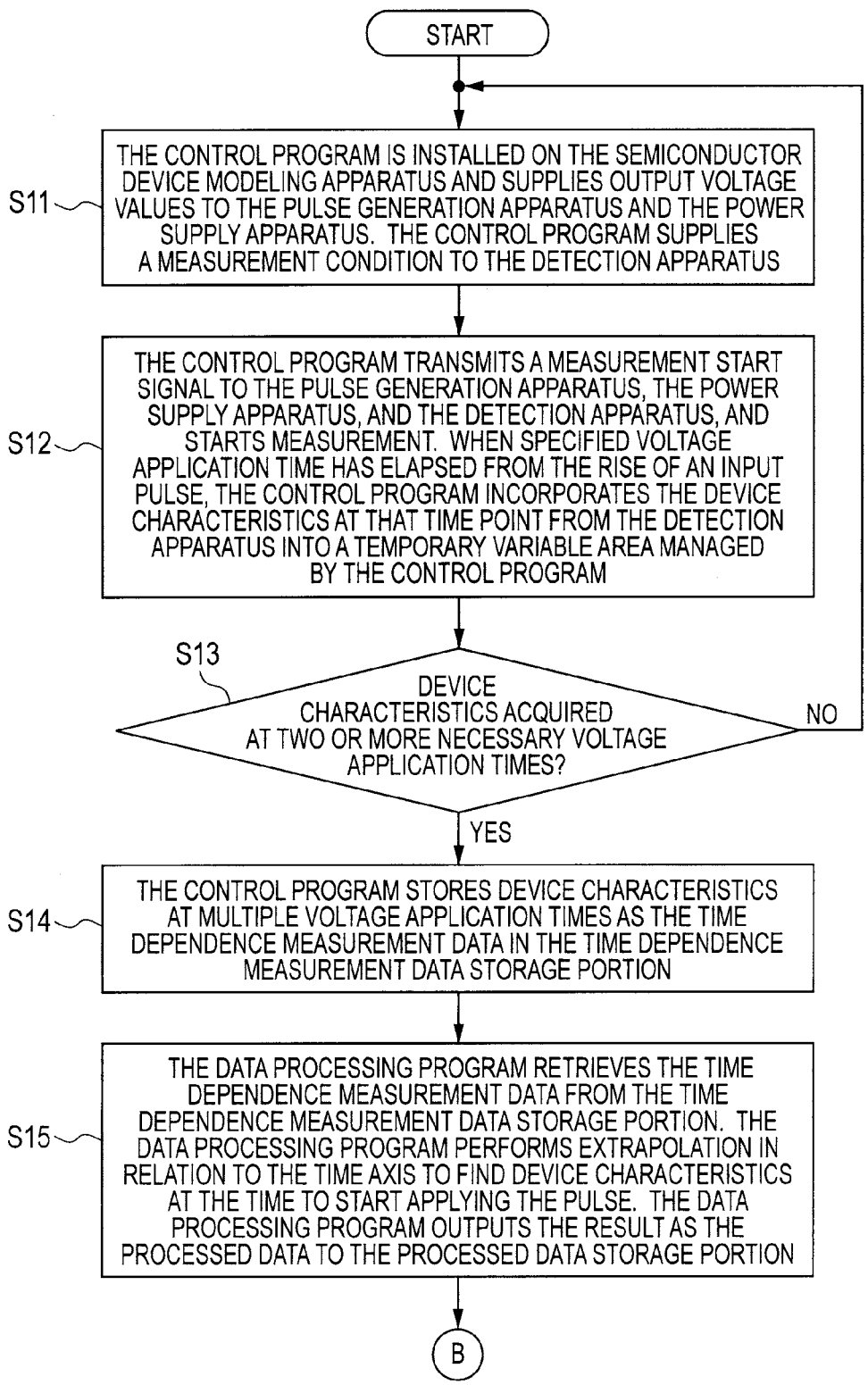
FIG. 16 is a flowchart illustrating operations of the semiconductor device evaluation apparatus according to the second embodiment.
Figure 17:
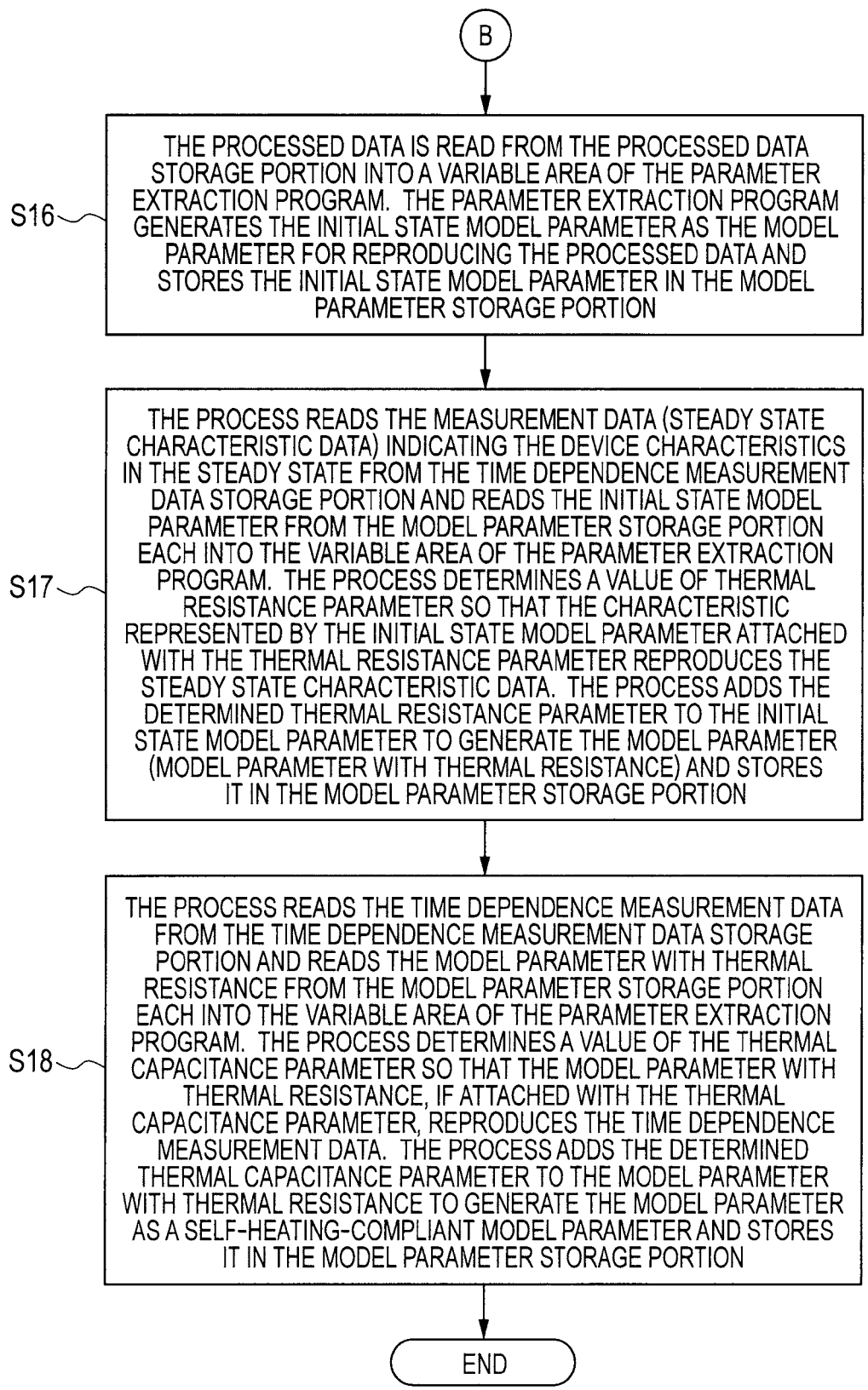
FIG. 17 is a flowchart illustrating operations of the semiconductor device evaluation apparatus according to the second embodiment.

The following describes a process flow in the software with reference to FIGS. 16 and 17. Symbol B in FIG. 16 continues on symbol B in FIG. 17. Therefore, step S15 in FIG. 16 is followed by step S16 in FIG. 17. The process flow will be described with reference to FIGS. 16 and 17.

Steps S11 through S15 in FIG. 16 equal steps S1 through S5 in FIG. 6 except that the controller 7 as a constituent element in FIG. 6 is equivalent to the semiconductor device modeling apparatus 20 in FIG. 16. Accordingly, the following only summarizes steps S11 through S15.

The control program 8 is installed on the semiconductor device modeling apparatus 20 and supplies output voltage values to the pulse generation apparatus 3 and the power supply apparatus 4. The control program 8 supplies a measurement condition to the detection apparatus 5 (step S11).

The control program 8 transmits a measurement start signal to the pulse generation apparatus 3, the power supply apparatus 4, and the detection apparatus 5, and starts measurement. When specified voltage application time has elapsed from the rise of an input pulse, the control program 8 incorporates the device characteristics at that time point from the detection apparatus 5 into a temporary variable area managed by the control program 8 (step S12).

The process determines whether the device characteristics have been acquired at two or more necessary characteristics measurement points (step S13). The process proceeds to step S14 if the characteristics have been acquired (Yes at step S13). The process returns to step S11 if the device characteristics have not been acquired at two or more necessary characteristics measurement points (No at step S13). The process configures necessary settings of the pulse generation apparatus 3, the power supply apparatus 4, and the detection apparatus 5 in order to acquire unfound device characteristics and repeats the measurement.

The control program 8 stores device characteristics at multiple voltage application times as the time dependence measurement data 14 in the time dependence measurement data storage portion 12 (step S14).

Step S12 or S13 may sequentially store part of the time dependence measurement data 14 in the time dependence measurement data storage portion 12.

The data processing program 11 retrieves the time dependence measurement data 14 from the time dependence measurement data storage portion 12. The data processing program 11 performs extrapolation in relation to the time axis to find device characteristics at the time to start applying the pulse. The data processing program 11 outputs the result as the processed data 15 to the processed data storage portion 13 (step S15).

The processed data 15 is read from the processed data storage portion 13 into a variable area of the parameter extraction program 18. The parameter extraction program 18 generates the initial state model parameter 31 as the model parameter 17 for reproducing the processed data 15 and stores the initial state model parameter 31 in the model parameter storage portion 16 (step S16).

The process reads the measurement data (steady state characteristic data 32) indicating the device characteristics in the steady state from the time dependence measurement data storage portion 12 and reads the initial state model parameter 31 from the model parameter storage portion 16 each into the variable area of the parameter extraction program 18. The process determines a value of heat resistance parameter so that the characteristic represented by the initial state model parameter 31 attached with the heat resistance parameter reproduces the steady state characteristic data 32. The process adds the determined heat resistance parameter to the initial state model parameter 31 to generate the model parameter 17 (model parameter with heat resistance 33) and stores it in the model parameter storage portion 16 (step S17).

The process reads the time dependence measurement data 14 from the time dependence measurement data storage portion 12 and reads the model parameter with heat resistance 33 from the model parameter storage portion 16 each into the variable area of the parameter extraction program 18. The process determines a value of the heat capacity parameter so that the model parameter with heat resistance 33, if attached with the heat capacity parameter, reproduces the time dependence measurement data 14. The process adds the determined heat capacity parameter to the model parameter with heat resistance 33 to generate the model parameter 17 as a self-heating-compliant model parameter 24 and stores it in the model parameter storage portion 16 (step S18).

Step S17 may be replaced by step S17A described below. At step S17A, the process may generate the heat resistance parameter as an initial value. At step S17A, the process may adjust the heat resistance parameter.

The process retrieves the time dependence measurement data 14 from the time dependence measurement data storage portion 12 and reads it into the variable area of the parameter extraction program 18. The parameter extraction program 18 performs a fitting process using equations or an equivalent process on the time dependence measurement data 14 to determine a value for the heat resistance parameter. The parameter extraction program 18 adds the determined heat resistance parameter to the initial state model parameter 31 to generate the model parameter 17 (model parameter with heat resistance 33) and stores it in the model parameter storage portion 16 (step S17A).

Step S18 may be changed to step S18A described below. Step S18A generates a heat capacity parameter. This parameter may be used as an initial value to adjust the heat capacity parameter at step S18. Further, steps S17A and S18A may be performed simultaneously.

The process reads the time dependence measurement data 14 from the time dependence measurement data storage portion 12 and reads the model parameter with heat resistance 33 from the model parameter storage portion 16 each into the variable area of the parameter extraction program 18. The parameter extraction program 18 performs fitting based on equations or an equivalent process on the time dependence measurement data 14 to determine the heat capacity parameter value. The parameter extraction program 18 adds the determined heat capacity parameter to the model parameter with heat resistance 33 to generate the model parameter 17 and stores it as the self-heating-compliant model parameter 34 in the model parameter storage portion 16 (step S18A).

The newly added read operation may be omissible if data to be read by the parameter extraction program 18 is already placed in the variable area of the parameter extraction program 18. The operation of reading the initial state model parameter 31 at step S17 may be omissible if steps S16 and S17 are performed successively. On the other hand, steps S16 and S17 might not be performed successively. For example, the parameter extraction program 18 is once terminated after step S16. On another day, the parameter extraction program 18 is executed to perform step S17. In such a case, the operation of reading the initial state model parameter 31 at step S17 cannot be omitted.

At steps S16 through S18, the time dependence measurement data 14 might be preferably added in terms of the accuracy because intended model accuracy is unavailable or the fitting process causes a larger error than specified, for example. In such a case, the process may return to step S11 and add measurement of the time dependence measurement data 14 at unmeasured time t.

As a more specific example, the following describes a case of extracting a model parameter for the field effect transistor (MOSFET). The process uses a drain current as major device characteristics needed to generate a model. At step S16, the process generates the initial state model parameter 31 capable of reproducing bias voltage dependence of a gate voltage or a drain voltage based on the drain current of the MOSFET without self-heating. In addition, the process stores the initial state model parameter 31 in the model parameter storage portion 16.

At step S17, the process determines heat resistance parameter $R_{th}$ so as to be able to reproduce drain current $I_d$ if heat resistance parameter $R_{th}$ is added to the initial state model parameter 31. The process adds the initial state model parameter 31 to the initial state model parameter 31 to generate the model parameter with heat resistance 33 and stores it in the model parameter storage portion 16.

At step S18, the process adds the heat capacity parameter to the model parameter with heat resistance 33 and determines a value for the heat capacity parameter so as to be able to reproduce time dependence measurement data specific to the device acquired from measurement values at multiple times. The process appends the heat capacity parameter having the determined value to the model parameter with heat resistance 33 to generate the self-heating-compliant model parameter 34 and stores it in the model parameter storage portion 16.

The embodiment is applicable to measurement of semiconductor devices other than MOSFET such as bipolar transistors and IGBT. In this case, it is just necessary to apply the direct current voltage and the pulse voltage to an electrode appropriate for the measurement.

Steps S14 and S15 are unnecessary only for a device model that eliminates effects of self-heating. Instead of the drain current, for example, the source current may be used as an objet for the similar measurement and evaluation.

Third Embodiment

The semiconductor device evaluation apparatus according to the third embodiment will be described with reference to the accompanying drawings. Configurations and operations of the semiconductor device evaluation apparatus according to the third embodiment are equal to those of the semiconductor device evaluation apparatus according to the first or second embodiment. A steady voltage is applied to drain electrode D and a pulse voltage is applied to gate electrode G of MOSFET in the circuit of FIG. 9. The drain current is measured at given time t after the pulse voltage rises. A drain current value is acquired at multiple times t after the pulse voltage rise to find the time dependence of the drain current after the pulse input.

The time dependence of the drain current may be acquired as follows. A pulse voltage having a single pulse width may be applied to acquire measurement values at multiple times t. A pulse voltage having multiple pulse widths may be applied to acquire measurement values at one or more multiple times t corresponding to each pulse. A step input voltage instead of a pulse voltage may be applied to acquire drain current values at multiple times t.

The measurement is performed under bias conditions for the normal $I_d$-$V_d$ characteristics measurement. For example, a drain voltage applied to the drain is varied from the vicinity of 0 V to voltage $V_{gs}$ as measurement object. A pulse voltage applied to the gate is varied from the vicinity of 0 V to voltage $V_{gs}$ as measurement object. The pulse measurement is repeated while the pulse voltage is applied. For example, an initial voltage of 0 V is assumed before the rise of a pulse to be applied to the gate.

The transistor turns off before the pulse rise and no self-heating occurs if the initial voltage is set to 0 V before the rise of the pulse to be applied to the gate. It is preferable to assume the state of no self-heating to be an initial value in order to improve the accuracy of the self-heating analysis method according to the embodiment. There may be a case where the transistor does not turn off at 0 V but turns off at a lower gate voltage depending on transistor characteristics. In such a case, it is just necessary to use the gate voltage for turning off the transistor as the initial voltage before the pulse rise. If the transistor turns off at the gate voltage of 0 V or higher, it is just necessary to use the gate voltage of 0 V or higher for turning off the transistor as the initial voltage before the pulse rise. If a pulse is applied to the drain electrode, the initial voltage before the pulse rise is preferably set to low enough for the transistor to ignore self-heating.

The above-mentioned method may be used to acquire characteristics values at multiple times t while measuring the time dependence of device characteristics such as currents other than the drain current or measuring characteristics of semiconductor devices other than the field effect transistor. In such a case, it is just necessary to replace the name of an electrode for applying the voltage, the bias condition of the applied pulse voltage, or characteristics of the measurement object with appropriate equivalents.

The method according to the invention determines $I_{d\_diff}$ at t=0 by performing the extrapolation using the exponential function of equation (8) for the drain current data at 50 nsec, 100 nsec, and 150 nsec after the pulse rise. The method uses the sum of $I_{d\_diff}$ at t=0 and $I_{d\_steady}$ as $I_d$ in the steady state to find $I_d$ at t=0 that corresponds to drain current Id in the state of no self-heating and is equivalent to the processed data 15. Solid lines in FIG. 19 represent drain current values that are found in this manner.

The extrapolation is performed on $I_{d\_diff}$ found by subtracting $I_{d\_steady}$ as $I_d$ in the steady state from $I_d$ at each time. The method assumes the sum of an extrapolation value for $I_{d\_diff}$ at t=0 and $I_{d\_steady}$ to be $I_d$ at t=0 in the state of no self-heating. The method assumes $I_{d\_steady}$ to be an average of $I_d$ at elapsed times of 3 μsec, 10 μsec, and 30 μsec from the pulse rise. This is based on the measurement result that Id values become almost stable approximately after 3 μsec from the pulse rise under the condition of $V_{ds}=V_{gd}=V_{DD}$.

Figure 19:
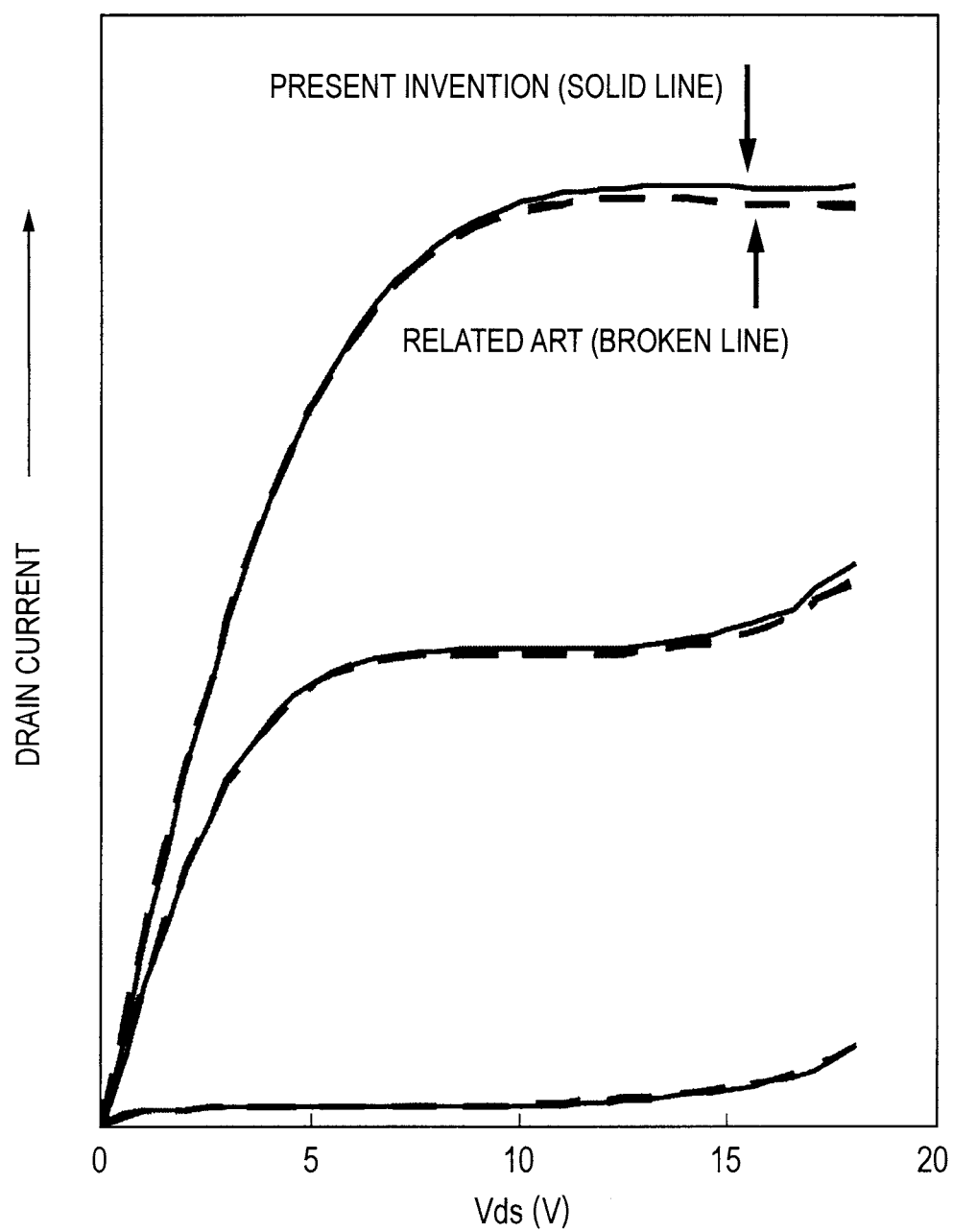
FIG. 19 illustrates an effect of the semiconductor device evaluation apparatus according to the second embodiment.

The solid line in FIG. 19 represents the processed data 15, that is, the drain current value at t=0 estimated by the method according to the invention. The broken line in FIG. 19 represents an $I_d$ measurement result found by the pulse measurement (FIG. 5 in patent document 1) described in patent document 1 that applies a pulse having the 100 nsec pulse width.

According to the method described in patent document 1, the $I_d$-$V_{ds}$ characteristic slopes downward where $V_{gs}$ and $V_{ds}$ are large. That is, the self-heating remains even though a very short pulse is used. On the other hand, the drain current value at t=0 estimated by the method according to the invention does not slope the $I_d$-$V_{ds}$ characteristic downward where $V_{gs}$ and $V_{ds}$ are large. The drain current does not degrade due to self-heating unlike the measurement using the 100 nsec pulse width. FIG. 19 plots drain current $I_d$ and drain voltage $V_{ds}$ based on three variations of gate voltage.

Performing the parameter fitting process on the processed data 15 indicated by the solid line in FIG. 19 can generate a transistor model targeted on characteristics without self-heating.

The method according to the invention can generate a device model using such models as BSIMSOI and HiSIM_HV capable of simulating the thermal circuit as shown in FIG. 11 in consideration of self-heating. In this case, the method generates a device model with the heat resistance set to zero so as to reproduce the characteristics without self-heating. The method then adds heat resistance $R_{th}$ and heat capacity $C_{th}$ to the device model.

The method can generate a device model using such models as BSIM4.5 incompatible with self-heating while placing importance on states without self-heating. In this case, it is just necessary to use the characteristics without self-heating and generate a model that reproduces such characteristics.

The following describes a fitting process for heat resistance $R_{th}$ described in FIG. 11. The model calculates characteristics without self-heating if heat resistance parameter $R_{th}$ ($R_{th0}$ as parameter name in BSIMSOI) is set to zero. Parameter $R_{th0}$ is temporarily set to 0. The parameter fitting is then performed on an extrapolation value acquired in the invention for the drain current at t=0, that is, an actual measurement value devoid of effects from the self-heating. Any of the above-mentioned methods is used to predetermine a temperature dependence parameter. Then, heat resistance parameter $R_{th}$ is determined so as to reproduce the drain current in the steady state (as a result of DC measurement or characteristics at the time point after a lapse of long time from the pulse rise). Extraction of heat resistance parameter $R_{th}$ according to this method needs to use BSIMSOI or HiSIM_HV as a device model compliant with the heat resistance parameter.

Figure 20:
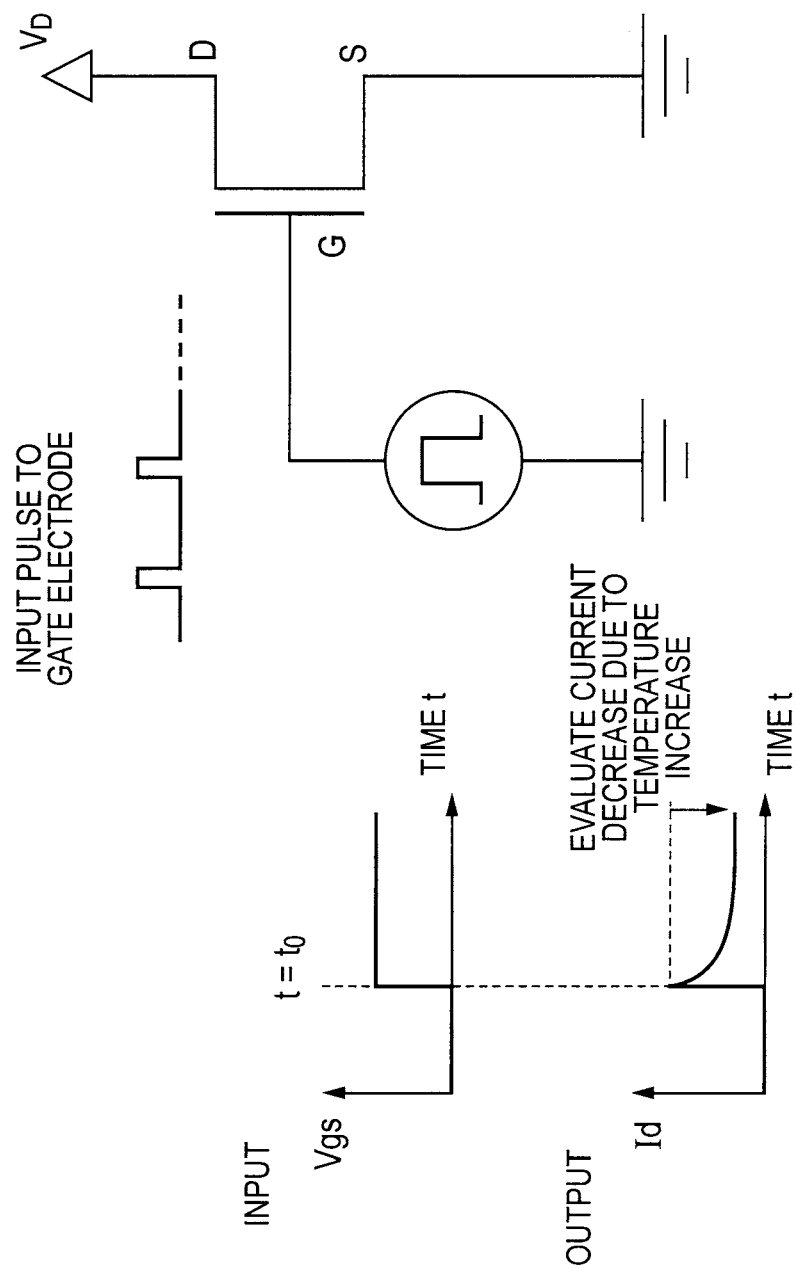
FIG. 20 illustrates circuit simulation in a semiconductor device evaluation apparatus according to a third embodiment.
Figure 21:
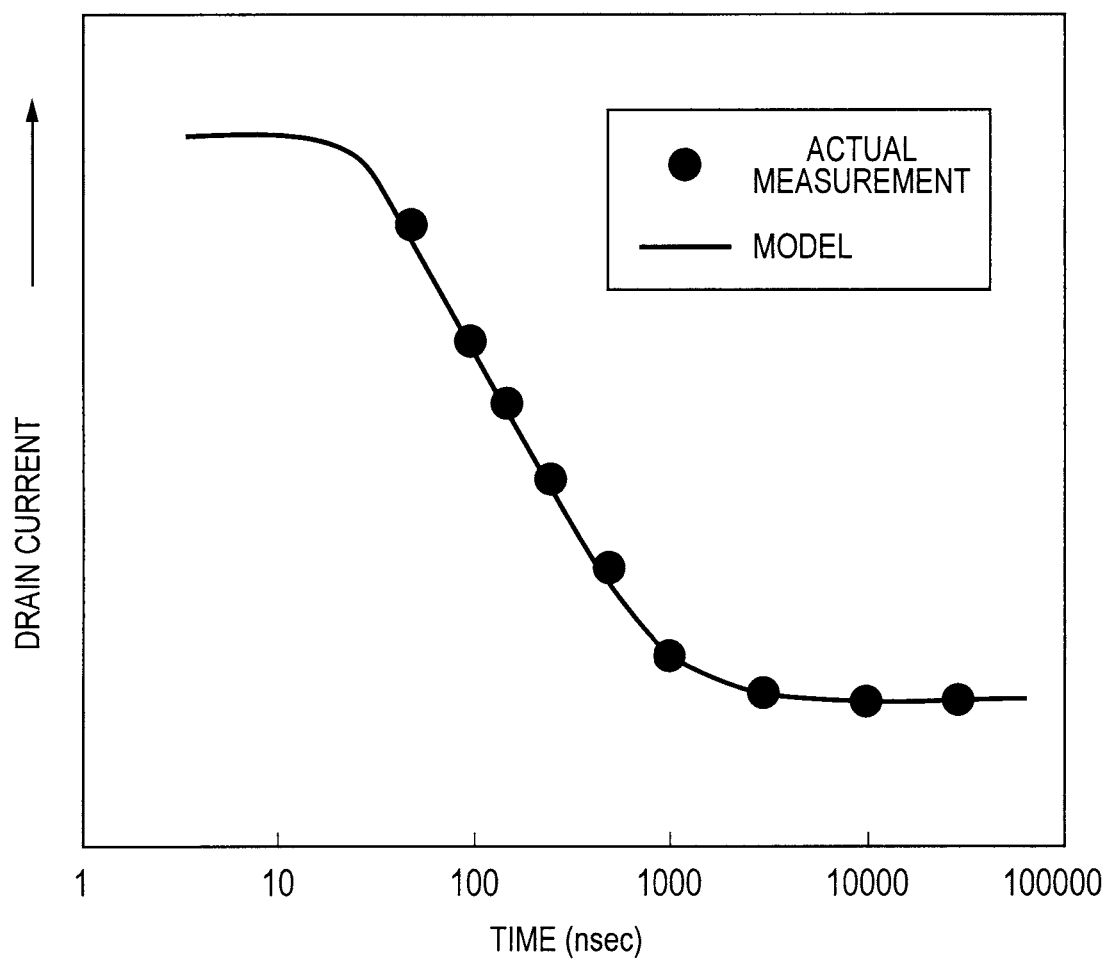
FIG. 21 illustrates operations of the semiconductor device evaluation apparatus according to the third embodiment.

The following describes a fitting process for heat capacity $C_{th}$ described in FIG. 11. The preceding steps include extraction of the normal DC parameter, the temperature dependence parameter, and heat resistance parameter $R_{th}$. After that, the result of simulating the circuit in FIG. 20 is fit to results of device characteristics measurement acquired at multiple times after the input voltage is changed from the initial state as shown in FIG. 21. This determines heat capacity parameter $C_{th}$. Extraction of heat capacity parameter $C_{th}$ according to this method needs to use BSIMSOI or HiSIM_HV as a device model compliant with the heat capacity parameter.

Heat resistance $R_{th}$ and heat capacity $C_{th}$ may be directly found from the time dependence in results of measuring device characteristics acquired at multiple times after the input voltage is changed from the initial state. For example, heat resistance $R_{th}$ may be found from the intercept in FIG. 13 that plots equation (9). Heat capacity $C_{th}$ may be found from the plotting slope and $R_{th}$ found from the intercept.

The mechanism for solving the problems and effects of the third embodiment are equal to those of the first and second embodiments Fourth Embodiment The semiconductor device evaluation method according to the fourth embodiment will be described with reference to the accompanying drawings. The fourth embodiment adds a procedure for improving the accuracy to the first through third embodiments. The fourth embodiment may be combined with any of the first through third embodiments.

Figure 22A:
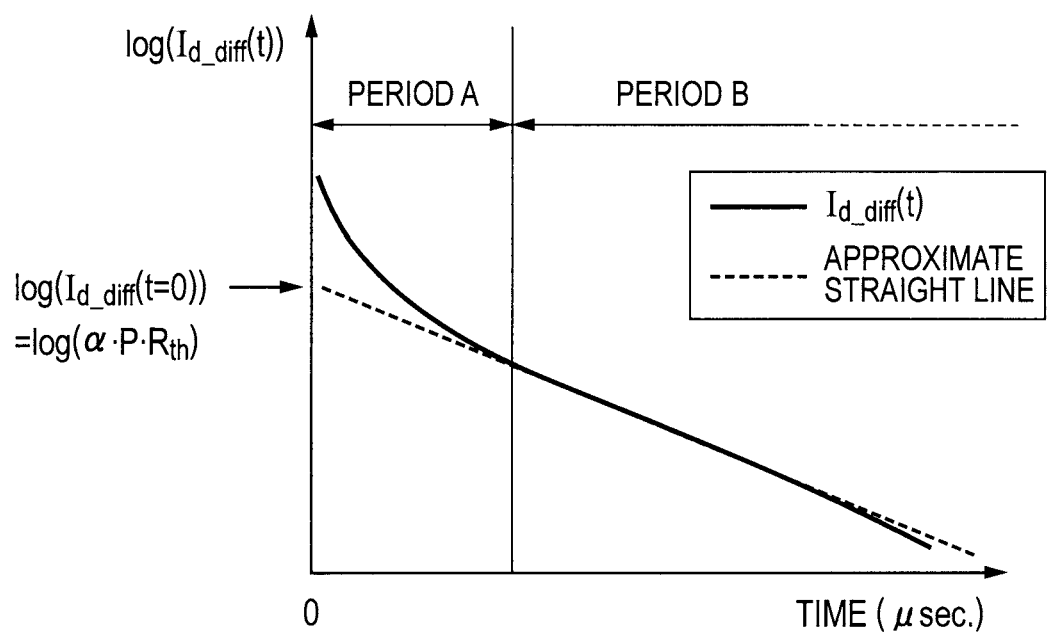
FIGS. 22A and 22B illustrate data processing on a semiconductor device evaluation apparatus according to a fourth embodiment.
Figure 22B:
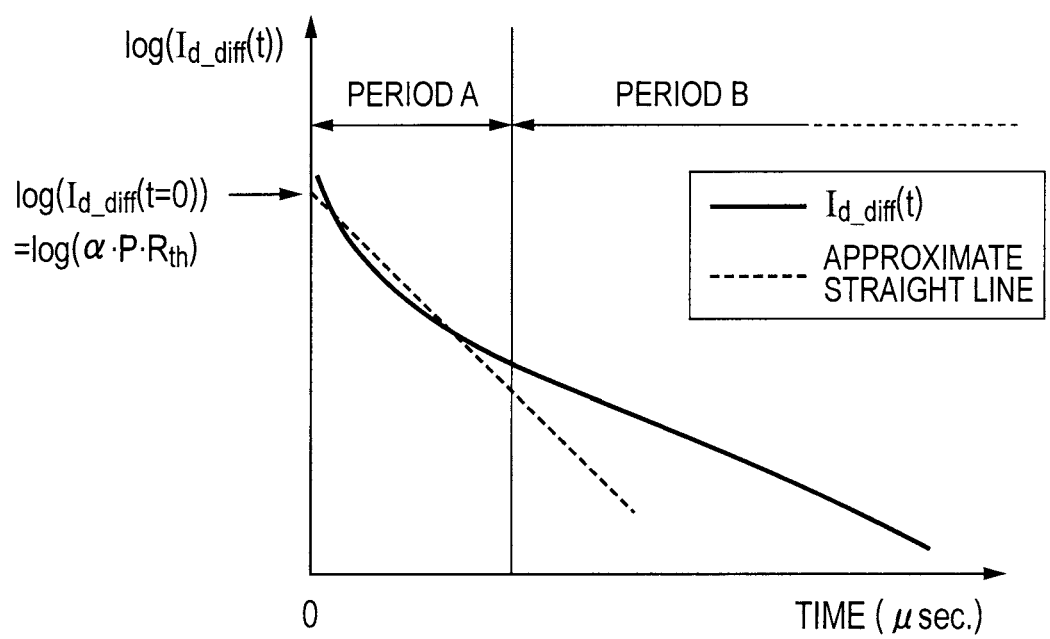

The description first focuses on a problem of the related art with reference to FIGS. 22A, 22B, and 23. To solve the problem, the description then focuses on a method that finds an approximate curve or an approximate straight line for $I_{d\_diff}(t)$ in a domain corresponding to the long elapsed time, finds difference $I_{d\_diff2}(t)$ between $I_{d\_diff}(t)$ and the approximate curve or the approximate straight line, selects the Id_diff (t) within the time domain where Id_diff2(*t*) is larger than an appropriate value, and determines an extrapolation value for $I_{d\_diff}(t)$, the heat capacity, and the heat resistance at t=0. Similarly to the other embodiments, $I_{d\_diff}(t)$ is defined as a difference found by subtracting drain current $I_{d\_steady}$ in the steady state from drain current $I_d(t)$ at elapsed time t from the rise of an input signal.

Figure 40:
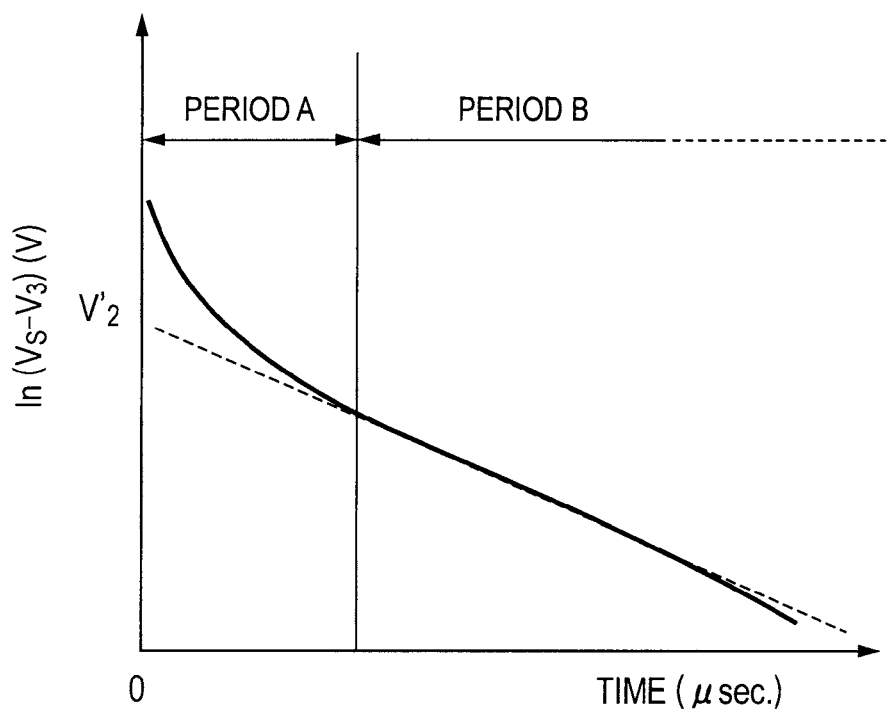
FIG. 40 illustrates the technology described in non-patent document 1.

FIG. 40 illustrates the problem described in non-patent document 1. FIG. 22A is equivalent to FIG. 40 and represents it using the symbols and the notation used for FIG. 5B or 13 according to the invention. However, the bias application method in non-patent document 1 differs from a typical example of the present invention. FIG. 22A uses a technology similar to non-patent document 1 under a typical bias condition of the invention.

Period B in FIGS. 22A and 22B is a time domain where the logarithm of $I_{d\_diff}(t)$ is linear with respect to the time, in which $I_{d\_diff}(t)$ is a difference found by subtracting the steady-state value from the actual measurement value after a lapse of specified time from the input signal rise. Period A is shorter than period B in terms of the elapsed time. Period A allows the logarithm of $I_{d\_diff}(t)$ to change more steeply than period B with the lapse of time.

In FIG. 22A, the solid line represents $I_{d\_diff}(t)$. The broken line represents a straight line approximated to $I_{d\_diff}(t)$ in period B. In FIG. 22B, the solid line represents $I_{d\_diff}(t)$. The broken line represents a straight line approximated to $I_{d\_diff}(t)$ in period A.

The technology described in non-patent document 1 may be applicable to bias conditions and measurement values according to the invention. In such a case, as shown in FIG. 22A, it may be necessary to find an approximate straight line with reference to period B and find log ($I_{d\_diff}(t=0)$) from the intercept on the approximate straight line.

On the other hand, as shown in FIG. 22B, the embodiment finds an approximate straight line based on $I_{d\_diff}(t)$ during period A and finds log ($I_{d\_diff}(t=0)$) from the intercept on the approximate straight line.

With reference to FIG. 23, the following describes a method of determining the boundary between periods A and B. FIG. 23 shows a semilog plot including a log plot of electric currents on the vertical axis and a plot of time t on the horizontal axis. In FIG. 23, the solid line represents $I_{d\_diff}(t)$ as a difference found by subtracting steady-state drain current $I_{d\_steady}$ from drain current $I_d(t)$ at time t. Symbols used in this embodiment mean the same as those used in the first through third embodiments.

An approximate curve representing an approximation for $I_{d\_diff}(t)$ in a domain of relatively large time value t is defined as $I_{d\_diffB}(t)$. In FIG. 23, for example, the approximate curve is represented as approximate straight line B and its value is defined as $I_{d\_diffB}(t)$. $I_{d\_diffB}(t)$ also gives the extrapolation to the small elapsed time domain A, as an extrapolation using an approximate curve or an approximate straight line that approximation for the long elapsed time domain. With reference to FIG. 23, the broken line represents the extrapolation of approximate straight line B to period A.

The domain of relatively large time value t is equivalent to period B in FIGS. 22A and 22B, for example. At this point, however, a time domain considered to be included in period B is assumed to be temporary period B and may be defined as the domain of relatively large time value t.

Specifically, the domain of relatively large time value t may be selected as a domain that allows log ($I_{d\_diff}(t)$) to linearly vary with the time or causes a small error from the linear variation. The boundary between the domain of steeply varying log ($I_{d\_diff}(t)$) and the domain of slightly varying log ($I_{d\_diff}(t)$) may be assumed to be a temporary boundary between periods A and B. The domain of relatively large time value t may be assumed to be distant from the temporary boundary between periods A and B in the direction of somewhat increasing time t.

A difference $I_{d\_diff2}(t)$ is found by subtracting a value for approximate curve $y=I_{d\_diffB}(t)$ in the domain of relatively large time value t from $I_{d\_diff}(t)$ at time t. The difference $I_{d\_diff2}(t)$ is given by equation (10).

$$I_{d\_diff2}(t)=I_{d\_diff}(t)-I_{d\_diffB}(t) \quad (10)$$

When is given by equation (8), equation (10) is converted into equation (11). It may be preferable to express $I_{d\_diffB}(t)$ in other forms than equation (8).

$$I_{d\_diff2}(t)==I_{d\_diff}(t)-\alpha PR_{thB}\exp(-t/R_{thB}C_{thB})) \quad (11)$$

In the equation, $R_{thB}$ represents heat resistance $R_{th}$ determined by fitting on an actual measurement value for $I_{d\_diff}(t)$ in the domain of large time value t mainly equivalent to period B; and $C_{thB}$ represents heat capacity $C_{th}$ determined by fitting on an actual measurement value for $I_{d\_diff}(t)$ in the domain of large time value t mainly equivalent to period B. The use of time constant $\tau_B$ for $I_{d\_diff}(t)$ in period B expresses equation (11) as equation (12).

$$I_{d\_diff2}(t)=I_{d\_diff}(t)-\alpha PR_{thB}\exp(-t/\tau_B) \quad (12)$$

Equation (11) is equivalent to equation (12) if time constant $\tau_B$ is expressed as equation (13).

$$\tau_B=R_{thB}C_{thB} \quad (13)$$

Period A is defined as a domain in which the above determined value of $I_{d\_diff2}(t)$ becomes greater than a specified critical value. If period A is selected according to this criterion, a measurement value for $I_{d\_diff}(t)$ in period A is used as the value of $I_{d\_diff}(t)$ according to the first through third embodiments for the analysis described in these embodiments.

The analysis described in the first through third embodiments is performed by using the plot in FIG. 5B or equation (8) or (9) using $I_{d\_diff}(t)$ in the time domain that allows the value of $I_{d\_diff2}(t)$ to be greater than a specified critical value. As indicated by the broken line in FIG. 22B, the value of $I_{d\_diff}(t)$ in period A is used to find $I_{d\_diff0}$ and find drain current $I_d(0)$ at t=0.

FIG. 23 shows an example of finding as an intercept on approximate straight line A corresponding to the value of $I_{d\_diff}(t)$ in period A. In this example, approximate straight line A is represented as $y=I_{d\_diffA}(t)$. Heat capacity $C_{th}$ and heat resistance $R_{th}$ may be found from the broken line in FIG. 22B, that is, a straight line equivalent to the approximate straight line using $I_{d\_diff}(t)$ in period A shown in FIG. 13, that is, the slope and the intercept of approximate straight line A in FIG. 22B.

As mentioned above, period A is defined as a time domain that allows the value of $I_{d\_diff2}(t)$ to be greater than a specified critical value. In this case, a current value of $I_{d\_diff2\_crit}$ is used as a criterion for period A. Then, period A is equivalent to a time domain that allows the value of $I_{d\_diff2}(t)$ to be greater than $I_{d\_diff2\_crit}$. Criterion $I_{d\_diff2\_crit}$ may be found by multiplying steady-state value $I_{d\_steady}$ for the drain current and an appropriate value together. For example, $I_{d\_diff2\_crit}$ may be equivalent to 1% or 2% of $I_{d\_steady}$. A time domain other than period A is assumed to be period B. FIGS. 24A and 24B show periods A and B found in this manner. FIGS. 24A and 24B are semilog plots. The vertical axis represents a log plot of electric currents. The horizontal axis represents the linear plot of the time. The horizontal axis of FIG. 24B is enlarged in comparison with FIG. 24A.

The following describes methods of finding extrapolation value $I_{d\_diff0}$ at t=0 based on $I_{d\_diff}(t)$ in period A. One method applies the first through third embodiments to period A as mentioned above. The method finds extrapolation value $I_{d\_diff0}$ for $I_{d\_diff}(t)$ at t=0 based on the relation between $I_{d\_diff}(t)$ and time t using the plot in FIG. 5B or equation (8) or (9). In FIG. 23, for example, value $I_{d\_diffA}(t)$ on approximate straight line A at t=0 is assumed to be $I_{d\_diff0}$. Several $I_{d\_diff}(t)$ values, one or two, at the time outside period A, may be added to determine the approximate curve or the approximate straight line, provided that the major part of $I_{d\_diff}(t)$ is selected from the domain A.

Another method will be described with reference to FIGS. 24A and 24B. The method applies the first through third embodiments to not $I_{d\_diff}(t)$, but $I_{d\_diff2}(t)$ as a difference between $I_{d\_diff}(t)$ and an extrapolation value using $I_{d\_diff}(t)$ in the domain of large time value t. The method then determines the extrapolation for $I_{d\_diff}(t)$ at t=0, the heat capacity, and the heat resistance.

As shown in FIG. 24A, the method first finds $I_{d\_diffB}(0)$ as $I_{d\_diff}(t)$ at t=0 by extrapolating the approximate curve at t=0 for $I_{d\_diff}(t)$ in a domain of large time value t, specifically, a domain included in period B. More specifically, the method extrapolates the straight line represented as approximate straight line B in FIGS. 24A and 24B at t=0 for $I_{d\_diff}(t)$ in a domain included in period B.

As shown in FIG. 24B, the method then finds $I_{d\_diff2}(0)$ as $I_{d\_diff2}(t)$ at t=0 by performing extrapolation using $I_{d\_diff2}(t)$ in period A (e.g., approximate straight line C in FIG. 24B). The definition of $I_{d\_diff2}(t)$ is equal to equations (10) through (12). The method adds drain current $I_{d\_steady}$ in the steady state, $I_{d\_diff2}(0)$, and $I_{d\_diffB}(0)$ together to yield drain current $I_d(0)$ at t=0. The sum of $I_{d\_diff2}(0)$ and $I_{d\_diffB}(0)$ may be assumed to be $I_{d\_diff0}$ because $I_d(0)$ is the sum of $I_{d\_steady}$ and $I_{d\_diff0}$.

The procedures illustrated in FIGS. 24A and 24B will be described using equations. Equation (14) expresses an approximate equation equivalent to equation (8) based on $I_{d\_diff}(t)$ in a domain of large time value t, specifically, a domain included in period B. The definition of heat resistance $R_{thB}$ and heat capacity $C_{thB}$ is equal to equation (11).

$$I_{d\_diff}(t)=\alpha \cdot P \cdot R_{thB} \cdot \exp(-t/(R_{thB} \cdot C_{thB})) \quad (14)$$

Equation (14) corresponds to approximate straight line B in FIG. 24A.

Equation (15) below is equivalent to equation (8) for $I_{d\_diff2}$ that is defined in equation (10).

$$I_{d\_diff2}(t)=\alpha \cdot P \cdot R_{thC} \cdot \exp(-t/(R_{thC} \cdot C_{thC})) \quad (15)$$

Equation (15) corresponds to approximate straight line C in FIG. 24B. Heat resistance $R_{thC}$ represents the heat resistance that is determined by equation (8) or (9), or the analysis similar to FIG. 13 using the time dependence data for Heat capacity $C_{thC}$ represents the heat capacity that is determined by equation (8) or (9), or the analysis similar to FIG. 13 using the time dependence data for $I_{d\_diff2}$.

The time constant for approximate straight line C is expressed as follows.

$$\tau_C=C_{thC}R_{thC} \quad (16)$$

Plotting the relations of equations (14) and (15) finds $I_{d\_diffB}(0)$ as $I_{d\_diffB}(t)$ at t=0 and $I_{d\_diff2}(0)$ as $I_{d\_diff2}(t)$ at t=0.

Fitting $I_{d\_diff}$ to the time dependence finds constants $R_{thB}$ and $C_{thB}$ in equation (14). Assigning the found $R_{thB}$ and $C_{thB}$ to equation (14) finds $I_{d\_diffB}(0)$. This also applies to equation (15). Fitting $I_{d\_diff2}$ to the time dependence finds constants $R_{thC}$ and $C_{thC}$ in equation (15). Assigning the found $R_{thC}$ and $C_{thC}$ to equation (15) finds $I_{d\_diff2}(0)$.

For example, values of $\alpha$ and P may be common to each other in equations (14) and (15).

Drain current $I_{d\_steady}$ in the steady state, $I_{d\_diff2}(0)$, and $I_{d\_diffB}(0)$ added together to yield drain current $I_d(0)$ at t=0.

The method described with reference to FIGS. 24A and 24B is equivalent to the following method. Equations (10), (14), and (15) can be used to express $I_{d\_diff}(t)$ as equation (17).

$$I_{d\_diff}(t) = a \exp(-t/\tau_B) + b \exp(-t/\tau_C) \quad (17)$$

Equations (18) and (19) are assumed as follows.

$$a = \alpha P R_{thB} \quad (18)$$

$$b = \alpha P R_{thC} \quad (19)$$

Equations (13) and (16) are used as time constants $\tau_A$ and $\tau_B$ in equation (17).

Any function f(t) may replace equation (15) as follows.

$$I_{d\_diff}(t) = a \exp(-t/\tau_B) + f(t) \quad (20)$$

Coefficients a and $\tau_B$ are determined by performing the fitting on $I_{d\_diff}(t)$ for a domain included in the domain of large time value t (e.g., period B) using equation (21) equivalent to equation (17) with its second term set to zero.

$$I_{d\_diff}(t) = a \exp(-t/\tau_B) \quad (21)$$

Similarly, coefficients a and $\tau_B$ are determined by performing the fitting on $I_{d\_diff}(t)$ for a domain included in the domain of large time value t (e.g., period B) using equation (21) equivalent to equation (20) with its second term set to zero.

The above determined coefficients a and $\tau_B$ are assigned to equation (17). Equation (17) is then used to perform the fitting on $I_{d\_diff}(t)$ in a domain of small time value t, e.g., period A in FIGS. 24A and 24B to determine coefficients b and $\tau_C$ in equation (17).

Value $I_{d\_diff0}$ for $I_{d\_diff}(t)$ at t=0 is found by assigning t=0 to equation (17) to which the determined coefficients a, b, $\tau_B$, and $\tau_C$ are assigned. Adding $I_{d\_diff0}$ and drain current $I_{d\_steady}$ in the steady state yields drain current $I_d(0)$ at t=0.

Equation (20) is used as follows. That is, function f(t) is determined using equation (20) to which the above determined coefficients a and $\tau_B$ are assigned. Value $I_{d\_diff0}$ for $I_{d\_diff}(t)$ at t=0 is found by assigning t=0 to equation (20) to which the determined coefficients a, $\tau_B$, and f(t) are assigned. Adding $I_{d\_diff0}$ and drain current $I_{d\_steady}$ in the steady state yields drain current $I_d(0)$ at t=0.

It may be preferable to determine a combination of $R_{thB}$ and $C_{thB}$ instead of a combination of coefficients a and $\tau_B$. It may be preferable to determine a combination of $R_{thC}$ and $C_{thC}$ instead of a combination of coefficients b and $\tau_C$.

The following describes methods of determining time constants (or a set of the heat resistance and the heat capacity) in periods A and B. As shown in FIG. 11, a temperature increase model used for general circuit simulators assumes a single time constant that depends on one heat capacity and one heat resistance. However, no circuit simulation is needed if the extrapolation onto t=0 is performed to find characteristics without temperature increase. To do this, the extrapolation just needs to use the time constants (or a set of the heat resistance and the heat capacity) in periods A and B, equations, or plots described in the embodiment.

The temperature increase model for circuit simulation needs to be modified if the circuit simulation uses the time constants (or a set of the heat resistance and the heat capacity) in periods A and B. This will be described in a fifth embodiment.

The analysis of dividing the time domain into two portions has been described in the methods that are described with reference to FIGS. 23, 24A, and 24B. Similar operations may be repeated to divide the time domain into three or more portions.

The following describes in detail the principle of the invention in terms of the embodiment. It is necessary to determine whether a measurement noise, a self-heating property, or a cause other than self-heating forces device characteristics to steeply vary in period A simultaneously with the input signal rise. The self-heating model analysis as an object of the invention needs to ignore the characteristics in period A if the device characteristics in period A vary due to a measurement noise or a cause other than self-heating. The self-heating model analysis as an object of the invention needs to consider period A if the device characteristics in period A vary due to self-heating. As a result of study, the inventors found that period A is attributable to self-heating and needs to be taken into consideration during the self-heating model analysis.

Figure 25:
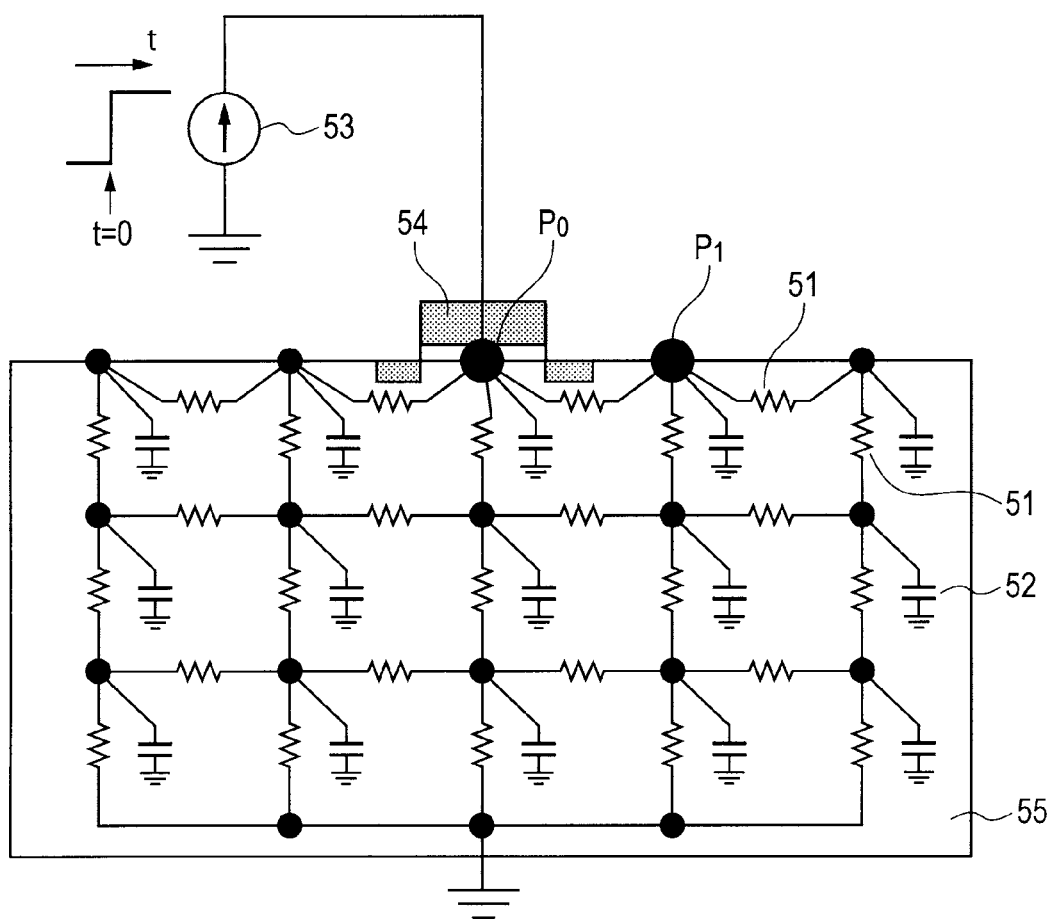
FIG. 25 illustrates the principle of the semiconductor device evaluation apparatus according to the fourth embodiment.

As shown in FIG. 25, a point $P_0$ over the silicon wafer surface represents a field effect transistor 54 provided over a silicon wafer 55. Similarly to the point 0, a point $P_0$ is assumed to be positioned over the surface of the silicon wafer 55 and is separated from the field effect transistor for a specified distance. A heat flow source 53 represents a heat flow generated from the field effect transistor. A heat flow equivalent to the power consumption of the field effect transistor begins to flow at t=0. The network of a heat resistance 51 and a heat capacity 52 shown in FIG. 25 is used to analyze temperature changes after the heat flow begins.

Figure 26A:
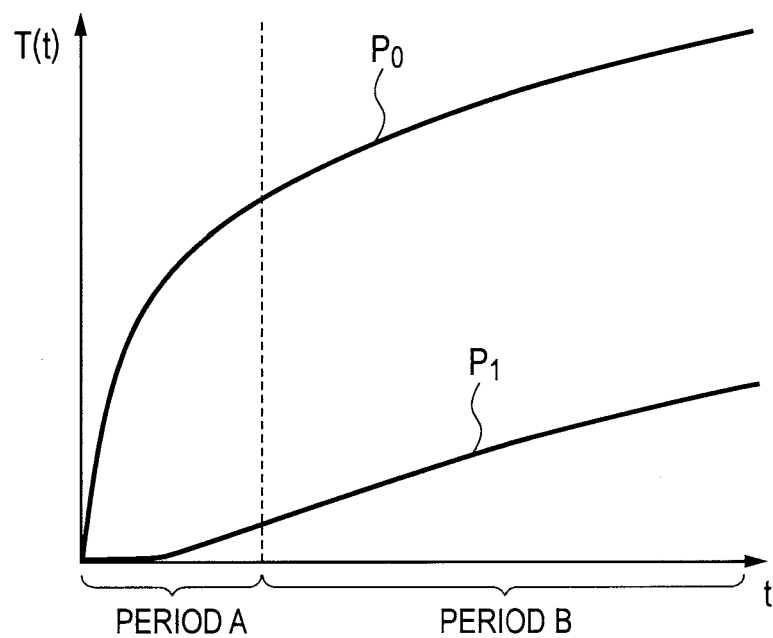
FIGS. 26A and 26B illustrate the principle of the semiconductor device evaluation apparatus according to the fourth embodiment.
Figure 26B:
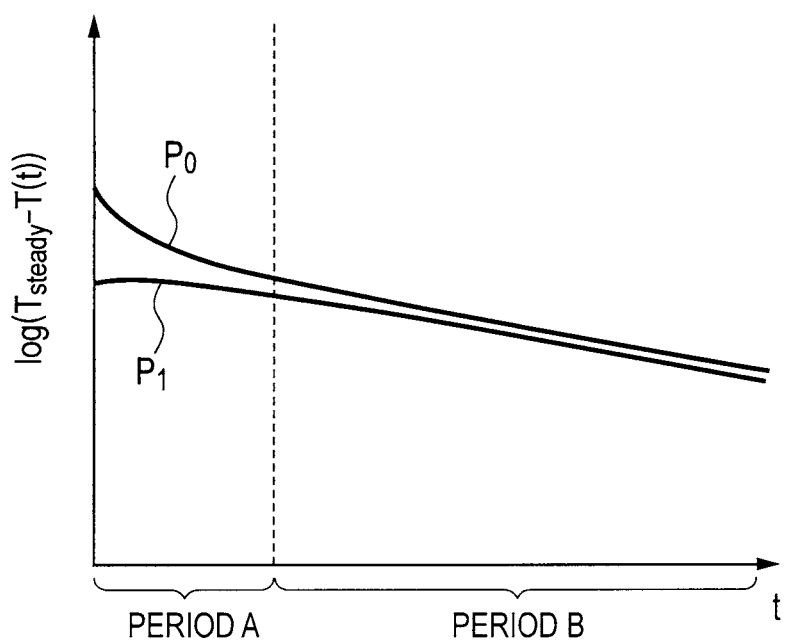

FIGS. 26A and 26B show results of analyzing temperature changes. FIG. 26A shows results of calculating temperature changes at the points $P_0$ and $P_1$ after the heat flow starts from the heat flow source 53 at time t=0. In FIGS. 26A and 26B, the vertical axis represents a linear plot of time dependence T(t) of the device temperature and the horizontal axis represents a linear plot of time t. In FIG. 26B, the vertical axis represents a plot of log $(T_{steady} - T(t))$ and the horizontal axis represents a linear plot of time t in comparison with (t). In FIG. 26B, $T_{steady}$ represents the temperature in the steady state at the points $P_0$ and $P_1$.

The result of the point $P_0$ in FIG. 26B clearly reproduces periods A and B, that is, two domains described with reference to FIGS. 22A and 22B or FIG. 23. In comparison with FIG. 26A that uses the vertical axis as temperature T(t), period A is equivalent to a time domain where the temperature drastically increases at the position $P_0$ of the transistor but the heat is not transferred to the point $P_0$ distant from the transistor and the temperature does not start increasing fully. Period B is equivalent to a time domain where the temperature varies with similar change ratios at the points $P_0$ and $P_1$. Period B keeps a temperature difference almost constant at the points $P_0$ and $P_1$.

Figure 27A:
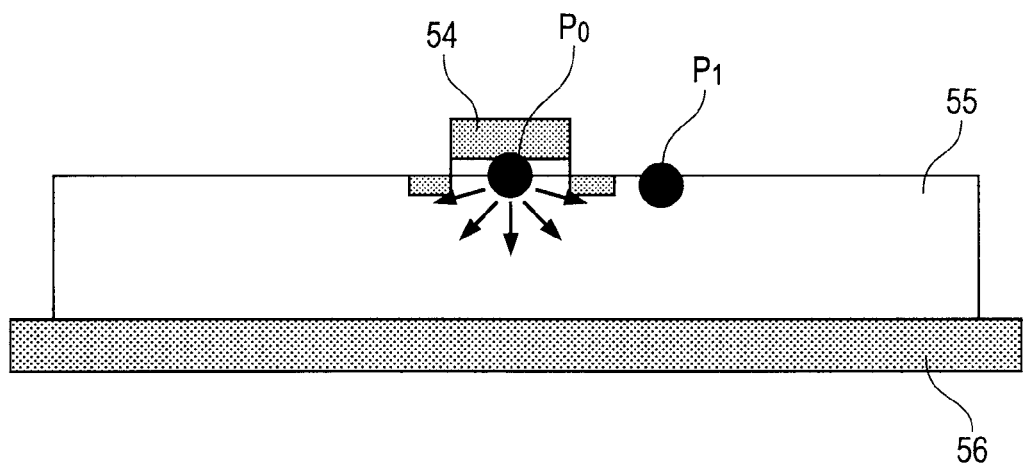
FIGS. 27A and 27B illustrate the principle of the semiconductor device evaluation apparatus according to the fourth embodiment.
Figure 27B:
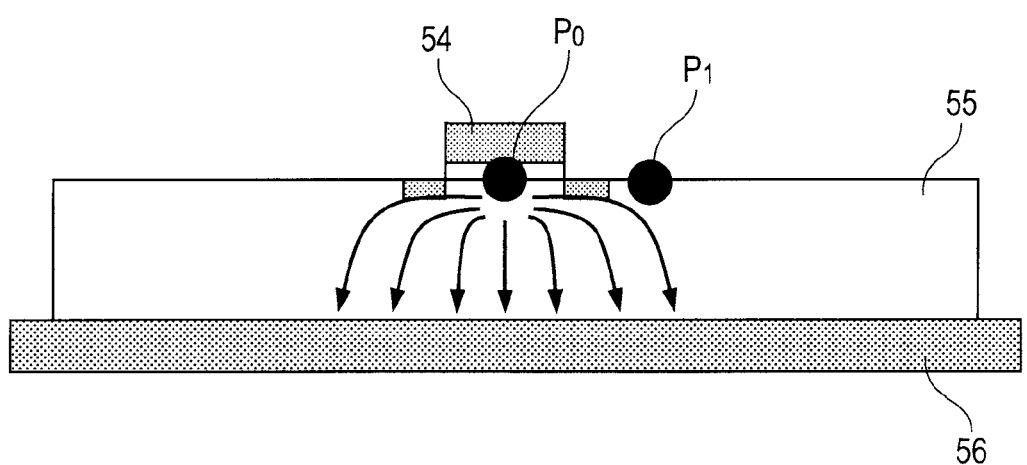

FIGS. 27A and 27B schematically show the results of FIGS. 26A and 26B. The silicon wafer 55 is underneath in contact with a metal chuck 56. The chuck 56 provides a heat sink. FIG. 27A illustrates the state of period A. Heat generated from the field effect transistor 54 almost isotropically spreads toward the wafer depth and the wafer surface (horizontal direction in the drawing) with the lapse of time. The heat does not reach the point $P_1$ at t=0 in period A. There is a small temperature increase at the point $P_1$. On the other hand, the heat concentrates near the point $P_0$. The temperature near the point $P_0$ drastically increases with the lapse of time.

The heat will isotropically spread forever as shown in FIG. 26A if the silicon wafer is unlimitedly thick. However, the semiconductor device is actually formed over a very thin plate-like wafer. After a lapse of specified time, the heat comes to flow toward the heat sink at the bottom of the plate-like silicon wafer as shown in FIG. 26B. The heat is prevented from spreading further horizontally. The heat is considered to spread in this manner during period B.

A physical effect due to self-heating generates two domains such as periods A and B as shown in FIGS. 22A, 22B, and 23. The analysis of self-heating must take into consideration a drastic change in the temperature or the current during period A with the lapse of time. The heat is transferred differently during periods A and B. As described in the embodiment, it is necessary to analyze the self-heating, extrapolate current values onto t=0, and extract self-heating parameters on the assumption that the temperature changes in accordance with different time constants in the respective periods. It should be noted that a current change is assumed to follow a temperature change.

Effects of the fourth embodiment will be described.

Let us consider a time constant for temperature change. Similarly to the electric circuit, the time constant is represented as the product of the heat capacity and the heat resistance as a simplest form. The heat capacity is proportional to the volume as an object of temperature increase. The volume is proportional to the cube of a radius from the heat source as the center. The heat capacity and the time constant are small if the heat concentrates in a narrow range equivalent to period A as the time domain shown in FIG. 26A. On the other hand, the heat capacity and the time constant increase if the heat spreads in period B as the time domain shown in FIG. 26B. Accordingly, a temperature change corresponding to a small time constant specific to period A has a small effect on the domain of large elapsed time value t after the beginning of a temperature change. The time constant for period B can be found by using a measurement value in the domain of large elapsed time value t after the beginning of a temperature change, particularly using a value found by subtracting an actual measurement value in the steady state from an actual measurement value. Determining the time constant signifies not only finding a specific numeric value for the time constant but also finding an approximate curve or an approximate straight line that depends on the time constant.

An actual measurement value in the steady state is subtracted from an actual measurement value to find a difference. The time constant for period B is used to extrapolate the difference. The extrapolated value is subtracted from the difference. That is, a difference is found between the measurement value in period A and the extrapolated value from period B. Period A can be defined as a domain where the difference is larger than a specified value. Period A is equivalent to a time domain that generates a large variation in transistor characteristics and is important for the self-heating analysis. Values for the above determined period A are used for the first through third embodiments of the invention so as to calculate device characteristics without temperature increase by extrapolating measurement values onto t=0 and analyze the self-heating such as determining the heat resistance and the heat capacity. Accuracy of the first through third embodiments of the invention can thereby be improved. As a result, it is possible to solve the problem of the method described in non-patent document 1.

An actual measurement value in the steady state is subtracted from an actual measurement value to find a difference. The time constant for period B is used to extrapolate the difference. The extrapolated value is subtracted from the difference to find a second difference. The second difference is used to find a new time constant for period A and describe the effect of a temperature change in period A. Measurement values are extrapolated onto t=0 so as to calculate device characteristics without temperature increase and analyze the self-heating such as determining the heat resistance and the heat capacity. Accuracy can thereby be improved. As a result, it is possible to solve the problem of the method described in non-patent document 1.

Fifth Embodiment

The semiconductor device evaluation method according to the fifth embodiment will be described with reference to the accompanying drawings. According to the fourth embodiment, the method described with reference to FIGS. 24A and 24B determines time constants (or a set of the heat resistance and the heat capacity) in periods A and B. In this case, incorporating thermal circuits into the circuit simulation model can simulate circuits using the time constants (or a set of the heat resistance and the heat capacity) in periods A and B.

The embodiment uses two sets of thermal circuits similar to FIG. 11 as a circuit simulation model. In FIG. 28, a thermal circuit 57 represents a temperature change in period A and is hereafter referred to as a period-A representing thermal circuit. A thermal circuit 58 represents a temperature change in period B and is hereafter referred to as a period-B representing thermal circuit.

The period-A representing thermal circuit 57 uses heat resistance $R_{thC}$ and heat capacity $C_{thC}$ expressed by equation (15) in terms of period A. The period-B representing thermal circuit 58 uses heat resistance $R_{thB}$ and heat capacity $C_{thB}$ expressed by equation (14) in terms of period B.

A heat flow source $P_C$ in the period-A representing thermal circuit 57 is separated from a heat flow source $P_B$ in the period-B representing thermal circuit 58 as discrete circuits. Both heat flow sources have basically the same output. That is, an equivalent of the heat flow source in FIG. 11 is used in the period-A representing thermal circuit 57 and the period-B representing thermal circuit 58.

Ambient temperature $T_0$ is common to the period-A representing thermal circuit 57 and the period-A representing thermal circuit 58 and is equal to the ambient temperature $T_0$ in FIG. 11 used for normal thermal circuits. Device temperature $T_{devC}$ depends on the period-A representing thermal circuit 57. Device temperature $T_{devB}$ depends on the period-B representing thermal circuit 58.

Subtracting $T_0$ from $T_{devC}$ yields $T_{heatC}$ that is a device temperature increase due to the period-A representing thermal circuit 57. Subtracting $T_0$ from $T_{devB}$ yields $T_{heatB}$ that is a device temperature increase due to the period-B representing thermal circuit 58. The sum of the device temperature increase due to the thermal circuit 57 and the device temperature increase due to the thermal circuit 58 yields device temperature increase $T_{heat}$. The sum of $T_0$ and $T_{heat}$ yields device temperature $T_{dev}$.

Device temperature $T_{dev}$ is used to calculate device characteristics such as a current value for the field effect transistor, for example. Definitions of $T_{dev}$ and $T_{heat}$ are equal to those included in FIG. 11 and the description about the FIG. 11. Device temperature $T_{dev}$ is expressed as equation (22).

$$T_{dev}=T_0+T_{heatC}+T_{heatB} \quad (22)$$

As mentioned above, equations (23) and (24) satisfy the following relation. Equation (22) may be expressed as equation (25).

$$T_{heatC}=T_{devC}-T_0 \quad (23)$$

$$T_{heatB}=T_{devB}-T_0 \quad (24)$$

$$T_{dev}=T_0+(T_{devC}-T_0)+(T_{devB}-T_0) \quad (25)$$

The heat flow sources $P_C$ and $P_B$ may provide different outputs. For example, the heat flow in FIG. 11 may be divided into two. In this case, it is necessary to recalculate heat resistance $R_{thB}$, heat capacity $C_{thB}$, heat resistance $R_{thB}$, and heat capacity $C_{thB}$ in accordance with the divided heat flow sources. As an example, these values are recalculated so as to store time constants $\tau_C$ and $\tau_B$. As described in the fourth embodiment, similar operations may be repeated to divide the time domain into three or more portions. In this case, three or more thermal circuits may be used in accordance with the number of divisions.

Sixth Embodiment

Figure 30:
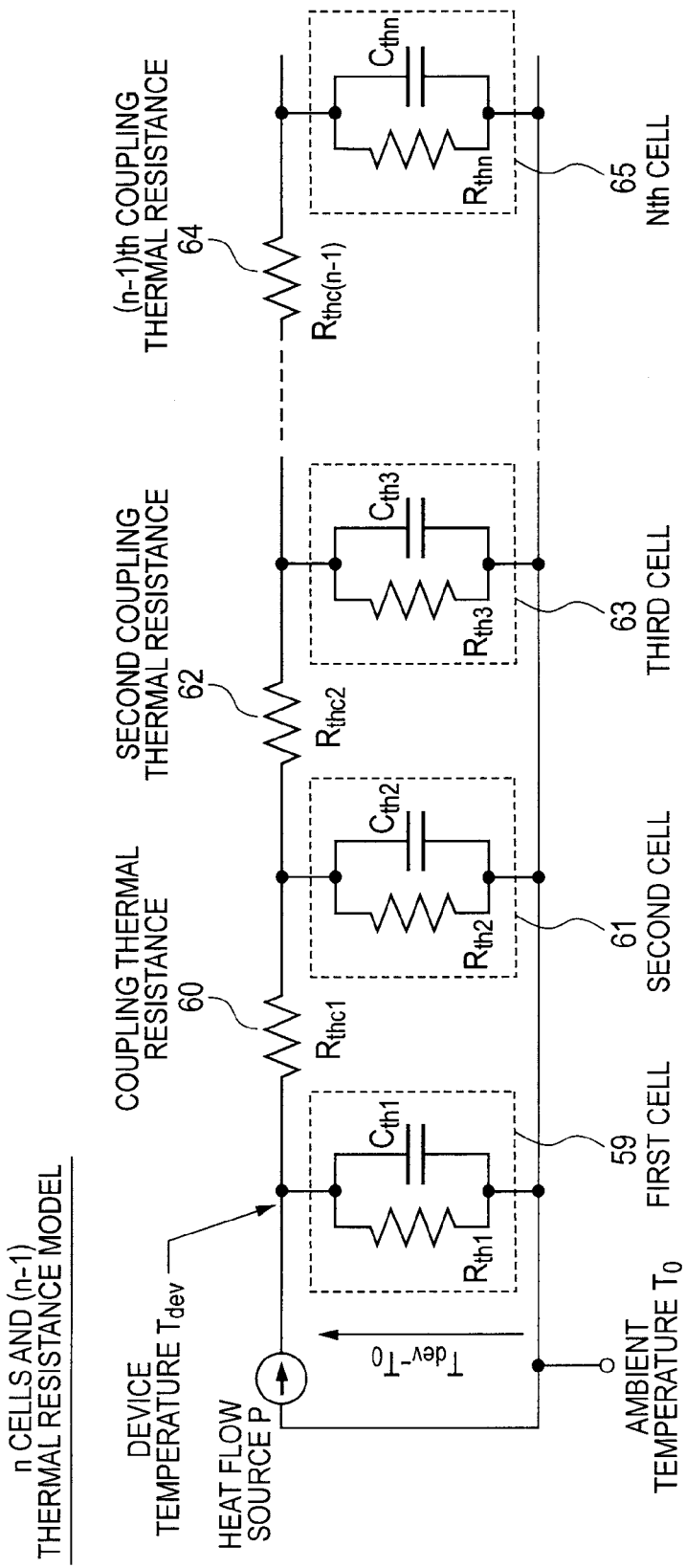
FIG. 30 illustrates the semiconductor device evaluation apparatus according to the sixth embodiment.

As described with reference to FIG. 28, the fifth embodiment uses one set of thermal circuits. Instead, there may be available other models that describe temperature changes in the semiconductor device. FIG. 29 shows a thermal circuit including two cells and one thermal resistor. FIG. 30 shows a thermal circuit including n cells and (n−1) thermal resistors. The cell signifies a unit of parallel coupling the heat capacitor and the thermal resistor in the thermal circuit.

The thermal circuit in FIG. 29 includes a first cell 59, a second cell 61, and a coupling thermal resistor $R_{thc1}$ (60). The first cell 59 includes heat capacitor $C_{th1}$ and thermal resistor $R_{th1}$ parallel coupled to each other. The second cell 61 includes heat capacitor $C_{th2}$ and thermal resistor $R_{th2}$ parallel coupled to each other. One of two terminals of the first cell 59 and the second cell 61 is each coupled to ambient temperature $T_0$. The heat flow source P is coupled to the first cell 59 at the other terminal not coupled to ambient temperature $T_0$. The heat flow source P is coupled to the second cell 61 at the other terminal not coupled to ambient temperature $T_0$ via the coupling thermal resistor $R_{thc1}$ (60). The first cell 59 and the second cell 61 each include one thermal resistor and one heat capacitor. The thermal circuit shown in FIG. 29 includes two heat capacitors and three thermal resistors in total. In this thermal circuit, the number of thermal resistors is greater than the number of heat capacitors by one.

FIG. 30 shows a thermal circuit including many cells coupled to each other according to the same method as that of coupling the first cell 59 to the second cell 61 in the thermal circuit shown in FIG. 29. The thermal circuit in FIG. 30 includes n cells and n−1 coupling thermal resistors. Each cell contains one heat capacitor and one thermal resistor parallel coupled to each other. The first cell 59 and the succeeding cells are all coupled to ambient temperature $T_0$ at one of two terminals provided for each cell. The heat flow source P is coupled to the first cell 59 at the other terminal not coupled to ambient temperature $T_0$. The nth cell uses the other terminal not coupled to ambient temperature $T_0$ in order to be coupled to the (n−1)th cell at the other terminal not coupled to ambient temperature $T_0$ via coupling thermal resistor $R_{thc(n-1)}$. The thermal circuit includes n heat capacitors and (2n−1) thermal resistors.

Figure 31:
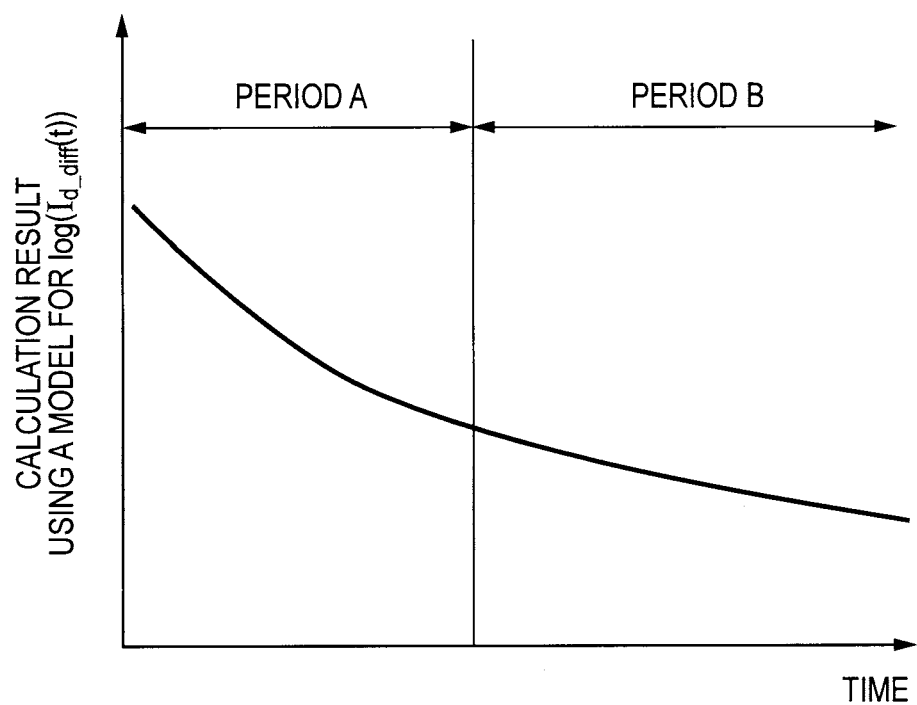
FIG. 31 illustrates operations of the semiconductor device evaluation apparatus according to the sixth embodiment.

FIG. 31 shows an example of the time dependence of $I_{d\_diff}(t)$ calculated by using the thermal circuit shown in FIG. 29. This model can reproduce the time dependence of $I_{d\_diff}(t)$ that includes two domains, periods A and B, smoothly coupled to each other. The similar tendency is available if the vertical axis represents log $(T_{steady}-T(t))$ as shown in FIG. 26B. Obviously, the thermal circuit shown in FIG. 25 can reproduce the time dependence of $I_{d\_diff}(t)$ including two periods. As shown in FIG. 29, at least two heat capacitors and three thermal resistors can reproduce the time dependence of $I_{d\_diff}(t)$ including two periods.

Figure 41A:
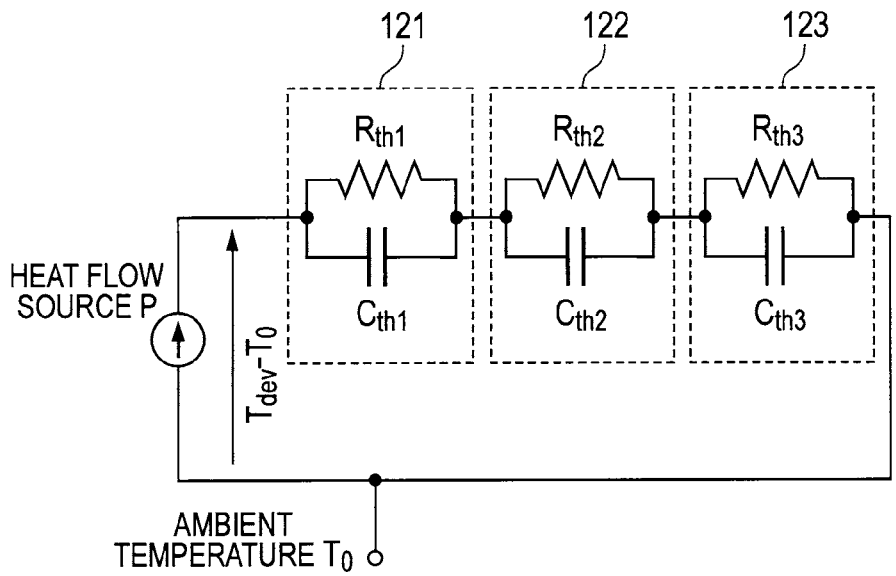
FIGS. 41A and 41B illustrate the technology described in non-patent document 4.
Figure 41B:
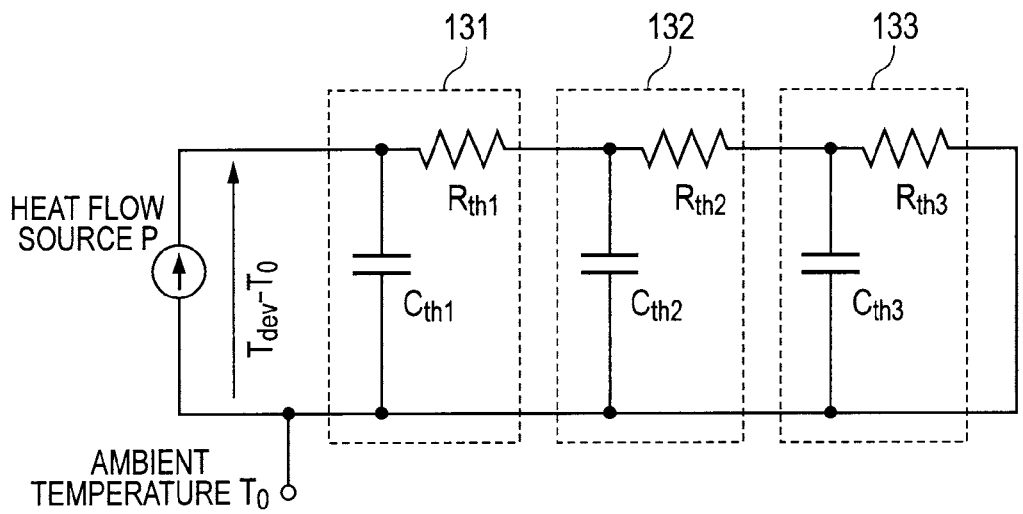

FIGS. 41A and 41B exemplify two thermal circuits, one using cells 121 through 123 and the other using cells 131 through 133, as described in non-patent document 4. As shown in FIGS. 41A and 41B, each thermal circuit includes the same number of heat capacitors and heat capacitors. In each of FIGS. 41A and 41B, thermal resistors $R_{th1}$, $R_{th2}$, and $R_{th3}$ are serially coupled.

The thermal circuits as shown in FIGS. 41A and 41B are described in non-patent document 4 and include cells 121 through 123 and 131 through 133 similarly to the embodiment. However, it is difficult for the thermal circuits according to non-patent document 4 to reproduce the time dependence of $I_{d\_diff}(t)$ including periods A and B as shown in FIG. 22A. Those thermal circuits lack parallel coupled thermal resistors as described in the embodiment. According to the embodiment shown in FIG. 29, thermal resistor $R_{th2}$ and coupling thermal resistor $R_{thc1}$ are serially coupled to provide combined resistance. The combined resistance is parallel coupled to thermal resistor $R_{th1}$ and heat capacitor $C_{th1}$. Therefore, the embodiment can reproduce the time dependence of $I_{d\_diff}(t)$ including periods A and B as shown in FIG. 22A. The same applies to the circuit in FIG. 30.

In the model of FIG. 29, the first cell 59 represents the time constant for the period where the thermal propagation is limited to a narrow range as shown in FIG. 27A. The second cell 61 represents a difference between the time constant for the first cell 59 and the time constant for the period where the thermal propagation covers a wide range as shown in FIG. 2B. Coupling resistor $R_{thc1}$ represents the heat resistance for transferring the heat from the state of FIG. 27A to the state of FIG. 27B. The components in FIG. 29 can be associated with the physical quantity in the actual thermal propagation. A few devices including two heat capacitors and three thermal resistors can reproduce not only an actual temperature change but also the time dependence of $I_{d\_diff}(t)$.

The following example determines a numeric value for the heat resistance or the heat capacity in the model used for the thermal circuit according to the embodiment. The simulation using the thermal circuit according to the embodiment is performed for fitting to the time dependence of an actual measurement value such as drain current $I_{d\_diff}(t)$ or the device temperature.

Parameters for the thermal circuit in FIG. 29 may be determined in association with the thermal circuit in FIG. 28 as follows. The value of $R_{thC}$ is used for $R_{th1}$. The value of is used for $C_{th1}$. The value of $R_{thC}$ is used for $R_{th1}$. The value of $C_{thC}$ is used for $C_{th1}$. For example, the intercept in FIG. 13 determines $R_{thC}$ so that parallel coupling the combined resistance to $R_{th1}$ satisfies the heat resistance of the device while the combined resistance includes $R_{th2}$ and $R_{thC}1$ serially coupled to each other. The following values are extracted from actual measurement values. For example, the slope of $I_{d\_diff}(t)$ during period A determines the product of $R_{th1}$ and $C_{th1}$. In FIG. 24B, the intercept determines $R_{th1}$. The slope of $I_{d\_diff}(t)$ during period B determines the product of $R_{th2}$ and $C_{th2}$. In FIG. 24A, $I_{d\_diffB}(0)$ determines $R_{th2}$. Smoothness or a temporal length of a domain for coupling periods A and B determines $R_{thC}1$.

The thermal circuit according to the embodiment may be used as an extrapolation means for estimating characteristics without temperature increase in the semiconductor device, as a thermal circuit for reproducing a temperature change in the device during the semiconductor circuit simulation, or as a means for analyzing a temporal change in the device temperature of the semiconductor device. The characteristics at time zero can eliminate a temperature increase as follows if the thermal circuit is used as an extrapolation means for estimating characteristics without temperature increase in the semiconductor device. Measurement values such as drain currents at multiple times are used to determine constants such as the heat capacity and the heat resistance. The determined constants are used to simulate the thermal circuit and find a temporal change in the drain current.

Seventh Embodiment

The following embodiment may be used for part of the procedures according to the first through sixth embodiments.

A temperature dependence parameter represents the temperature dependence of various device characteristics such as the mobility, the threshold voltage, and the saturation voltage. The temperature dependence parameter may be extracted based on actual measurement values for the drain current acquired by varying the temperature in the steady state. In order to acquire accurate data, the temperature may be preferably varied in several ways. In addition, it may be preferable to use the method that determines the temperature dependence parameter for the drain current with t=0 at the temperature acquired by performing the above-mentioned procedure. This temperature is equivalent to the temperature of the chuck for holding the wafer during measurement in the steady state and is equivalent to ambient temperature $T_0$ in FIG. 11.

Though the accuracy is degraded, the temperature dependence parameter may be determined by performing the normal pulse measurement at varied temperatures and using a pulse measurement result at each temperature.

Measurement results in the steady state may be appropriately combined because the pulse measurement may not ensure the accuracy for sub-threshold characteristics. That is, room temperature data in the steady state or data resulting from varying the temperature is used for fitting in sub-threshold characteristics or linear domain characteristics indicating a small effect of the self-heating. A drain current extrapolation value at t=0 may be acquired from the invention and may be used for fitting in a saturated region indicating a large effect of the self-heating to determine model parameters (including the temperature dependence parameter).

The present invention is applicable to various semiconductor devices that need the self-heating evaluation. The invention is applicable to not only N-channel field effect transistors (MOSFETs) but also P-channel field effect transistors. Further, the invention is applicable to not only field effect transistors but also other transistors such as insulated gate bipolar transistors and bipolar transistors. The invention is also applicable to the self-heating analysis for semiconductor devices other than transistors such as diodes, gate turn-off thyristors (GTOs), and thyristors.

Figure 32:
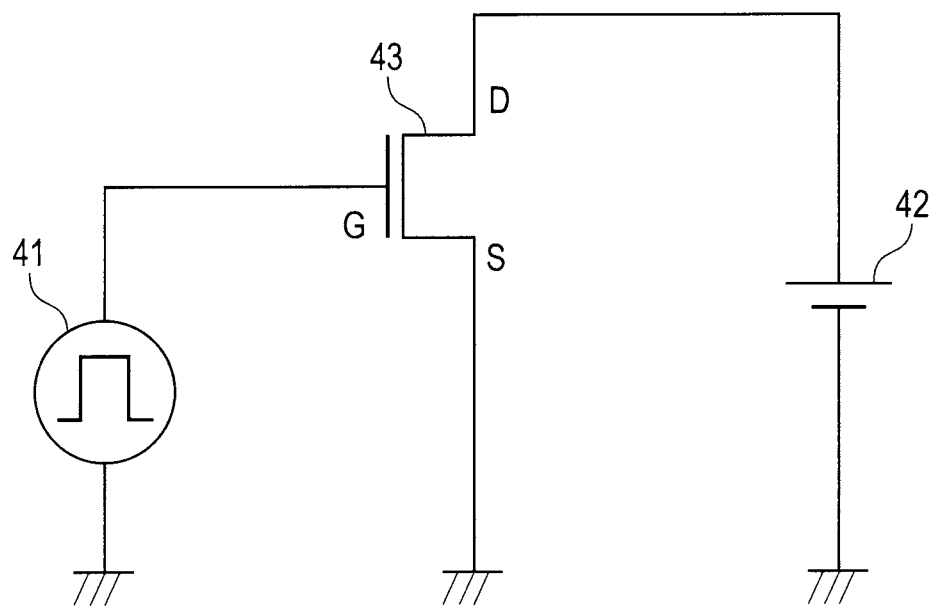
FIG. 32 illustrates a semiconductor device evaluation apparatus according to a seventh embodiment.
Figure 33:
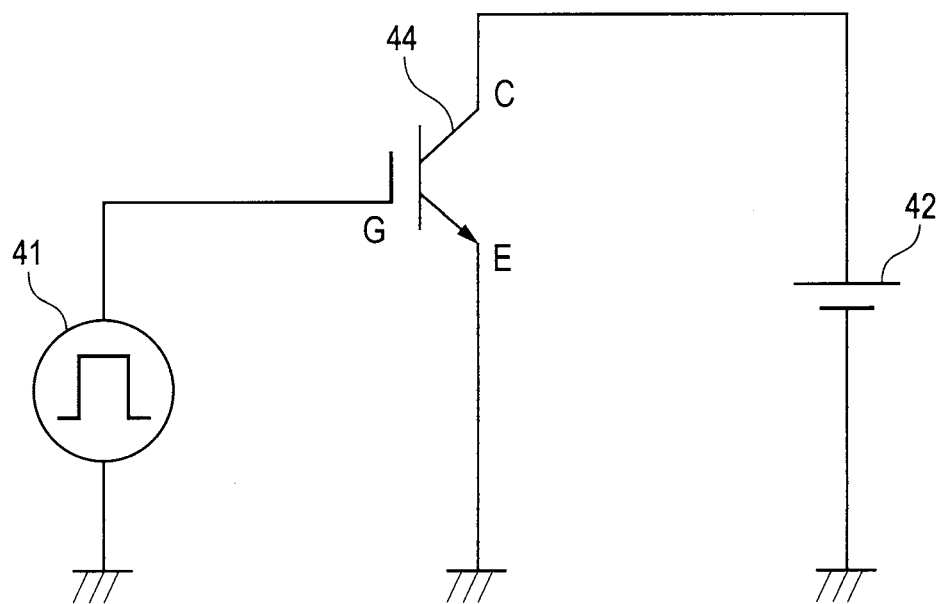
FIG. 33 illustrates the semiconductor device evaluation apparatus according to the seventh embodiment.
Figure 34:
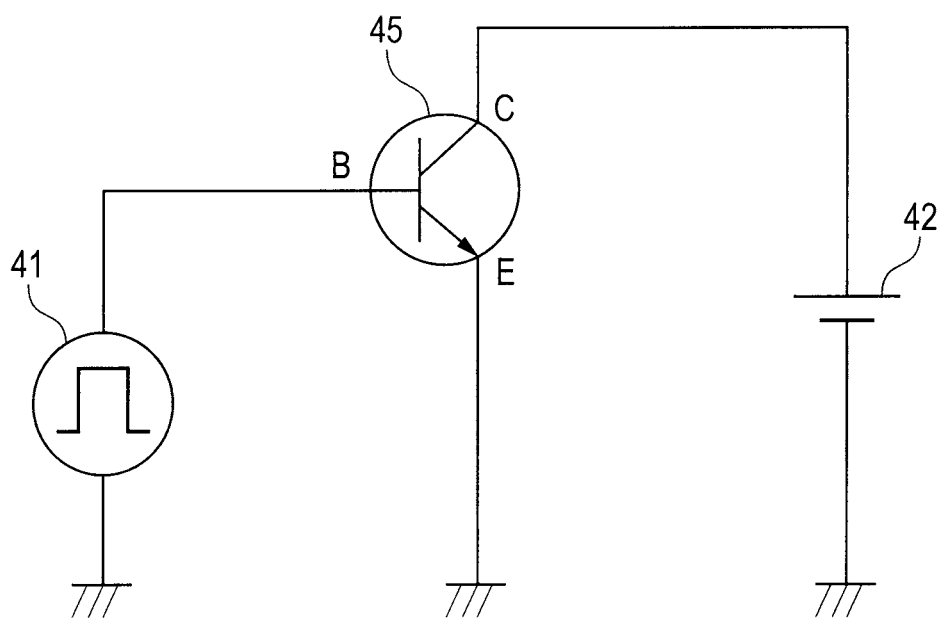
FIG. 34 illustrates the semiconductor device evaluation apparatus according to the seventh embodiment.
Figure 35:
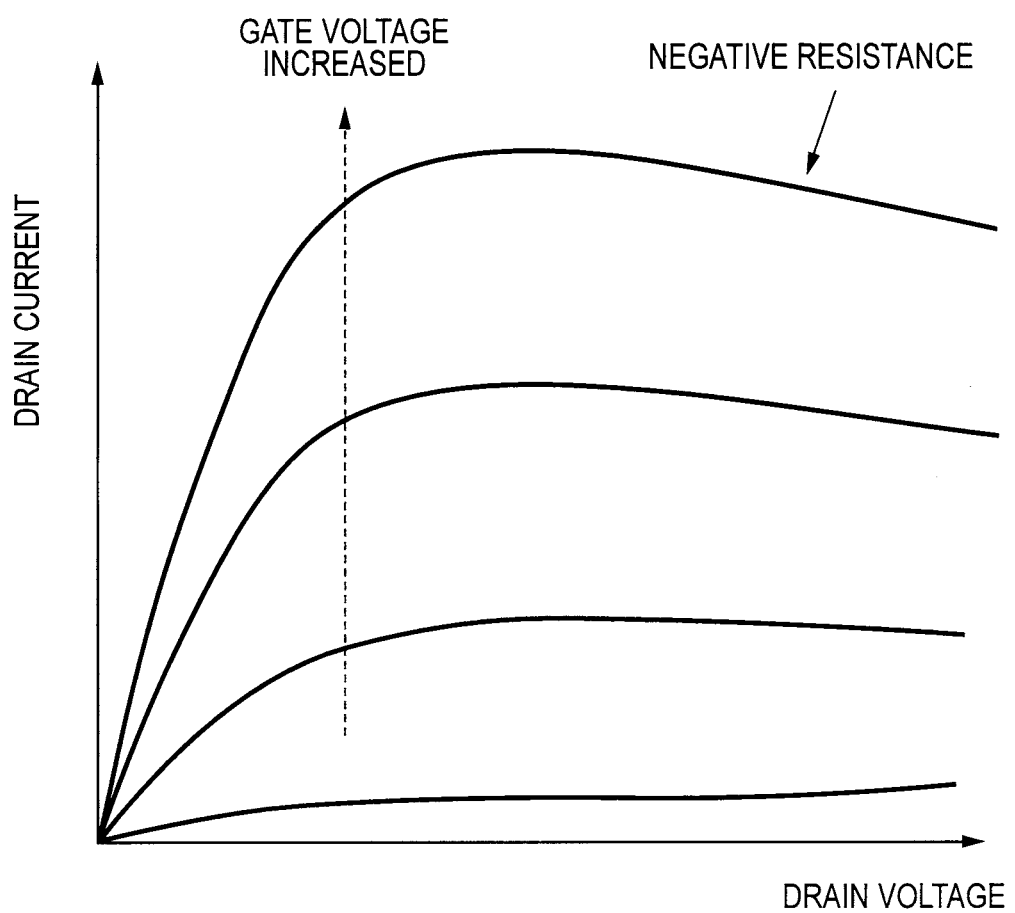
FIG. 35 illustrates the technology described in non-patent document 1.
Figure 36:
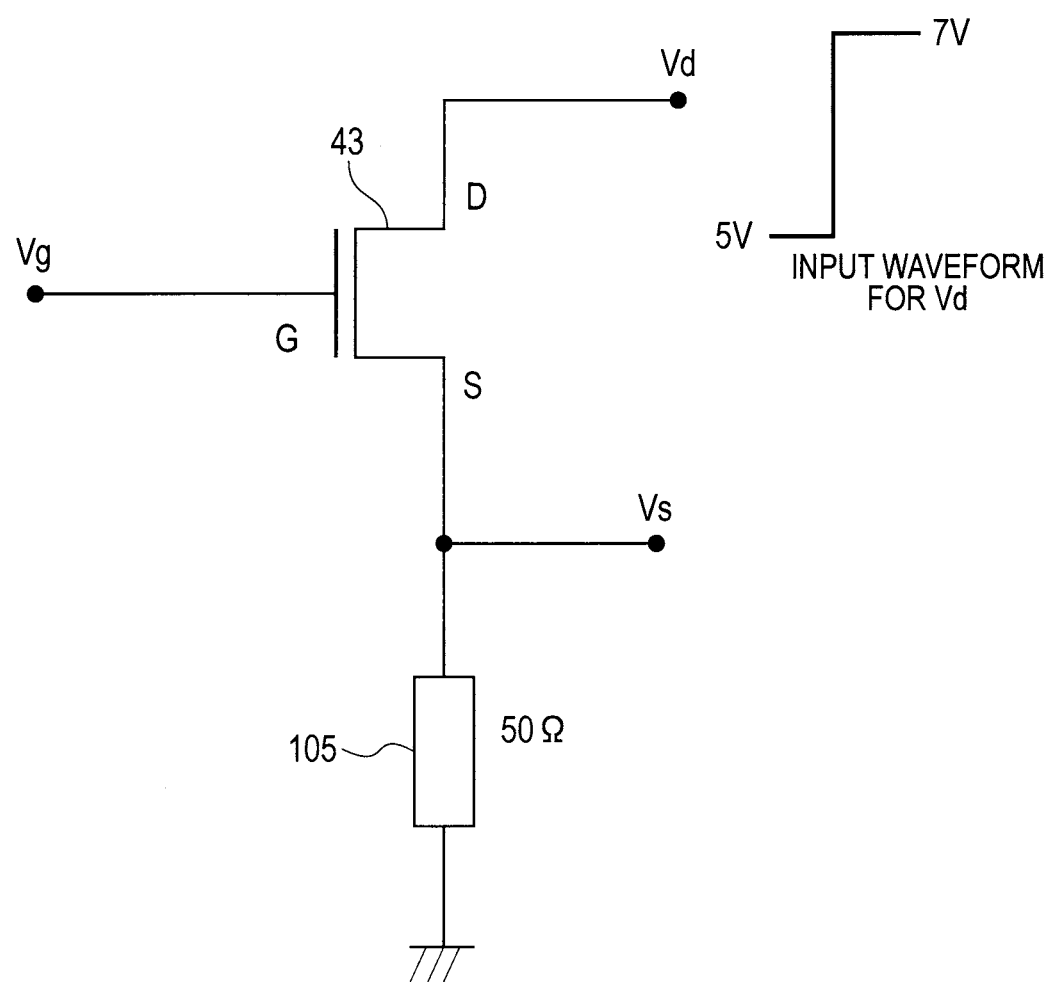
FIG. 36 illustrates the technology described in FIG. 2 of non-patent document 1.
Figure 37:
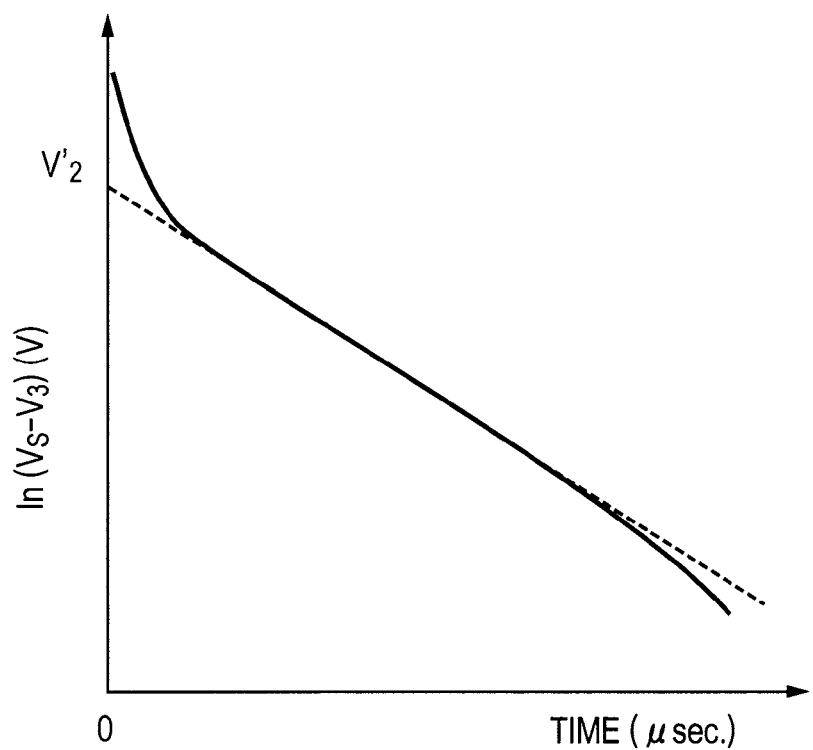
Figure 38:
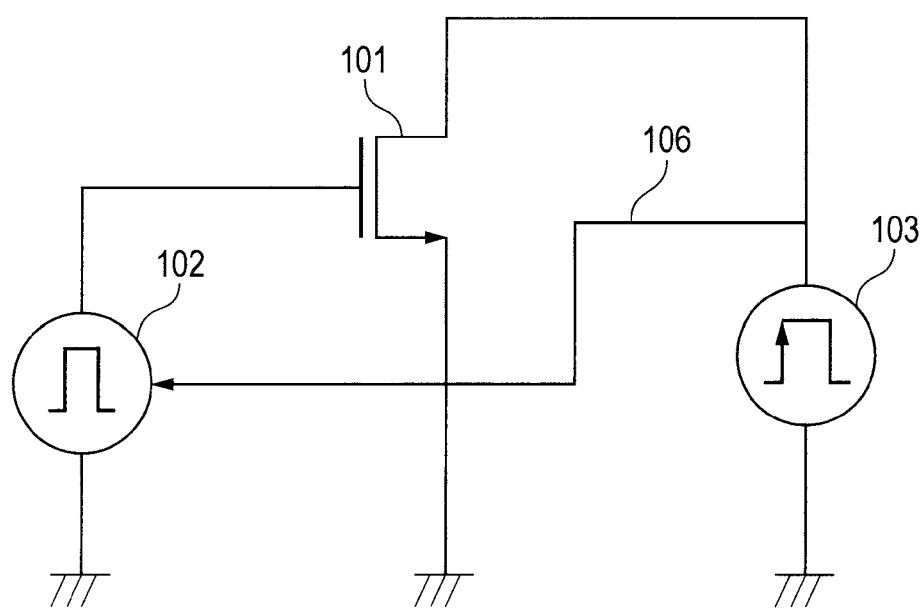
FIG. 38 illustrates the measurement method described in FIG. 2 of non-patent document 1.
Figure 39:
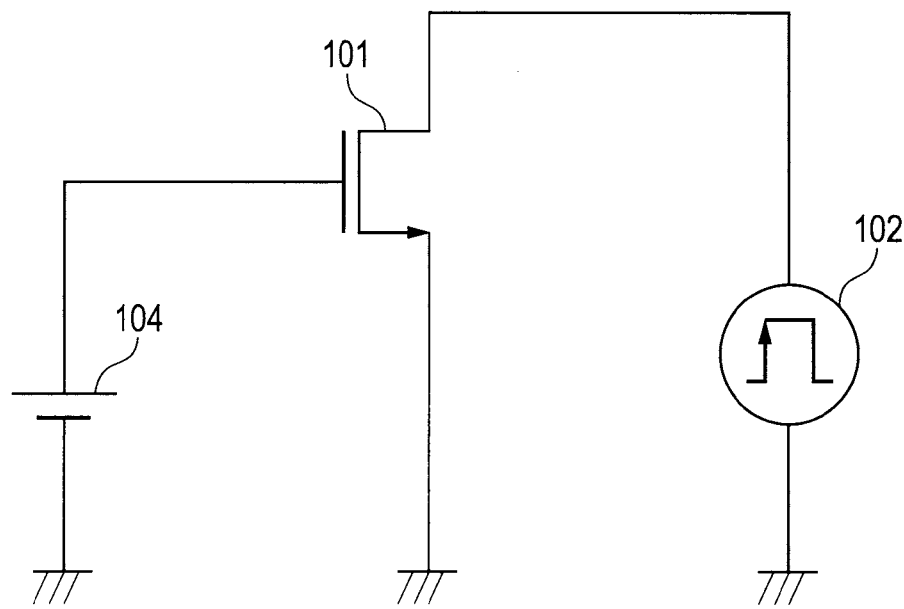
FIG. 39 illustrates the measurement method described in FIG. 5 of non-patent document 1.

FIG. 32 exemplifies a method of supplying a bias when the embodiment is applied to a field effect transistor. FIG. 33 exemplifies a method of supplying a bias when the embodiment is applied to an insulated gate bipolar transistor (IGBT). FIG. 34 exemplifies a method of supplying a bias when the embodiment is applied to a bipolar transistor.

The seventh embodiment provides the mechanism for solving the problems and consequent effects equal to those described in the first through fifth embodiments.

The present invention is applicable to semiconductor products in general. The invention is also applicable to the environment for creating semiconductor device models, semiconductor device models, apparatuses for characteristics measurement, and apparatuses for extracting semiconductor device parameters and modeling semiconductor devices. Further, the invention can be used as an analysis method used for the environment, models, and apparatuses. In particular, the invention is preferably applicable to power MOSFETs or similar devices that generate large self-heating.

This specification contains quotations from the disclosure of the above-mentioned patent documents and non-patent documents. The embodiments may be modified or adjusted within the scope of complete disclosure of the invention based on the basic technological principles. Various disclosed elements may be diversely combined or selected within the scope of the appended claims of the invention. Obviously, the invention includes various modifications and corrections possibly made by those skilled in the art based on the entire disclosure including the appended claims and the technological principles.

Some or all of the embodiments may be described as the following notes but are not limited thereto:

Note 1. A program that allows a computer to perform the processes of: measuring a current value flowing through a semiconductor device at multiple times included in a period from the beginning of application of a voltage for a current flowing through the semiconductor device to a steady state of the current value flowing through the semiconductor device; dividing the period into a first period and a second period later than the first period and finding a curve approximately representing a temporal change in a current value measured at time included in the second period so that a difference between a current value measured at time included in the first period and a current value found by extrapolating the curve at the time becomes greater than a specified threshold value; and finding a curve approximately representing a current value measured at time included in the first period and extrapolating the curve to estimate a current value flowing through the semiconductor device at the start time.

Note 2. The program according to note 1, allowing a computer to perform the processes of: finding a first curve approximately representing a temporal change in a value found by subtracting a current value in steady state from a current value measured at time included in the first period; and estimating a current value at the start time by adding a value found by extrapolating the first curve at the start time and a current value in steady state together.

Note 3. The program according to note 1 or 2, allowing a computer to perform the processes of: finding a second curve approximately representing a temporal change in a value found by subtracting a current value in steady state from a current value measured at time included in the second period; and finding a difference between a value found by subtracting a current value in steady state from a current value measured at time included in the first period and a value found by extrapolating the second curve at the time and dividing the period so that the difference is larger than a specified threshold value.

Note 4. The program according to note 3, allowing a computer to perform the processes of: finding a third curve approximately representing a value found by subtracting a current value in steady state and a value found by extrapolating the second curve at the time from a current value measured at time included in the first period; and estimating a current value at the start time by adding a value found by extrapolating the second curve at the start time, a value found by extrapolating the third curve at the start time, and a current value in steady state together.

Note 5. The program according to any one of notes 2 through 4, allowing a computer to perform the process of: extrapolating the first curve to find a value at the start time and determining a heat resistance value of the semiconductor device based on the found value.

Note 6. The program according to note 5, allowing a computer to perform the process of: determining a heat capacity value of the semiconductor device based on the heat resistance value and a slope of the first curve.

Note 7. The program according to note 4, allowing a computer to perform the processes of: determining a heat resistance value of the semiconductor device in the first period as a first heat resistance value based on a value found at the start time by extrapolating the third curve; and determining a heat resistance value of the semiconductor device in the second period as a second heat resistance value based on a value found at the start time by extrapolating the second curve.

Note 8. The program according to note 7, allowing a computer to perform the processes of: determining a heat capacity value of the semiconductor device in the first period based on the first heat resistance value and a slope of the third curve; and determining a heat capacity value of the semiconductor device in the second period based on the second heat resistance value and a slope of the second curve.

Note 9. The program according to any one of notes 1 through 8, allowing a computer to perform the processes of: performing circuit simulation including self-heating on the semiconductor device using a first thermal circuit and a second thermal circuit, the first thermal circuit to describe a temperature change in the semiconductor device during the first period using a first heat resistance parameter and a first heat capacity parameter and the second thermal circuit to describe a temperature change in the semiconductor device during the second period using a second heat resistance parameter and a second heat capacity parameter; and determining the first heat resistance parameter, the first heat capacity parameter, the second heat resistance parameter, and the second heat capacity parameter so as to reproduce a current value measured at the times and a current value in steady state.

Note 10. The program according to any one of notes 1 through 8, allowing a computer to perform the processes of: performing circuit simulation including self-heating on the semiconductor device using a first thermal circuit, a second thermal circuit, and a heat resistance device, the first thermal circuit to describe a temperature change in the semiconductor device during the first period using a first heat resistance parameter and a first heat capacity parameter, the second thermal circuit to describe a temperature change in the semiconductor device during the second period using a second heat resistance parameter and a second heat capacity parameter, and the heat resistance device to couple the first thermal circuit to the second thermal circuit; and determining the first heat resistance parameter, the first heat capacity parameter, the second heat resistance parameter, the second heat capacity parameter, and a heat resistance value of the heat resistance device so as to reproduce a current value measured at the times and a current value in steady state.

What is claimed is:

1. A semiconductor device evaluation apparatus comprising:
   a current measurement portion that measures a current value flowing through a semiconductor device at a plurality of times included in a period from beginning of application of a voltage for a current flowing through the semiconductor device to a steady state of the current value flowing through the semiconductor device;
   a period division portion that divides the period into a first period and a second period later than the first period and finds a curve approximately representing a temporal change in a current value measured at time included in the second period so that a difference between a current value measured at time included in the first period and a current value found by extrapolating the curve at the time becomes greater than a specified threshold value; and
   a current estimation portion that finds a curve approximately representing a current value measured at time included in the first period and extrapolates the curve to estimate a current value flowing through the semiconductor device at the start time.

2. The semiconductor device evaluation apparatus according to claim 1,
   wherein the current estimation portion finds a first curve approximately representing a temporal change in a value found by subtracting a current value in steady state from a current value measured at time included in the first period and estimates a current value at the start time by adding a value found by extrapolating the first curve at the start time and a current value in steady state together.

3. The semiconductor device evaluation apparatus according to claim 2,
   wherein the current estimation portion finds a difference by subtracting a current value in steady state from a current value measured at time included in the first period and finds the first curve equivalent to a curve approximately representing the logarithm of the difference as a linear function of time.

4. The semiconductor device evaluation apparatus according to claim 2, comprising:
   a heat resistance determination portion that extrapolates the first curve to find a value at the start time and determines a heat resistance value of the semiconductor device based on the found value.

5. The semiconductor device evaluation apparatus according to claim 4, comprising:
   a heat capacity determination portion that determines a heat capacity value of the semiconductor device based on the heat resistance value and a slope of the first curve.

6. The semiconductor device evaluation apparatus according to claim 1,
   wherein the period division portion finds a second curve approximately representing a temporal change in a value found by subtracting a current value in steady state from a current value measured at time included in the second period, finds a difference between a value found by subtracting a current value in steady state from a current value measured at time included in the first period and a value found by extrapolating the second curve at the time, and divides the period so that the difference is larger than a specified threshold value.

7. The semiconductor device evaluation apparatus according to claim 6,
   wherein the current estimation portion finds a third curve approximately representing a value found by subtracting a current value in steady state and a value found by extrapolating the second curve at the time from a current value measured at time included in the first period and estimates a current value at the start time by adding a value found by extrapolating the second curve at the start time, a value found by extrapolating the third curve at the start time, and a current value in steady state together.

8. The semiconductor device evaluation apparatus according to claim 7,
   wherein the current estimation portion finds a difference by subtracting a current value in steady state and a value found by extrapolating the second curve onto the time from a current value measured at time included in the first period and finds the third curve equivalent to a curve approximately representing the logarithm of the difference as a linear function of time.

9. The semiconductor device evaluation apparatus according to claim 7, comprising:
   a heat resistance determination portion that determines a heat resistance value of the semiconductor device in the first period as a first heat resistance value based on a value found at the start time by extrapolating the third curve and determines a heat resistance value of the semiconductor device in the second period as a second heat resistance value based on a value found at the start time by extrapolating the second curve.

10. The semiconductor device evaluation apparatus according to claim 9, comprising:
a heat capacity determination portion that determines a heat capacity value of the semiconductor device in the first period based on the first heat resistance value and a slope of the third curve and determines a heat capacity value of the semiconductor device in the second period based on the second heat resistance value and a slope of the second curve.

11. The semiconductor device evaluation apparatus according to claim 6,
wherein the period division portion finds a difference by subtracting a current value in steady state from a current value measured at time included in the second period and finds the second curve equivalent to a curve approximately representing the logarithm of the difference as a linear function of time.

12. The semiconductor device evaluation apparatus according to claim 1, comprising:
a parameter extraction portion that performs circuit simulation including self-heating on the semiconductor device using a first thermal circuit and a second thermal circuit, the first thermal circuit to describe a temperature change in the semiconductor device during the first period using a first heat resistance parameter and a first heat capacity parameter and the second thermal circuit to describe a temperature change in the semiconductor device during the second period using a second heat resistance parameter and a second heat capacity parameter, and determines the first heat resistance parameter, the first heat capacity parameter, the second heat resistance, and the second heat capacity parameter so as to reproduce a current value measured at the times and a current value in steady state.

13. The semiconductor device evaluation apparatus according to claim 1, comprising:
a parameter extraction portion that performs circuit simulation including self-heating on the semiconductor device using a first thermal circuit, a second thermal circuit, and a heat resistance device, the first thermal circuit to describe a temperature change in the semiconductor device during the first period using a first heat resistance parameter and a first heat capacity parameter, the second thermal circuit to describe a temperature change in the semiconductor device during the second period using a second heat resistance parameter and a second heat capacity parameter, and the heat resistance device to couple the first thermal circuit to the second thermal circuit, and determines the first heat resistance parameter, the first heat capacity parameter, the second heat resistance parameter, the second heat capacity parameter, and a heat resistance value of the heat resistance device so as to reproduce a current value measured at the times and a current value in steady state.

14. The semiconductor device evaluation apparatus according to claim 1, comprising:
a parameter storage portion that maintains a current value flowing through the semiconductor device at a time point of applying the voltage as a first current value, a current value after steady state of a current value flowing through the semiconductor device as a second current value, and a circuit simulation parameter adjusted so as to generate the first current value in response to application of the voltage during circuit simulation in order to simulate the semiconductor device; and
a heat resistance determination portion that determines a heat resistance parameter so as to reproduce the second current value in response to attainment of a steady state due to application of the voltage when circuit simulation including self-heating is performed by adding the heat resistance parameter representing heat resistance to the circuit simulation parameter.

15. The semiconductor device evaluation apparatus according to claim 14, comprising:
a heat capacity determination portion that determines a heat capacity parameter so as to reproduce a current value measured at the times when circuit simulation including self-heating is performed by adding a determined heat resistance value and a heat capacity parameter representing heat capacity to the parameter.

16. A semiconductor device evaluation method for a computer, comprising the steps of:
measuring a current value flowing through a semiconductor device at a plurality of times included in a period from beginning of application of a voltage for a current flowing through the semiconductor device to a steady state of the current value flowing through the semiconductor device;
dividing the period into a first period and a second period later than the first period and finding a curve approximately representing a temporal change in a current value measured at time included in the second period so that a difference between a current value measured at time included in the first period and a current value found by extrapolating the curve at the time becomes greater than a specified threshold value; and
finding a curve approximately representing a current value measured at time included in the first period and extrapolating the curve to estimate a current value flowing through the semiconductor device at the start time.

17. The semiconductor device evaluation method according to claim 16, comprising the steps of:
finding a first curve approximately representing a temporal change in a value found by subtracting a current value in steady state from a current value measured at time included in the first period; and
estimating a current value at the start time by adding a value found by extrapolating the first curve at the start time and a current value in steady state together.

18. The semiconductor device evaluation method according to claim 17, comprising the step of:
extrapolating the first curve to find a value at the start time and determines a heat resistance value of the semiconductor device based on the found value.

19. The semiconductor device evaluation method according to claim 18, comprising the step of:
determining a heat capacity value of the semiconductor device based on the heat resistance value and a slope of the first curve.

20. The semiconductor device evaluation method according to claim 16, comprising the steps of:
finding a second curve approximately representing a temporal change in a value found by subtracting a current value in steady state from a current value measured at time included in the second period; and
finding a difference between a value found by subtracting a current value in steady state from a current value measured at time included in the first period and a value found by extrapolating the second curve at the time and dividing the period so that the difference is larger than a specified threshold value.

21. The semiconductor device evaluation method according to claim 20, comprising the steps of:
finds a third curve approximately representing a value found by subtracting a current value in steady state and a value found by extrapolating the second curve at the time from a current value measured at time included in the first period; and
estimating a current value at the start time by adding a value found by extrapolating the second curve at the start time, a value found by extrapolating the third curve at the start time, and a current value in steady state together.

22. The semiconductor device evaluation method according to claim 21, comprising the steps of:
determining a heat resistance value of the semiconductor device in the first period as a first heat resistance value based on a value found at the start time by extrapolating the third curve; and
determining a heat resistance value of the semiconductor device in the second period as a second heat resistance value based on a value found at the start time by extrapolating the second curve.

23. The semiconductor device evaluation method according to claim 22, comprising the steps of:
determining a heat capacity value of the semiconductor device in the first period based on the first heat resistance value and a slope of the third curve; and
determining a heat capacity value of the semiconductor device in the second period based on the second heat resistance value and a slope of the second curve.

24. The semiconductor device evaluation method according to claim 16, comprising the steps of:
performing circuit simulation including self-heating on the semiconductor device using a first thermal circuit and a second thermal circuit, the first thermal circuit to describe a temperature change in the semiconductor device during the first period using a first heat resistance parameter and a first heat capacity parameter and the second thermal circuit to describe a temperature change in the semiconductor device during the second period using a second heat resistance parameter and a second heat capacity parameter; and
determining the first heat resistance parameter, the first heat capacity parameter, the second heat resistance parameter, and the second heat capacity parameter so as to reproduce a current value measured at the times and a current value in steady state.

25. The semiconductor device evaluation method according to claim 16, comprising the steps of:
performing circuit simulation including self-heating on the semiconductor device using a first thermal circuit, a second thermal circuit, and a heat resistance device, the first thermal circuit to describe a temperature change in the semiconductor device during the first period using a first heat resistance parameter and a first heat capacity parameter, the second thermal circuit to describe a temperature change in the semiconductor device during the second period using a second heat resistance parameter and a second heat capacity parameter, and the heat resistance device to couple the first thermal circuit to the second thermal circuit; and
determining the first heat resistance parameter, the first heat capacity parameter, the second heat resistance parameter, the second heat capacity parameter, and a heat resistance value of the heat resistance device so as to reproduce a current value measured at the times and a current value in steady state.

* * * * *